(12) United States Patent
Vergara Gonzalez et al.

(10) Patent No.: US 11,874,456 B2
(45) Date of Patent: Jan. 16, 2024

(54) ACTUATED POLYMER-BASED DIELECTRIC MIRRORS

(71) Applicant: NORTH CAROLINA STATE UNIVERSITY, Raleigh, NC (US)

(72) Inventors: Pedro P. Vergara Gonzalez, Raleigh, NC (US); Leda M. Lunardi, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 580 days.

(21) Appl. No.: 17/161,847

(22) Filed: Jan. 29, 2021

(65) Prior Publication Data

US 2021/0165208 A1 Jun. 3, 2021

Related U.S. Application Data

(63) Continuation of application No. PCT/US2019/043910, filed on Jul. 29, 2019.
(Continued)

(51) Int. Cl.
*G02B 26/00* (2006.01)
*G02B 1/00* (2006.01)
(Continued)

(52) U.S. Cl.
CPC ........... *G02B 26/007* (2013.01); *G02B 1/005* (2013.01); *G02B 5/0841* (2013.01); *G02B 26/001* (2013.01); *H02N 1/006* (2013.01)

(58) Field of Classification Search
CPC .... G02B 26/007; G02B 1/005; G02B 5/0841; G02B 26/001; H02N 1/006
(Continued)

(56) References Cited

U.S. PATENT DOCUMENTS

| 5,799,231 A | 8/1998 | Gates et al. |
| 6,819,469 B1 | 11/2004 | Koba |

(Continued)

FOREIGN PATENT DOCUMENTS

| DE | 2509309 A1 | 9/1976 |
| DE | 3327590 A1 | 2/1985 |

(Continued)

OTHER PUBLICATIONS

PCT, International Preliminary Report on Patentability in International application No. PCT/US2019/043910 dated Feb. 9, 2021.
(Continued)

*Primary Examiner* — William Choi
(74) *Attorney, Agent, or Firm* — NK Patent Law

(57) ABSTRACT

The presently disclosed subject matter relates to electromechanical systems and devices, and more particularly to electromechanical systems for implementing reflective devices for displays, sensors, and authentication solutions. In some embodiments a reflective device includes a thin film transistor layer and a plurality of reflective elements positioned approximately parallel to the thin film transistor layer. The plurality of reflective elements is electrically coupled with the thin film transistor layer. Each reflective element is configured for controlling a reflectance parameter of the reflective element based on a first voltage applied to the reflective element by the thin film transistor. In other embodiments, a reflective element includes a transparent substrate and a plurality of polymer-air pair layers positioned approximately parallel position to the transparent substrate. The plurality of polymer-air pair layers are configured to vary a reflectance parameter based on a force applied to the plurality of polymer-air pair layers.

20 Claims, 43 Drawing Sheets

Related U.S. Application Data

(60) Provisional application No. 62/714,101, filed on Aug. 3, 2018.

(51) Int. Cl.
  *G02B 5/08* (2006.01)
  *H02N 1/00* (2006.01)

(58) Field of Classification Search
  USPC .................... 359/237, 240, 265, 267, 295
  See application file for complete search history.

(56) References Cited

U.S. PATENT DOCUMENTS

| | | |
|---|---|---|
| 7,672,034 B2 | 3/2010 | Fujimori |
| 2007/0086078 A1 | 4/2007 | Hagood et al. |
| 2015/0287367 A1 | 10/2015 | Van Lier et al. |
| 2015/0355454 A1 | 12/2015 | Ma et al. |

FOREIGN PATENT DOCUMENTS

| | | |
|---|---|---|
| JP | 1988075808 | 4/1988 |
| JP | 1994156599 | 6/1994 |
| JP | 2003154886 | 5/2003 |
| WO | 2007094778 A2 | 8/2007 |

OTHER PUBLICATIONS

Yablonovitch, Eli, "Inhibited spontaneous emission in solid-state physics and electronics," Physical Review Letters, May 18, 1987, pp. 2059-2062, vol. 58, No. 20.

Joannopoulos, J.D., et al., "Photonic crystals: Putting a new twist on light," Nature, Mar. 13, 1997, pp. 143-149, vol. 386, No. 6621.

Joannopoulos, John D., et al., "Photonic Crystals: Molding the Flow of Light, 2nd ed.", Princeton University Press, 2008, pp. 1-305.

Jin, Jian-Ming, "Theory and computation of electromagnetic fields", Book, John Wiley & Sons, Inc., Hoboken, NJ, 2015, Chapter 4, pp. 107-151.

Bai, Peng Fei, et al., "Review of Paper-Like Display Technologies," Progress in Electromagnetics Research, 2014, pp. 95-116, vol. 147.

Comiskey, Barrett, et al, "An electrophoretic ink for all printed reflective electronic displays," Nature, Jul. 16, 1998, pp. 253-255, vol. 394, No. 6690.

Miles, M., et al, "Digital paper for reflective displays," Journal of the Society for Information Display, 2003, pp. 209-215, vol. 11, No. 1.

E Ink, "Imaging film carta," Datasheet, Sep. 2013. [Online]. Available: http://www.eink.com/sell sheets/carta spec sheet.pdf.

Mirasol, "Interferometric modulator (imod) technology overview," Jun. 2009. [Online]. Available: https://www.qualcomm.com/documents/mirasol-imod-tech-overview.

Heikenfeld, Jason, et al., "Recent progress in arrayed electrowetting optics," Optics & Photonics News, 2009, pp. 20-26, vol. 20, No. 1.

Feenstra, Johan, et al, "Electrowetting displays," May 2009. [Online]. Available: http://www.liquavista.com/media/772/LQV0905291LL5-15.pdf.

Fudouzi, Hiroshi, "Tunable structural color in organisms and photonic materials for design of bioinspired materials," Science and Technology of Advanced Materials, Dec. 2011, pp. 1-8, vol. 12, No. 6.

Nucara, Luca, et al, "Electrically responsive photonic crystals: a review," Journal of Materials Chemistry C, 2015, pp. 8449-8467, vol. 3, No. 33.

Arsenault, Andre C., "Photonic-crystal full-colour displays," Nature Photonics, Aug. 2007, pp. 468-472, vol. 1, No. 8.

Yue, Y, et al. "Tunable one-dimensional photonic crystals from soft materials," Journal of Photochemistry and Photobiology C-Photochemistry Reviews, Jun. 2015, pp. 45-67, vol. 23.

Howell, R., et al., "Strain-tunable one dimensional photonic crystals based on zirconium dioxide/slide-ring elastomer nanocomposites for mechanochromic sensing," ACS Applied Materials & Interfaces, Feb. 18, 2015, pp. 3641-3646, vol. 7, No. 6.

Kolle, B., et al., "Stretch-tuneable dielectric mirrors and optical microcavities," Optics Express, Mar. 1, 2010, pp. 1356-4364, vol. 18, No. 5.

Park, J., et al., "Electrically tunable soft-solid block copolymer structural color," ACS NANO, Nov. 4, 2015, pp. 12158-12167, vol. 9, No. 12.

Lu, Wei, et al., "Full-color mechanical sensor based on elastic nanocomposite hydrogels encapsulated three-dimensional colloidal arrays," Sensors and Actuators B-Chemical, Oct. 29, 2016, pp. 527-533, vol. 234.

Microchem, "NanoTM pmma and copolymer," 2001. [Online]. Available: http://microchem.com/pdf/PMMA Data Sheet.pdf.

Vieu, C., et al., "Electron beam lithography: resolution limits and applications," Applied Surface Science, Sep. 1, 2000, pp. 111-117, vol. 164.

Chen, Y., et al., "A lift-off process for high resolution patterns using pmma/lor resist stack," Microelectronic Engineering, Jun. 2004, pp. 278-281, vol. 73-4.

Wu, Cen-Shawn, et al., "Polymer-based photonic crystals fabricated with single-step electron-beam lithography," Advanced Materials, Oct. 5, 2007, pp. 3052-3056, vol. 19, No. 19.

Zhang, Sichao, et al., "Lithographically-generated 3d lamella layers and their structural color," Nanoscale, 2016, pp. 9118-9127, vol. 8, No. 17.

Grossmann, Tobias, "High-q conical polymeric microcavities," Applied Physics Letters, Jan. 4, 2010, pp. 1-4, vol. 96, No. 1.

Wu, Cen Shawn, et al, "High-energy Electron Beam Lithography for Nanoscale Fabrication," Intech, Feb. 2010, [Online]. Available: https://books.google.com/books?id=MbGnoAEACAAJ.

Kim, Tae Kyung, et al., "Measurement of nonlinear mechanical properties of pdms elastomer," Microelectronic Engineering, Aug. 2011, pp. 1982-1985, vol. 88, No. 8.

Liu, Miao, et al., "Thickness-dependent mechanical properties of polydimethylsiloxane membranes," Journal of Micromechanics and Microengineering, Mar. 2009, pp. 1-4, vol. 19, No. 3.

Liu, Miao, et al., "Influences of heating temperature on mechanical properties of polydimethylsiloxane," Sensors and Actuators A-Physical, Apr. 8, 2009, pp. 42-45, vol. 151, No. 1.

Johnston, I.D., et al., "Mechanical characterization of bulk sylgard 184 for microfluidics and microengineering," Journal of Micromechanics and Microengineering, Mar. 2014, pp. 1-7, vol. 24, No. 3.

Schneider, F., et al., "Mechanical properties of silicones for mems," Journal of Micromechanics and Microengineering, Jun. 2008, pp. 1-9, vol. 18, No. 6.

Lottes, J.C., et al., "The mechanical properties of the rubber elastic polymer polydimethylsiloxane for sensor applications," Journal of Micromechanics and Microengineering, Sep. 1997, pp. 145-147, vol. 7, No. 3.

Gerratt, Aaron P., "In situ characterization of pdms in soi-mems," Journal of Micromechanics and Microengineering, Apr. 2013, pp. 1-11, vol. 23, No. 4.

Jeong, Gi Seok, et al., "Solderable and electroplatable flexible electronic circuit on a porous stretchable elastomer," Nature Communications, Jul. 2012, pp. 1-8, vol. 3.

Dow Corning, "Sylgard 184 Silicone Elastomer," 2014. [Online]. Available: http://www.dowcorning.com/DataFiles/090276fe80190b08.pdf.

Chae, Su-Kyoung, et al., "Thin and large free-standing PDMS membrane by using polystyrene petri dish," Biochip Journal, Jun. 2012, pp. 184-190, vol. 6, No. 2.

Chen, Weiqiang, et al., "Photolithographic surface micromachining of polydimethylsiloxane (pdms)," Lab on a Chip, 2012, pp. 391-395, vol. 12, No. 2.

Bienstman, P., "Rigorous and efficient modelling of wavelength scale photonic components," 2001. [Online]. Available: http://photonics.intec.ugent.be/download/phd 104.pdf.

Bienstman, P., et al, "Optical modelling of photonic crystals and VCSELs using eigenmode expansion and perfectly matched layers," Optical and Quantum Electronics, Apr. 2001, pp. 327-341, vol. 33, No. 4-5.

(56) References Cited

OTHER PUBLICATIONS

Bienstman, Peter, et al., "Advanced boundary conditions for eigenmode expansion models," Optical and Quantum Electronics, May-Jun. 2002, pp. 523-540, vol. 34, No. 5.

Bienstman, P., "Camfr (cavity modelling framework)," Aug. 2007. [Online]. Available: http: //camfr.sourceforge.net/index.html.

Ocean Optics, "Ocean optics usb4000," 2016. [Online]. Available: http://oceanoptics.com/ product/usb4000-custom/.

Vergara, Pedro P., et al., "Actuated polymer based dielectric mirror for visual spectral range applications", Proc. SPIE 10354, Nanoengineering: Fabrication, Properties, Optics, and Devices XIV, Aug. 31, 2017, pp. 1035404-01-1035404-07, ; doi: . 1117/12.2271871; https://doi.org/10.1117/12.2271871.

Cherng, Yi-Shiuan, et al, "Fabrication of polydimethylsiloxane microlens array on spherical surface using multi-replication process," J. Micromech. And Microeng. 2014, pp. 1-11, vol. 24.

PCT, International Search Report and Written Opinion in International application No. PCT/US19/43910 dated Oct. 17, 2019.

3-PAIR POLYMER BASED DIELECTRIC MIRROR

ACTUATED POLYMER-BASED DIELECTRIC MIRRORS

PRIORITY CLAIM

This application is a continuation of PCT Patent Application No. PCT/US2019/043910 entitled "ACTUATED POLYMER-BASED DIELECTRIC MIRRORS," which was filed on Jul. 29, 2019, which claims benefit of and priority to U.S. Provisional Patent Application No. 62/714,101 entitled "ACTUATED POLYMER-BASED DIELECTRIC MIRRORS," which was filed on Aug. 3, 2018, the contents of both of which are incorporated by reference herein.

TECHNICAL FIELD

The presently disclosed subject matter relates to electromechanical systems and devices, and more particularly to electromechanical systems for implementing reflective devices for displays, sensors, and authentication solutions.

BACKGROUND

Paper-like electronic displays operate by reflecting ambient light (i.e. incident light) from their viewing surface and controlling the color and/or gray level of the reflection. Reflectance is a parameter defined by the ratio between the total reflected light of an entire structure divided by the incident light. It may be used to compare different display structures. For example, "The New York Times" printed edition has an approximately 60% measured reflectance and "The National Geography" printed magazine has an approximately 80% measured reflectance. Several technologies have been used to achieve a somewhat paper-like quality for a reflective display, but none to date have achieved the reflectance comparable to high quality printed paper.

Accordingly, a need exists for further technology advances of systems, devices, and methods for reflective devices.

SUMMARY

The presently disclosed subject matter relates to electromechanical systems for implementing reflective elements for displays, sensors, and authentication solutions. According to one embodiment, a reflective device includes a thin film transistor layer and a plurality of reflective elements positioned approximately parallel to the thin film transistor layer. The plurality of reflective elements is electrically coupled with the thin film transistor layer. Each reflective element is configured for controlling a reflectance parameter of the reflective element based on a first voltage applied to the reflective element by the thin film transistor layer.

In some embodiments, each reflective element may be an independently controlled polymer-based dielectric mirror device. Each reflective may include a transparent substrate and a plurality of polymer-air pair layers positioned approximately parallel position to the transparent substrate. Each polymer-air pair layer may include at least one polymer layer and at least one air layer. Each polymer-air layer may also include a high refractive index referred to as Polymer1 such as polymethyl methacrylate (PMMA) layer, or a polydimethylsiloxane (PMDS) layer, or a polytetrafluoroethylene (PTFE) layer, or a polyimide layer. Each polymer-air layer may also include at least one cured polymer layer. Each reflective element may be further configured for a maximum reflectance greater than 85% using a maximum of six polymer-air pair layers. In other embodiments, each reflective element may include more than six polymer-air pair layers. For example, each reflective element may include eight polymer-air pair layers.

In some embodiments, each reflective element may further include a metallic electrode positioned over the plurality of polymer-air pair layers and a transparent electrode positioned between the plurality of polymer-air pair layers and the transparent substrate. The transparent electrode and the metallic electrode may be configured to control the reflectance parameter by providing a substantially equal electrostatic force across the plurality of polymer-air pair layers based on the value of the first voltage. The transparent electrode may include a transparent conductive film and the transparent conductive film may include a transparent conductive oxide. The transparent conductive oxide may be indium tin oxide.

In some embodiments, each reflective element may be further configured for a reflectance control response time of less than 33 milliseconds. In other embodiments, each reflective element may be further configured for a reflectance control response time of less than 16 milliseconds. In still other embodiments, each reflective element may be further configured for a reflectance control response time of less than 8 milliseconds. Each reflective element may also include a color filter positioned on the transparent substrate opposite to the plurality of polymer-air pair layers. Each color filter may be configured for a passband center wavelength that is approximately 465 nanometers, 550 nanometers, or 650 nanometers.

In some embodiments, each reflective element may be further configured for independently controlling a reflected wavelength parameter of the reflective element based on a second voltage applied to the reflective element by the thin film transistor layer. Each polymer-air layer may also include an intra-layer electrode forming a plurality of intra-layer electrodes. Each reflective element may further include a substrate electrode positioned between the plurality of polymer-air pair layers and the transparent substrate; a top electrode positioned over the plurality of polymer-air pair layers; a first side electrode; and a second side electrode. The first side electrode and the second side electrode may be configured for capacitively inducing a voltage on each intra-layer electrode. The substrate electrode and the top electrode may be configured to control the reflectance parameter by providing a substantially equal electrostatic force across the plurality of polymer-air pair layers based a value of the first voltage. The first side electrode and the second side electrode may also be configured to control the reflected wavelength parameter by providing a graduated electrostatic force across the plurality of polymer-air pair layers based on the value of the second voltage.

In some embodiments, each reflective element may be further configured for a wavelength control response time of less than 33 milliseconds. In other embodiments, each reflective element may be further configured for a wavelength control response time of less than 16 milliseconds. In still other embodiments, each reflective element may be further configured for a wavelength control response time of less than 8 milliseconds.

The reflective device may further include a viewing surface positioned approximately parallel to the plurality of reflective elements and the thin film transistor layer. The viewing surface may provide a viewing resolution of 1280 by 720 pixels, 1920 by 1080 pixels, 2560 by 1440 pixels, 3840 by 2160 pixels, and/or 7680 by 4320 pixels. The reflective device may also include a video interface configured for receiving a video signal for display on the viewing surface. The video interface may be a High-Definition Multimedia Interface (HDMI®) video interface, a DisplayPort® video interface, a Universal Serial Bus (USB) type-C interface, an embedded DisplayPort® (eDP) interface, a display serial interface (DSI) as defined by the Mobile Industry Processor Interface (MIPI) Alliance, a serial peripheral interface (SPI), or the like.

In some embodiments, each reflective element may be configured to reflect a wavelength between 380 nanometers and 750 nanometers. In other embodiments, each reflective device may be configured to reflect a wavelength between 750 nanometers and 1100 nanometers. In still other embodiments, each reflective device may be configured to reflect a wavelength between 1100 nanometers and 15,000 nanometers.

In some embodiments, the reflective device may be implemented within a pressure sensor, a temperature sensor, an active optical filter, a reflective display device or the like. The reflective display device may also be implemented within an e-book device, a smart watch, a smart phone, a tablet, a laptop, a computer monitor, a smart TV, or the like. In other embodiments, the reflective device may be configured to provide a visual authentication (e.g. watermark).

In some embodiments, a polymer layer may be patterned to form an independently controlled polymer-based photonic grating. In other embodiments, the polymer layer may be further patterned to form an independently controlled polymer-based photonic crystal.

In some embodiments, the reflectance parameter may be controlled by a deformation of at least one polymer layer from the substantially equal electrostatic force across the plurality of polymer-air pair layers and the deformation may persist when the substantially equal electrostatic force is released.

According to another embodiment, a method of forming a reflective device includes providing a plurality of reflective elements on a thin film transistor layer. The plurality of reflective elements is positioned approximately parallel to the thin film transistor layer. The method further includes electrically coupling the thin film transistor layer with each reflective element. Each reflective element is configured for controlling a reflectance parameter of the reflective element based on a first voltage applied to the reflective element by the thin film transistor layer.

According to another embodiment, a reflective element includes a transparent substrate and a plurality of polymer-air pair layers positioned approximately parallel position to the transparent substrate. The plurality of polymer-air pair layers are configured to vary a reflectance parameter based on a force applied to the plurality of polymer-air pair layers. The reflective element may be implemented in a pressure sensor, a temperature sensor, an active optical filter, a reflective display device, or the like.

In some embodiments, the plurality of polymer-air pair layers may be further configured to receive the force based on contact pressure, air pressure, and/or thermal expansion. Each polymer-air pair layer may include at least one polymer layer and an air layer. Each polymer-air layer may include at least one of a polymer with higher index than air such as polymethyl methacrylate (PMMA) layer, a polydimethylsiloxane (PDMS) layer, a polytetrafluoroethylene (PTFE) layer, and a polyimide layer. Each polymer-air layer may comprise at least one cured polymer layer referred as Polymer1.

In some embodiments, the reflective element may further include a metallic electrode positioned over the plurality of polymer-air pair layers and a transparent electrode positioned between the plurality of polymer-air pair layers and the transparent substrate. The transparent electrode and the metallic electrode may be configured to control the reflectance parameter by providing a substantially equal electrostatic force across the plurality of polymer-air pair layers based on a value of a first voltage applied across the transparent electrode and the metallic electrode.

According to another embodiment, a method of forming a reflective device includes providing a plurality of polymer-air pair layers positioned approximately parallel to a transparent substrate, the plurality of polymer-air pair layers are configured to vary a reflectance parameter based on a force applied to the plurality of polymer-air pair layers. Each polymer-air layer may include a polymethyl methacrylate (PMMA) layer, a polydimethylsiloxane (PDMS) layer, a polytetrafluoroethylene (PTFE) layer, a polyimide layer, or the like.

The method may include the steps of (1) removing by using gases that attack Polymer1 that chemically remove (e.g. $O_2$, $Cl_2$, Ar, $N_2$, etc.) wherein etching adds surface roughness and transfers a pattern to a sacrificial resist layer that reduces stiction; (2) depositing another polymer layer Polymer2 by plasma polymerization, wherein plasma polymerization reduces surface energy; and (3) drying by at least one of freeze-drying and/or carbon dioxide ($CO_2$).

The features and advantages described in this summary and the following detailed description are not all-inclusive. Many additional features and advantages will be apparent to one of ordinary skill in the art in view of the drawings, specification, and claims presented herein.

BRIEF DESCRIPTION OF THE DRAWINGS

The present embodiments are illustrated by way of example and are not intended to be limited by the figures of the accompanying drawings. In the drawings.

DETAILED DESCRIPTION

Figure 1A:
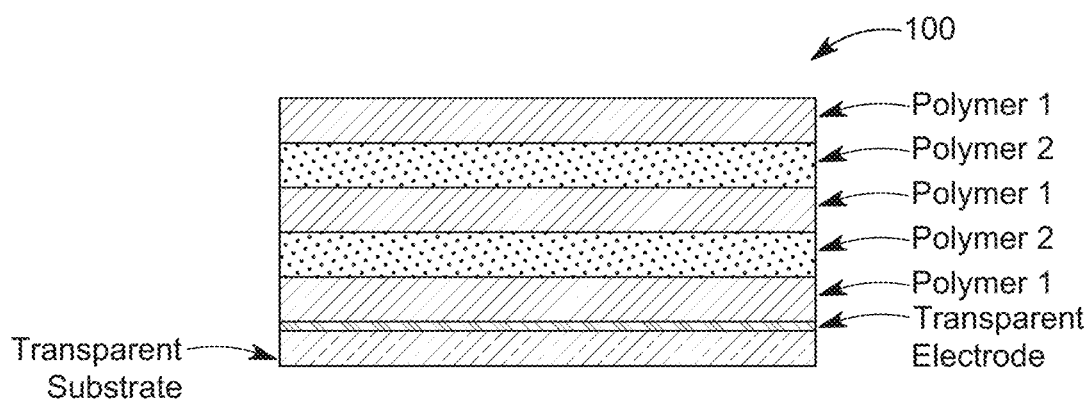
FIG. 1A through FIG. 1G depict a diagram illustrating a fabrication process for a first device including a dielectric mirror in accordance with embodiments of the present disclosure.
Figure 1B:
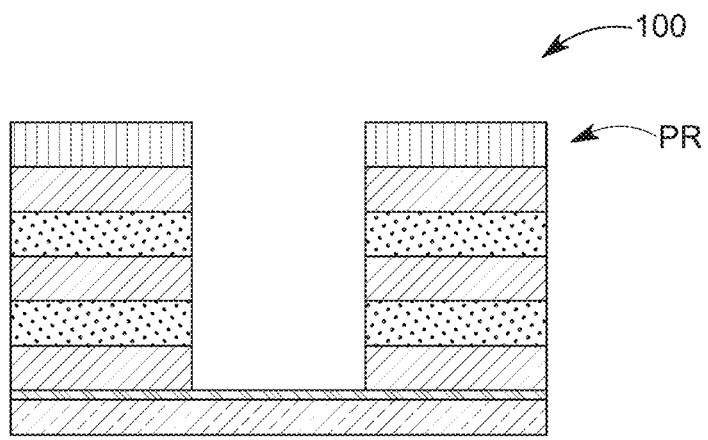
Figure 1C:
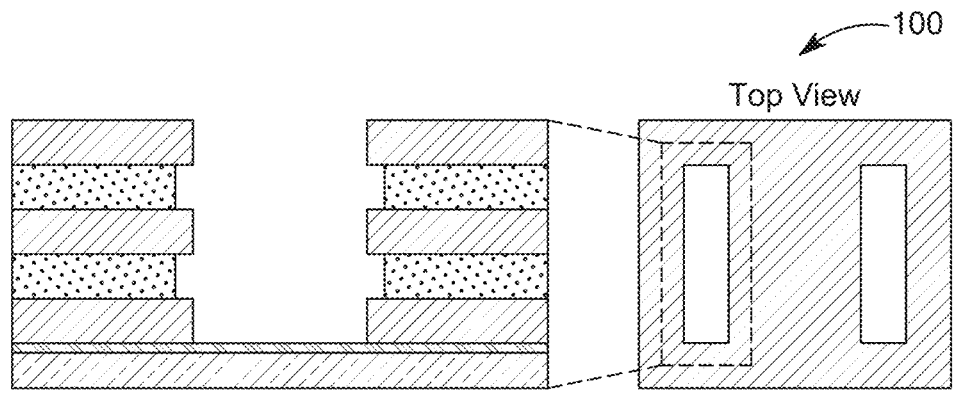
Figure 1D:
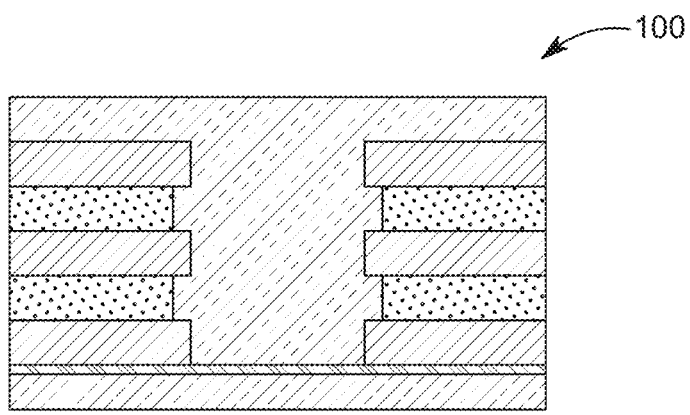
Figure 1E:
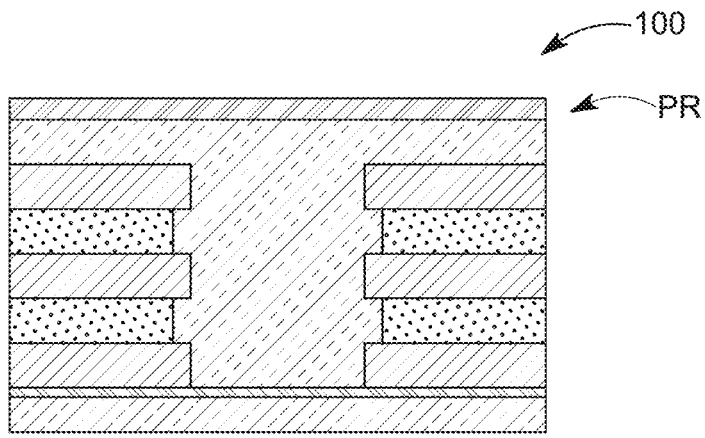
Figure 1F:
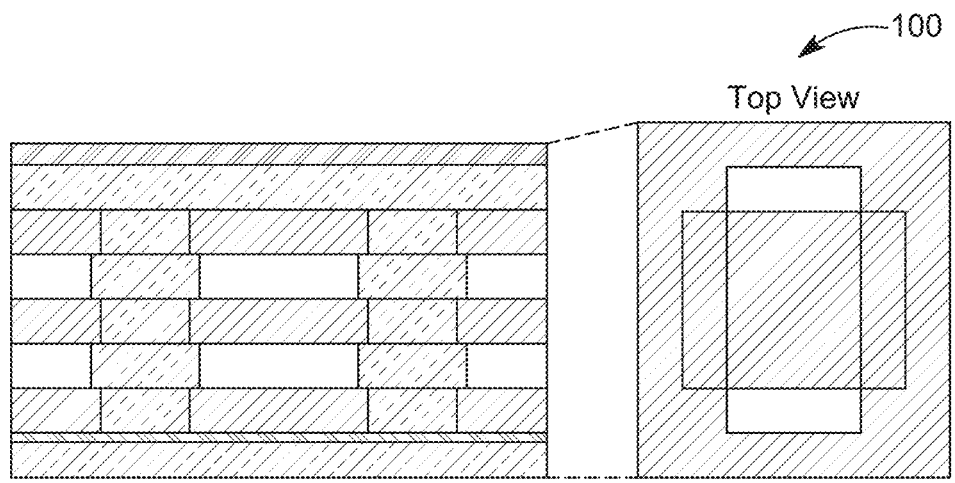

The presently disclosed subject matter is introduced with sufficient detail to provide an understanding of one or more particular embodiments of broader inventive subject matters. The descriptions expound upon and exemplify features of those embodiments without limiting the inventive subject matters to the explicitly described embodiments and features. Considerations in view of these descriptions will likely give rise to additional and similar embodiments and features without departing from the scope of the presently disclosed subject matter.

Unless defined otherwise, all technical and scientific terms used herein have the same meaning as commonly understood to one of ordinary skill in the art to which the presently disclosed subject matter pertains. Although any methods, devices, and materials similar or equivalent to those described herein may be used in the practice or testing of the presently disclosed subject matter, representative methods, devices, and materials are now described.

Following long-standing patent law convention, the terms "a", "an", and "the" refer to "one or more" when used in the subject specification, including the claims. Thus, for example, reference to "a liner" may include a plurality of such liners, and so forth.

Unless otherwise indicated, all numbers expressing quantities of components, conditions, and so forth used in the specification and claims are to be understood as being modified in all instances by the term "about". Accordingly, unless indicated to the contrary, the numerical parameters set forth in the instant specification and attached claims are approximations that may vary depending upon the desired properties sought to be obtained by the presently disclosed subject matter.

As used herein, the term "about" when referring to a value or to an amount of mass, weight, time, volume, concentration, and/or percentage may encompass variations of, in some embodiments +/−20%, in some embodiments +/−10%, in some embodiments +/−5%, in some embodiments +/−1%, in some embodiments +/−0.5%, and in some embodiments +/−0.1%, from the specified amount, as such variations are appropriate in the disclosed packages and methods.

The presently disclosed subject matter relates to electromechanical systems for implementing reflective elements for displays, sensors, and authentication solutions. Disclosed herein is are designs with simulation results and processing methods to fabricate dielectric mirrors based on free standing polymer-air layers. By choosing polymers with large refractive index difference relative to air, reflective elements may achieve 90% reflectance with only six polymer-air layers. Higher numbers of polymer-air pair layers are known to boost the reflectance of the light providing higher brightness.

The simulation results show actuation speeds of less than one millisecond which make the reflective elements very suitable for high quality video display applications. Experimental optical characterization of fabricated reflective element structures has been shown to match well with the simulation results. Structures designed to reflect a particular set of colors may be isolated by the use of color filters. An electrically controllable color pixel fabricated through this processing sequence with the reflectance for each isolated color may also be voltage controlled. In some embodiments, the simulation results include the implementation of a color pixel including a reflective device with two independently controlled input voltages. One input voltage controlling the reflectance parameter and another input voltage controlling the reflected wavelength parameter. With this solution color filters are not required.

Dielectric mirrors may achieve a reflectance of almost one hundred percent, depending on the number of layers present in the structure. These dielectric mirrors are usually made from rigid inorganic materials and used as the mirror components in lasers, thin film beam splitters, and high quality mirrors in optical solutions. Being structural components, once fabricated their reflectance parameter and/or wavelength parameter remains constant.

Without a requirement for a back light and consuming less wattage, the disclosed technologies are very attractive for mobile display applications. The reflective devices may function in radiant environments present in direct sunlight or the illumination in a bright room where existing technologies such as liquid crystal or light-emitting diodes cannot compete. Currently, dielectric mirrors are not used for reflective screens displays and this disclosure presents a new opportunity advancing the state of the art. In addition the disclosed dielectric mirror's actuation speed has been simulated yielding sub millisecond performance suitable for video applications including but not limited to:

an active component of a reflective screen display,
electrically actuated micro optical lenses, and
electrically actuated micro membranes for micro electromechanical systems (MEMS) and microfluidics.

1.0 Introduction

Photonic crystals are periodic structures composed of materials with different refractive indexes. These assembly's optical properties are mostly dependent on the dimensions of each material. When an arrangement is made in one axis but homogeneous in the other two axes, the structure forms a 1D photonic crystal, also known as dielectric mirror (i.e. distributed Bragg mirror). This type of structure produces scattering of light in the interface between the materials. A specific reflectance for a photonic crystal and for a particular set of wavelengths may be designed by selecting the thickness of each layer. The reflectance is defined as the total reflected electromagnetic power by the entire structure divided in the incident electromagnetic power. The reflectance also depends on the number of layers in the structure and the difference between their refractive indexes.

Bragg reflectors may achieve a reflectance of almost one hundred percent if enough number of layers (e.g. greater than ten 10) are present in the structure. In this manner, the mirror has a bandgap for a particular set of incident wavelengths where light cannot penetrate and is nearly completely reflected. These mirrors are usually made from rigid inorganic materials like magnesium fluoride, silicon dioxide, zinc sulfide, and/or titanium dioxide. They are used as the mirror component in lasers, thin film beam splitters and high quality mirrors in optical experiments. Since these reflectors are structural components, as soon as they are fabricated the reflectance parameter and bandwidth parameter may not be changed.

Disclosed herein is a novel process for fabrication of dielectric mirrors based on free standing layers using two types of polymers, referred to as Polymer1 and Polymer2. The reflectance may be varied by applying an electrostatic force between the top and bottom layers and sequentially compressing each layer. By compressing the structure, the number of layers is reduced. As such the reflectance is also reduced. The large difference between the reflective index of the polymers and air allows the devices to achieve reflectance exceeding 90% using only six layers for each reflective device. Simulation results show that the actuation speed may be less than one millisecond for one of the polymers and about six milliseconds for the other and again making these devices very attractive for video display applications.

In some embodiments, the disclosed structures may be designed to reflect a particular set of colors (i.e. wavelengths) that may be isolated by using color filters. As such, an electrically controllable color pixel may be fabricated. Moreover, one of the disclosed devices may reflect one particular wavelength without the need of color filters. The final disclosed device may be controlled by two applied input voltages. One that controls the reflectance parameter and another that controls the reflected wavelength parameter. No filter is required and a reflective color pixel may be realized. These devices may then be used as an active component in a reflective screen display for outdoor applications and low battery consumption (smart watches, mobile phones, tablets, or the like). The disclosed fabrication scheme may also expand the current knowledge and understanding of polymer dielectric mirrors to other fields like microfluidics or micro optical lenses.

1.1 Electromagnetism in Photonic Crystals

Photonic crystals are periodic structures of alternating refractive index. By designing the thickness of each layer, the reflection and transmission behavior of a particular set of wavelengths may be manipulated. This type of construction produces scattering of light in the interface between materials. The scattered light may interact constructively outside the structure and recreate the initial incident light. If this happens, the wave has been completely reflected. As such no propagation of light is internal to the material. The structure has a forbidden set of wavelengths that will not propagate through it, originating the so-called photonic band gap.

A photonic crystal may be modeled by Maxwell's equations. In order to have a simplified problem, certain assumptions and restrictions are imposed. The propagation occurs in a mixed dielectric medium where the permittivity varies as a function of the spatial position ($\epsilon_r(r)$). Each material is considered to be homogeneous, lossless and isotropic. Since there are no free charges, currents and/or light sources; the electric fields are small enough that the electric susceptibility ($\chi_e$) may be neglected. Additionally, the relative permeability ($\mu_r$) is equal to 1 (true for most materials). With these assumptions, the constitute relations are:

$$D(r) = \epsilon_0 \epsilon_r(r) E(r) \qquad \text{(Eqn. 1)}$$

$$B(r) = \mu_0 H(r) \qquad \text{(Eqn. 2)}$$

Maxwell's equations with these assumptions become:

$$\nabla \cdot (\mu_0 H(r, t)) = 0 \qquad \text{(Eqn. 3)}$$

$$\nabla \cdot (\epsilon_0 \epsilon_r(r) E(r, t)) = 0 \qquad \text{(Eqn. 4)}$$

$$\nabla \times E(r, t) + \mu_0 \frac{\partial H(r, t)}{\partial t} = 0 \qquad \text{(Eqn. 5)}$$

$$\nabla \times H(r, t) - \epsilon_0 \epsilon_r \frac{\partial E(r, t)}{\partial t} = 0 \qquad \text{(Eqn. 6)}$$

Since these equations are linear, the spatial and time dependence may be separated by a set of harmonic modes. Also, the field patterns vary sinusoidally in time with the functions:

$$H(r,t) = H(r)e^{-i\omega t} \qquad \text{(Eqn. 7)}$$

$$E(r,t) = E(r)e^{-i\omega t} \qquad \text{(Eqn. 8)}$$

By inserting these field equations into Maxwell's equations and after some manipulation, the result is an equation that depends entirely on H(r). This is called the master or wave equation:

$$\nabla \times \left( \frac{1}{\varepsilon(r)} \nabla \times H(r) \right) = \left( \frac{\omega}{c} \right)^2 H(r) \qquad \text{(Eqn. 9)}$$

This equation with the divergence defines H(r) completely. Once the H(r) field is solved the E(r) may be recovered from the Maxwell's equations. In the derivation of the master equation there was no assumption based on the periodicity of any particular structure. The modes that will propagate in a material are the solutions to this equation. Also, the waves are assumed to oscillate orthogonally to the direction of propagation and may be described as a complex exponential function like a plane wave i.e. H(r)=a exp(ik·r). Since photonic crystals are a medium with periodic dielectric function $\epsilon(\vec{z}) = \epsilon(\vec{z} + \vec{r})$, Bloch theorem is used. Bloch theorem states that for a periodic structure the solution to the master equation has the form of a plane wave multiplied by a periodic function. This is called a Bloch wave:

$$H(r) = a\ \exp(ik \cdot r) \qquad \text{(Eqn. 10)}$$

The function H(z)=H(z+d) is a periodic envelope function wherein d=na, a is the primitive lattice vector and n=1, 2, ..., is an integer. All distinctive solutions occur for k-values within the first Brillouin zone of the reciprocal lattice. Since the structure is periodic, the solutions will have discrete igenvalues $\omega_n(\vec{k})$ that are continuous function of k. These solutions, if plotted, will form bands in a discrete dispersion diagram. This diagram shows all possible iterations in the system. Also, only the first Brillouin zone needs computing, thus saving computational time. The band gap will be the zone in the diagram where there are no propagating k solutions for a set of co.

For the case of a dielectric interface the normal incident electric field may be written as $$E^i = \hat{x} R E_0 e^{j\beta_1 z},$$

where $\beta_1 = \omega\sqrt{\mu_1 \varepsilon_1}$ and $E_0$ are the amplitude of the field. The reflected and transmitted electric fields at each interface may then be written as:

$$E^r = \hat{x} R E_0 e^{j\beta_1 z}, \quad E^t = \hat{x} T E_0 e^{-j\beta_2 z} \qquad \text{(Eqn. 11)}$$

where $\beta_2 = \omega\sqrt{\mu_2 \varepsilon_2}$. From Maxwell's equation $\nabla \times E = -j\omega\mu H$, the magnetic fields are:

$$H^i = \hat{y}\frac{E_0}{\eta_1} e^{-j\beta_1 z},\ H^r = -\hat{y}\frac{RE_0}{\eta_1} e^{j\beta_1 z}, \qquad \text{(Eqn. 12)}$$

$$H^t = \hat{y}\frac{TE_0}{\eta_2} e^{-j\beta_1 z}$$

In this case there are no magnetic or electric currents at the interfaces. The tangential components of the magnetic and electric fields have to be continuous. This is shown as: $\hat{z} \times E(z+0+) = \hat{z} \times E(z+0-)$ and $\hat{z} \times H(z+0+) = \hat{z} \times H(z+0-)$ leading to:

$$1 + R = T,\ \frac{1}{\eta_1}(1 - R) = \frac{1}{\eta_2} T \qquad \text{(Eqn. 13)}$$

Combining these two results, yields:

$$R = \frac{\eta_2 - \eta_1}{\eta_2 + \eta_1},\ T = \frac{2\eta_2}{\eta_2 + \eta_1}, \qquad \text{(Eqn. 14)}$$

Where $\eta_1 = \sqrt{\mu_1/\varepsilon_1}$ and $\eta_2 = \sqrt{\mu_2/\varepsilon_2}$ R and T are the reflection and transition coefficient respectively. The reflectivity and reflectance for bulk materials is $R^2$. This analysis is only for one dielectric interface. For multiple layers, the contributions of all reflected fields from all interfaces must be taken into account. This is computed with numerical simulations where the reflectance is the reflected electromagnetic power divided by the incident one.

1.2 State-of-the-Art

Paper-like displays work by reflecting light and controlling the color or gray scale levels of reflection. These types of displays do not need a backlight which reduces the power consumption, especially. This solution may be useful for mobile applications that depend on batteries. Moreover, these types of displays produce a better reading experience in outdoor environments than liquid crystal displays or light-emitting diodes (LED) based displays. The light source of these devices cannot compete with the sunlight or the illumination in a bright room. Several approaches have been used to achieve paper-like displays. These approaches include electrophoretic, total internal reflection display, electrowetting, and photonic crystals.

Electrophoretic displays are the most mature of these technologies. They have been used in commercial applications since about 2004 in e-readers, price tags, watches, cell phones, and the like. Gray scales are achieved by manipulating the electric field exposing some percentage of black and white particles on the surface. The current state-of-the-art is Carta™ imaging film commercialized by E-Ink®. It has a reflectance of about 44%, sixteen levels grayscale, and image update time of 120 milliseconds. This device is not suitable for video playback. On the positive side, the device is bistable meaning there is no consumption of energy after switching.

Total Internal Reflection Display (TIR) is a reflective display that works by total internal reflection, it has a high refractive index top plane and a low refractive index fluid with black charged particles in it. When the particles are not in contact with the high refractive index plane, light that in incident above the critical angle, is completely reflected. Then, the charged particles are moved by an electrostatic field to the top plane and entered the evanescence region of the wave obstructive TIR. The current state-of-the-art is commercialized by Clearink®. It has a reflectance of 70-80%. The switching speed is about 33 ms.

Electrowetting displays (EWD) work by changing the contact angle of a liquid and a hydrophobic surface with an applied voltage. The structure of a single pixel comprises a reflective substrate, a transparent electrode, a hydrophobic dielectric, two liquids, water and a dyed oil. The current state-of-the-art is being made by Etulipa® with a reflectance of about 60% and a switching speed of about eight milliseconds.

Photonic crystals (PCs) based devices are realized from periodic structures of alternating refractive index. They may reflect particular colors without the use of dyes or pigments. These type of structures (1D and 3D) are used in nature to produce a specific set of colors. Several types of electrically actuated photonic crystals have been studied. The most noteworthy of them are the ones that use electrochemical processes, reorientation of liquid crystal molecules, and electrophoretic organization of colloidal suspension. These types of crystals are 3D structures that may shift the reflected wavelength by a change in the refractive index of the material, or by modifying the position and separation of its constituents. Electrochemical processes have an electrochemical responsive material immersed in a conductive solution. For example, the process involves an oxidation-reduction or an acid-bases exchange. These reactions generate gas components that have to be removed from the assembly. These electrochemical devices have very large actuation times ranging from seconds to minutes. However, they may achieve a large change in the photonic bandgap encompassing almost the entire visual range. However these devices have low reflectance (e.g. less than 40%). Reorientation of liquid crystal molecules work by reorganization of the liquid crystals when a voltage is applied. These materials have birefringence properties that make them have different refractive indexes in different directions depending on the polarization and propagation direction of light. Although, the response time is very low (e.g. less than two milliseconds), the shift in the bandgap is also very narrow (e.g. typically 5-35 nanometers).

Electrophoretic organization of colloidal suspension is very high concentrated charged particles crystal colloidal arrays (CCA). When a voltage is applied, the particles move to the opposite electrode. Since the particles have high charge they tend to arrange in ordered structures. Therefore, the bandgap of the crystal changes due to the separation and distribution of the particles. The shift in the photonic bandgap may encompass the entire visual range. However, it has poor tuning repeatability due to ion generation in the electrode surface. Also, it has relatively long switching time from one second to several minutes. With the exception of liquid crystals, what these techniques have in common is that they offer a control in reflected wavelength but not in reflectance. Accordingly, a need exists for further technology advances to solve this issue.

Several approaches have been made to fabricate stretchable polymer based 1D photonic crystals, such as by spin coating, stack assembly, or self-assembly block copolymers. They may be actuated by applying stress/strain forces, thermal expansion, humidity or electrical potential difference. Because they are usually fabricated from two different polymers with low difference in their refractive indexes, they need a large number of layers (e.g. greater that twenty) to achieve high levels of reflectivity. For the case of electrically driven ones, the reflectance is still below 45%. The actuation changes the reflected wavelength parameter but not the reflectance parameter.

The most recent development of a stretchable 3D polymer-based photonic crystal encapsulates a colloidal array of Polymethyl methacrylate (PMMA) into a hydrogel. By applying strain to the material, the distance between the particles changes and the photonic bandgap changes. The range of change by 50% of strain in the reflected wavelength is from 468 to 659 nanometers. The summary of state-of-the-art technology used for these displays is shown in TABLE 1.

TABLE 1

| Technology | Reflectance % | Switching Speed (ms) |
|---|---|---|
| Electrophoretic | 44 | 120 |
| TIR | 70-80 | 33 |
| Electrowetting | 60 | 8 |
| Newspaper | 60 | — |
| White Paper | 70-90 | — |
| Disclosed PMMA Mirror* | 60-100 | <1 |
| Disclosed PDMS Mirror* | 60-100 | 6 |

*Depends on the number of layers. For more than six layers, the reflectance is more than 90% for PMMA and more than 80% for PDMS. Currently PMMA is widely used.

2.0 a Free Standing Polymer Based Dielectric Mirror

Disclosed herein is a process (i.e. method) for fabricating a free standing polymer based dielectric mirror. The process involves the use of two polymers with high refractive index that can be PMMA, Poly (dimethylsiloxane) (PDMS), or Positive photoresist for e-beam lithography. It may be spin coated from below 100 nanometers to several microns in thickness. Also, it may be spin coated on top of sacrificial resist to create free standing layers of any other polymer and 2D photonic crystals. Sacrificial polymers may also be spin coated from below 100 nanometers to several microns. By combining these two resists, 3D lamellar structures like the ones in Morpho butterfly wings may be fabricated. One of the challenges of creating large free standing Polymer1 layers is that as sacrificial resist is removed Polymer1 tends to bend upward due to the stress difference between Polymer1 and sacrificial resist thermal expansion coefficients. This may be reduced by applying sacrificial resist on top and bottom of each Polymer1 layer. Also, the structure may be made stronger by spinning thicker Polymer1 layers (e.g. greater than one micron) and reducing the sacrificial resist thickness. Since PMMA-type polymers have a relatively large Young's modulus, the layers have to be long (e.g. greater than 70 microns) in order to be able to be bent with a relatively small voltage. To overcome this challenge, this is demonstrated in the simulations of Section 3.2, instead of using PMMA-type as the bulk material for the dielectric mirror, PMMA with sacrificial resist materials may be substituted as a mold to form a dielectric mirror made of another polymer like PDMS which has a Young's modulus that is three orders of magnitude smaller than PMMA.

PDMS is a soft polymer extensively used as a bulk material for microfluidics and soft lithography. PDMS comes in two parts, a base and a curing agent. The two parts are mixed in ratios by weight and then cured at specific temperatures. The stiffness of the material is dependent on base to cure agent ratio, thickness, and curing temperature. The dielectric and mechanical properties of PDMS have been thoroughly evaluated. Furthermore, it has been shown that by treating PDMS with steam, a porous film may be obtained. Then, titanium and gold may be deposited forming a very low resistance flexible electrode. Also, nickel may be electroplated, forming a reliable way to add soldering pads. One challenge of working with PDMS is its large viscosity, making it difficult to create thin films. For example, a thickness of five microns may be achieved if spun for five minutes at 6000 revolutions per minute (RPM). It has also been shown that by diluting PDMS with hexane, membranes, 100 nanometers or thinner may be fabricated. Also, it has been demonstrated by using the same technique and dry etching, bridges and beams of 500 nanometers thick, 2 microns wide, and 800 nanometers may be fabricated.

By using PMMA/sacrificial resist as a mold for PDMS, no solvent is needed. In this way PDMS may preserve its mechanical properties that may be adjusted as explained in the previous paragraph. Also, PMMA and sacrificial resist layers are very smooth with a standard deviation in thickness for PMMA and sacrificial resist of about 4 nanometers. This has been tested experimentally in Nanofabrication Facility (NNF) at NCSU. Therefore, smooth layers of PDMS may be realized. Some properties of PMMA and PDMS are shown in TABLE 2.

TABLE 2

| Material | Refractive index | Density g/cm$^3$ | Young's Modulus Mpa | Tensile Strength MPa | Elongation at Break % |
|---|---|---|---|---|---|
| PMMA | 1.49 | 1.18 | 1800-3100 | 48-76 | 2.5 |
| PDMS | 1.41 | 0.97 | 0.36-3.0 | 1.0-9.0 | 158-300 |

2.1 Actuated Polymer Based Dielectric Mirror Device Structures

Four types of dielectric mirror devices (Devices A-D) are disclosed in the following paragraphs:

Device A is a dielectric mirror where the layers are fabricated with PMMA-type Polymer (i.e. Polymer1) and a transparent electrode on one side and a metallic electrode in another. The last layer is made of PMMA combined with carbon black as an absorbing layer that will prevent light from reflecting off the metallic electrode. FIG. 1A through FIG. 1F depict a diagram 100 illustrating a fabrication process for the device A in accordance with embodiments of the present disclosure.

Figure 1G:
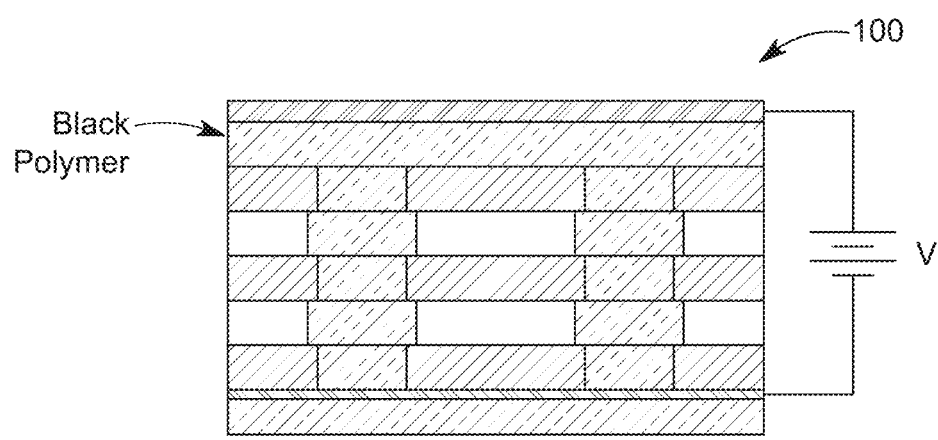

In step (a) FIG. 1A on a glass with transparent electrode, layers of Polymer1/Polymer2 are spin coated and baked sequentially. In step (b) FIG. 1B with photolithography and deep reactive ion etching (DRIE) trenches are formed. In step (c) FIG. 1C after flood-exposure, the positive photoresist is removed. In step (d) FIG. 1D Polymer 1, which is mixed with Carbon Black, is spin coated and baked, forming the mirror pillars. In step (e) FIG. 1E using DC sputtering and lift-off processes, the metallic top electrode is deposited. In step (f) FIG. 1F second DRIE processes expose the Polymer 1/sacrificial resist layers. In step (g) FIG. 1G the structure is submerged in organic solvent until all sacrificial resist has been etched producing the shown ginal structure profile. Simulation results have been conducted for this device and are shown in Section 3.2.

Device B has a similar structure as Device A but instead uses Polymer1/sacrificial resist as a mold and Polymer2 as the dielectric mirror material and having a transparent electrode. FIG. 2A through FIG. 2J depicts a diagram 200 illustrating a fabrication process for the device B in accordance with embodiments of the present disclosure.

Figure 2A:
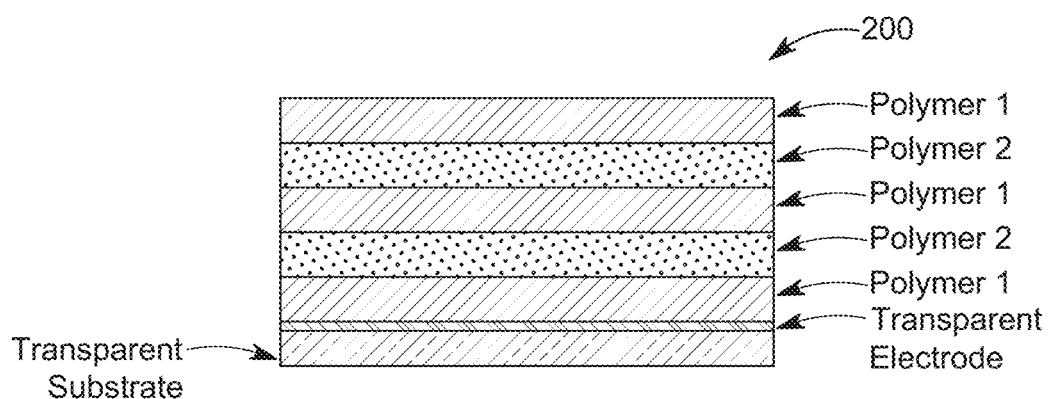
FIG. 2A through FIG. 2J depicts a diagram illustrating a fabrication process for a second device including a dielectric mirror in accordance with embodiments of the present disclosure.
Figure 2B:
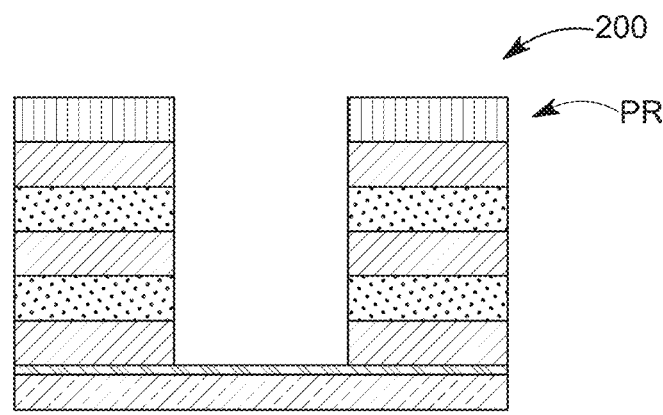
Figure 2C:
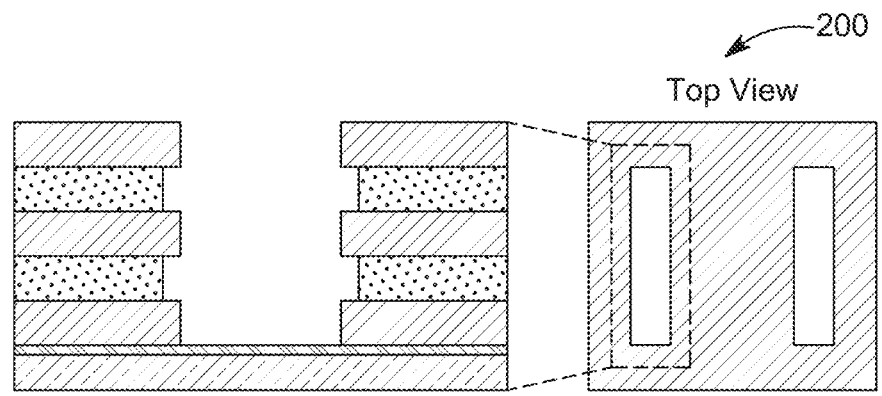
Figure 2D:
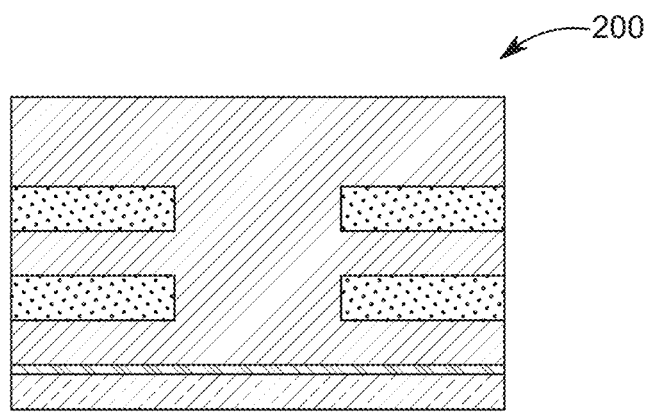
Figure 2E:
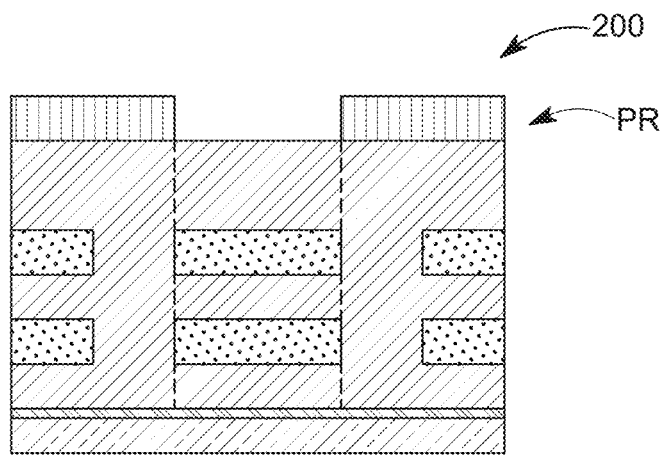
Figure 2F:
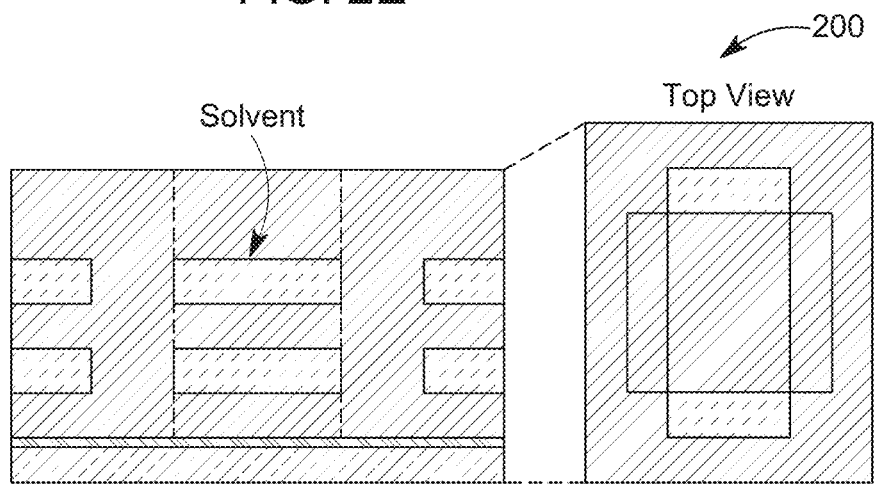
Figure 2G:
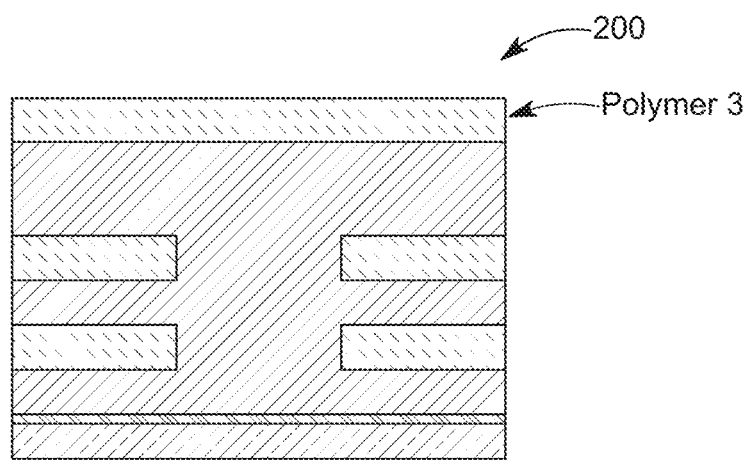
Figure 2H:
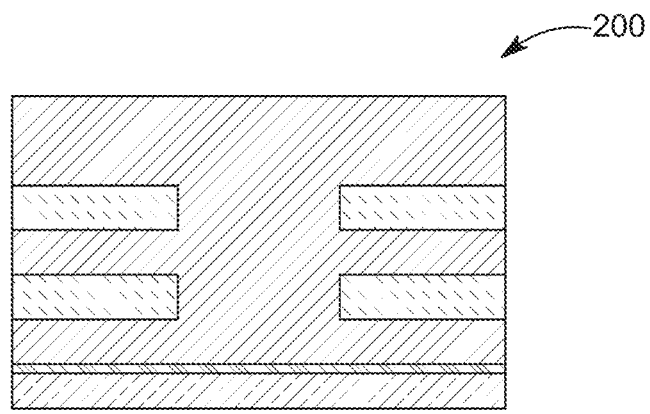
Figure 2I:
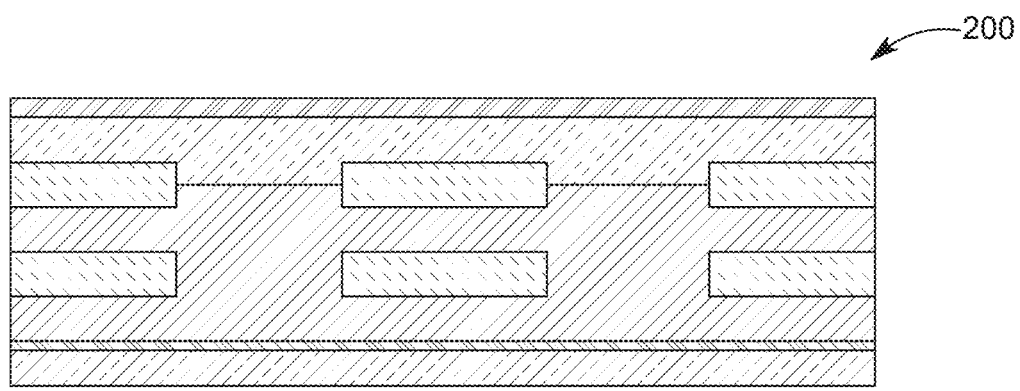
Figure 2J:
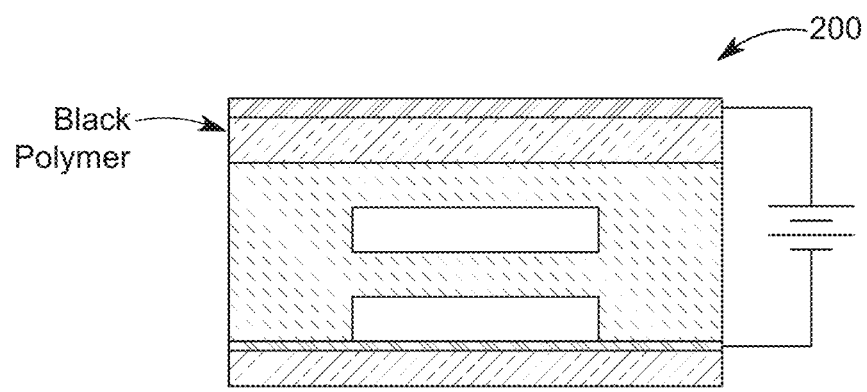

In step (a) FIG. 2A layers of Polymer1/sacrificial photoresist are spin coated and baked. In step (b) FIG. 2B trenches are formed with photolithography and DRIE. In step (c) FIG. 2C photoresist is removed in solvents. In step (d) FIG. 2D Supporting pillars are formed by spin coating Polymer2. In step (e) FIG. 2E trenches are formed with photolithography and DRIE. In step (f) FIG. 2F after removing sacrificial resist with solvent, the wafer may be let to dry. In step (g) FIG. 2G Polymer2 is spin coated on top and put in a vacuum such that the cavities are filled. In step (h) FIG. 2H the top layer of Polymer2 is removed with DRIE. In step (i) FIG. 2I Polymer2 mixed with carbon black, is spin coated and baked prior to O$_2$ plasma activation of PDMS. Also, the metallic electrode is formed with lift-off process and DC sputtering. In step (j) FIG. 2J, the final device is released by removing Polymer1 with solvents.

FIG. 3A through 3J depicts a diagram 300 illustrating a fabrication process for a Device C of a Polymer2 actuated dielectric mirror with no transparent electrode. Device C is fabricated in a similar way as Devices A and B with the exception that the transparent electrode is removed and replaced by a metallic one (e.g. aluminum or copper). This modification reduces the absorption of light. The actuation force is realized by inducing a charge on the top electrode forming a direct current (DC) capacitive voltage divider. All connections are made at the substrate.

Figure 3A:
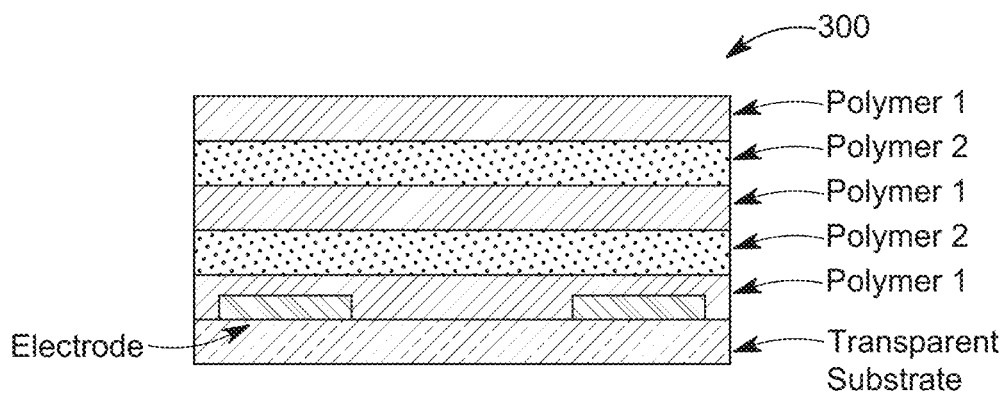
FIG. 3A through FIG. 3J depicts a diagram illustrating a fabrication process for a third device including a dielectric mirror in accordance with embodiments of the present disclosure.
Figure 3B:
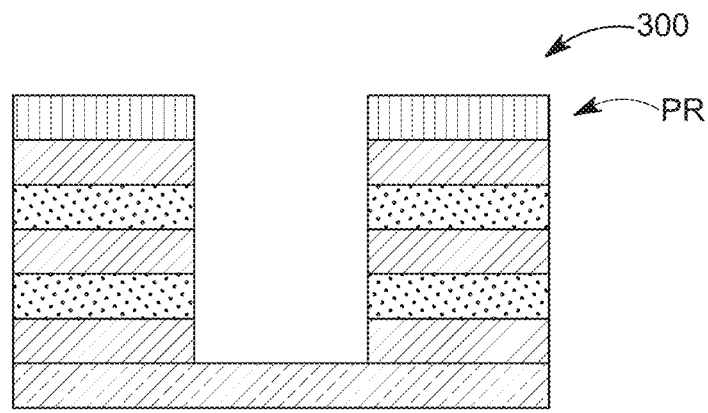
Figure 3C:
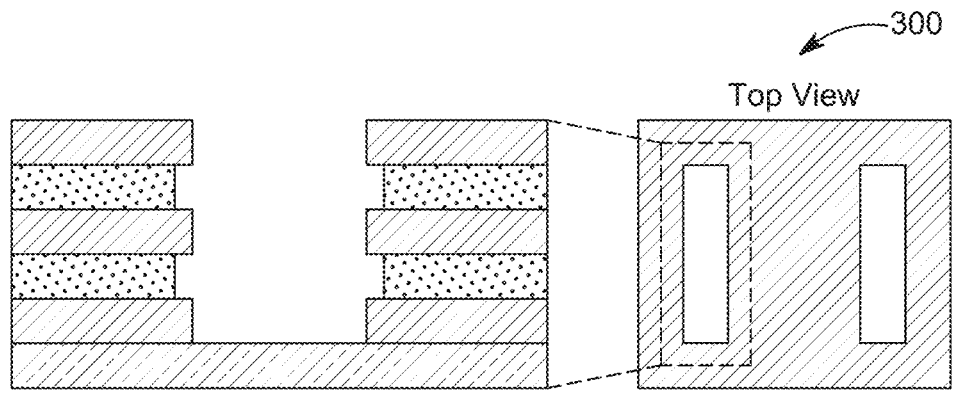
Figure 3D:
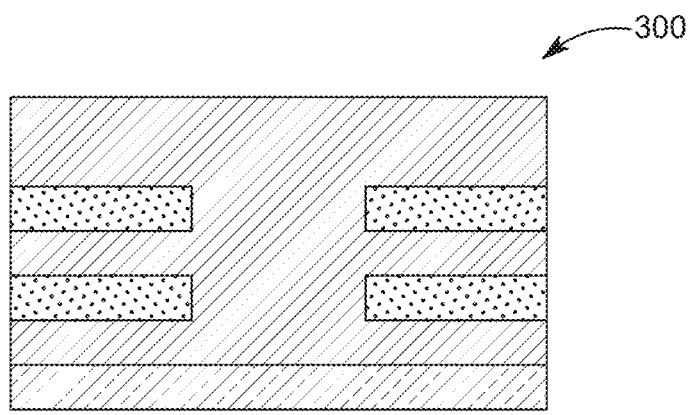
Figure 3E:
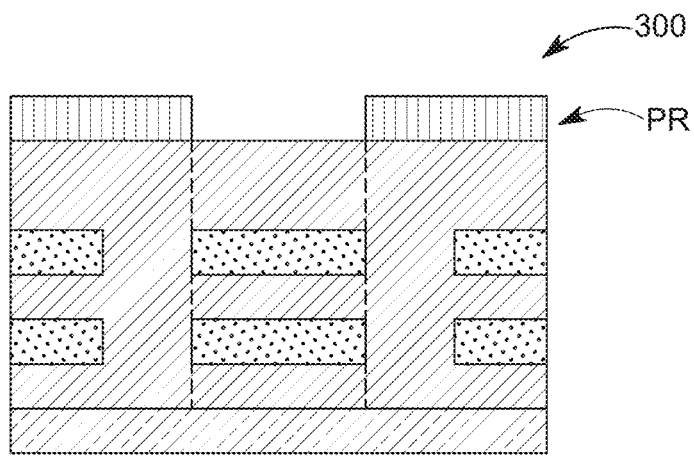
Figure 3F:
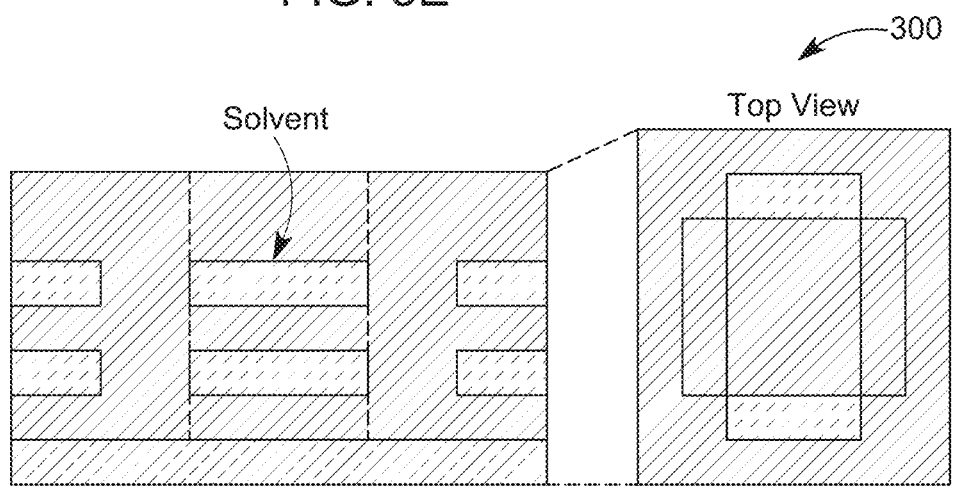
Figure 3G:
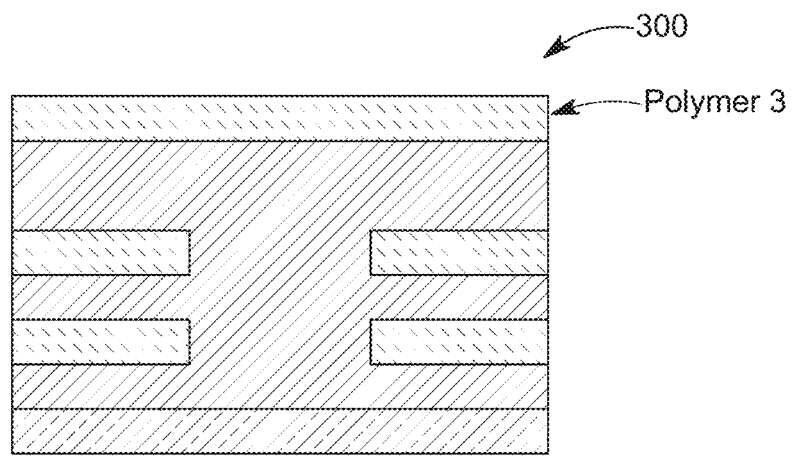
Figure 3H:
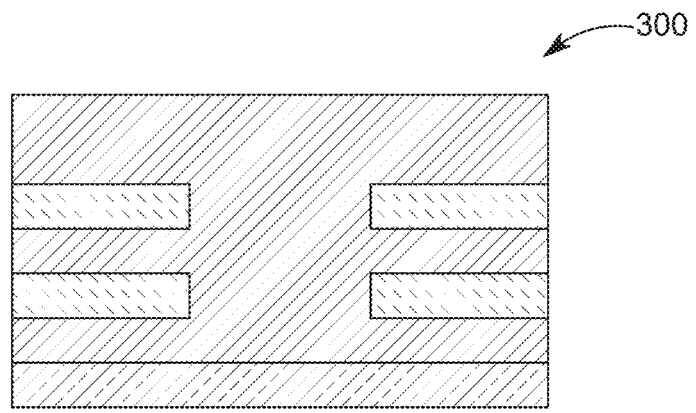
Figure 3I:
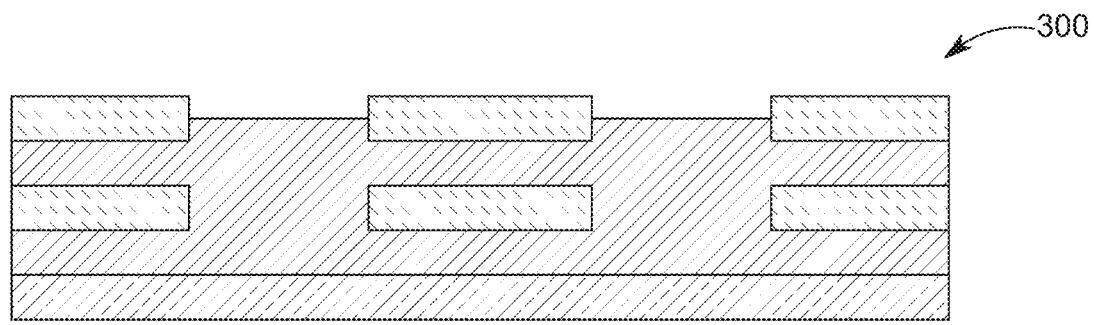
Figure 3J:
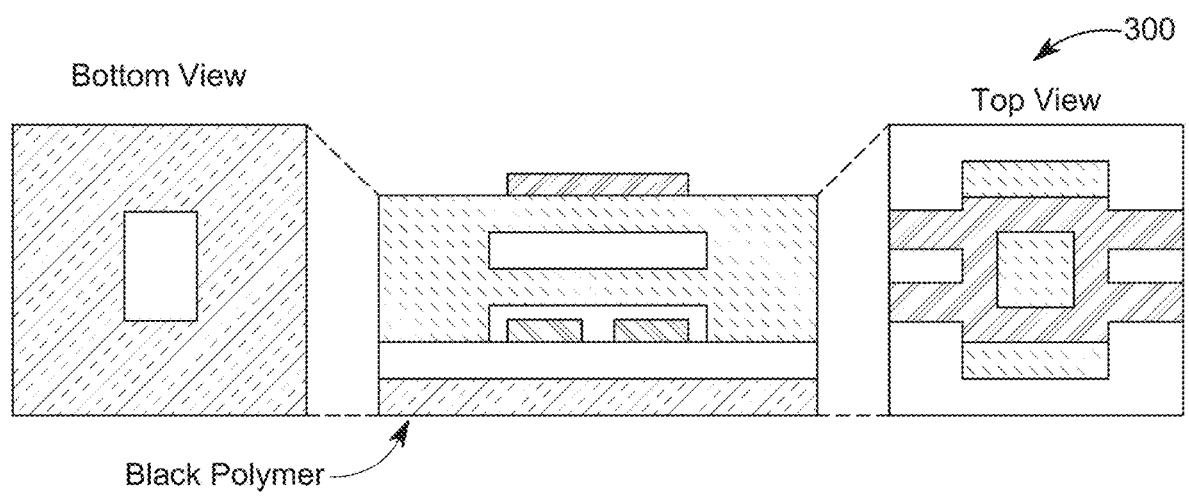

In step (a) FIG. 3A layers of Polymer1/sacrificial resist are formed by spin coating and baking on a substrate with pre-deposited metal electrodes. In step (b) FIG. 3B trenches are formed with photolithography and DRIE. In step (c) FIG. 3C the photoresist is removed. In step (d) FIG. 2D supporting pillars are formed by spin coating Polymer1. In step (e) FIG. 3E trenches are formed with photolithography and DRIE. In step (1) FIG. 3F the sacrificial resist is removed with organic solvents. In step (g) FIG. 3G Polymer2 is spin coated and put in a vacuum. In step (h) FIG. 3H the top layer of Polymer2 is removed with DRIE. In step (i) FIG. 3I the top layer of Polymer2 is exposed with oxygen dry etching. In step (j) FIG. 3J the floating electrode is formed by lift-off process and DC sputtering. On the other side of the substrate either Polymer1 or Polymer2 with carbon black is spin coated and patterned to cover the metallic electrodes. This step may also be performed at the beginning of the fabrication process.

FIG. 4A through FIG. 4J depicts a diagram 400 illustrating a fabrication process for a Device D of a Polymer2 actuated dielectric mirror with no transparent electrode. Device D is fabricated by controlling the etch rate of each sacrificial resist layer. The etch rate of this material depends on the baking temperature and time. Since the process of spin coating Polymer1 and the sacrificial resist layers is sequentially vertical, the first sacrificial resist layer will etch slower than the top one. However, the relation of baking time may be controlled to form a pyramid or staircase type of structure. This will expose the bottom PDMS layer allowing control of each layer individually. In this way, the spacing of the layers may be controlled and thus the bandgap of the mirror. While one set of electrodes controls the reflectivity, the other one will control the wavelength.

Figure 4A:
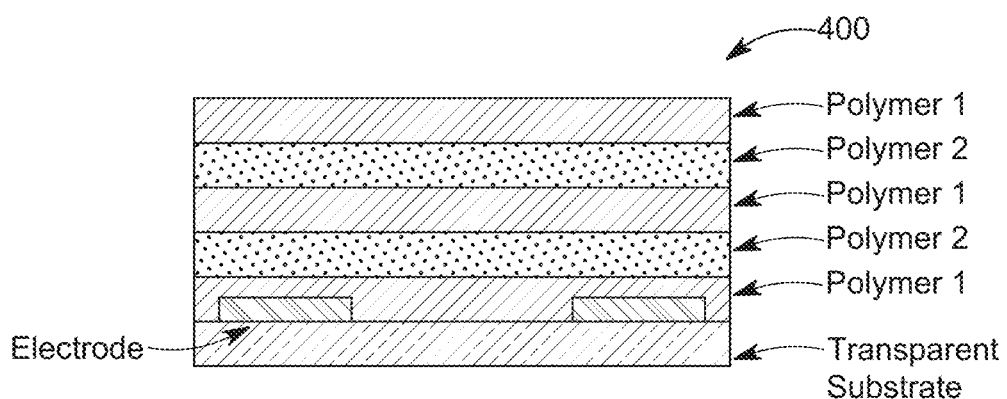
FIG. 4A through FIG. 4J depicts a diagram illustrating a fabrication process for a fourth device including a dielectric mirror in accordance with embodiments of the present disclosure.
Figure 4B:
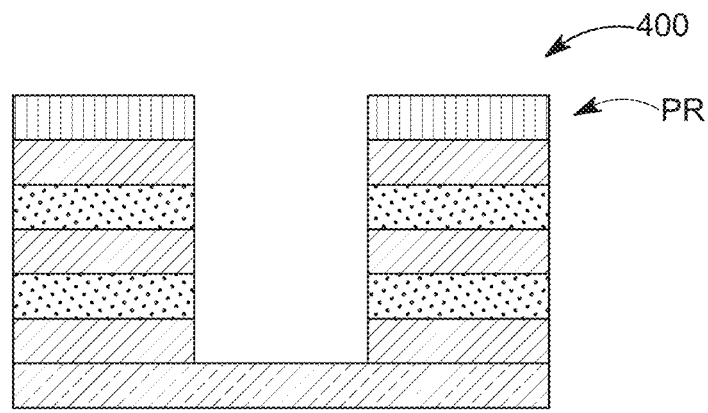
Figure 4C:
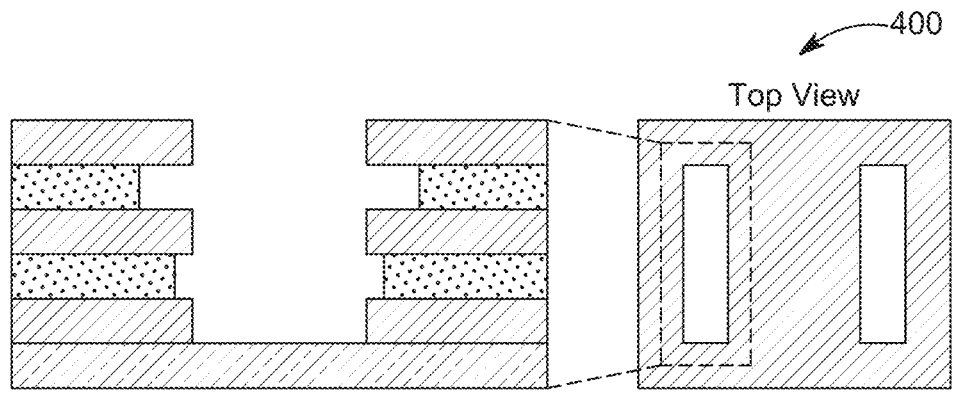
Figure 4D:
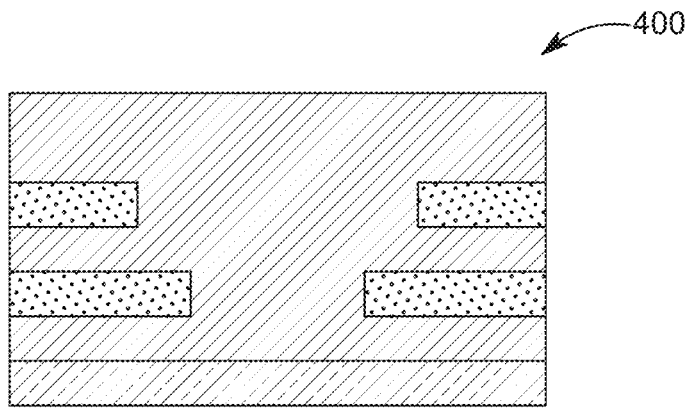
Figure 4E:
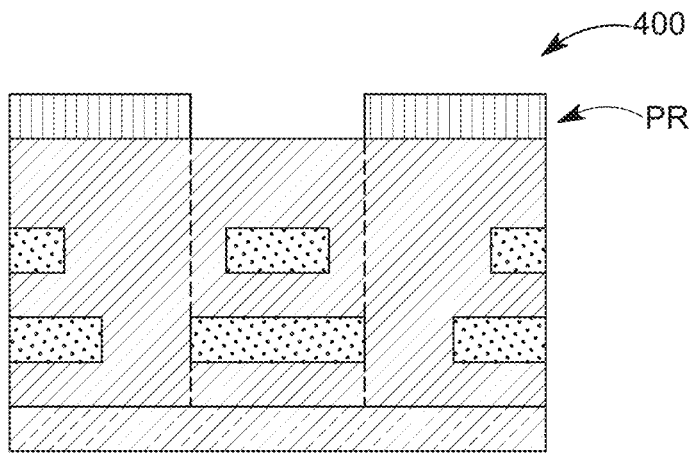
Figure 4F:
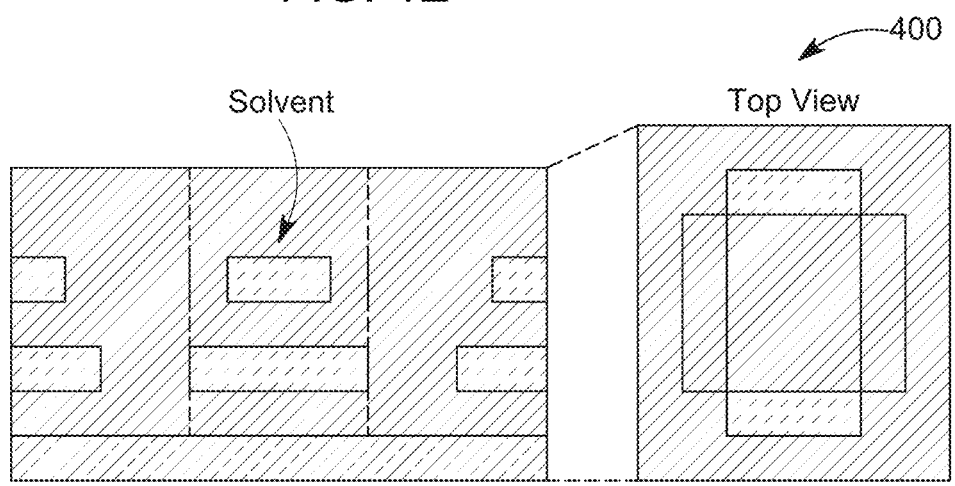
Figure 4G:
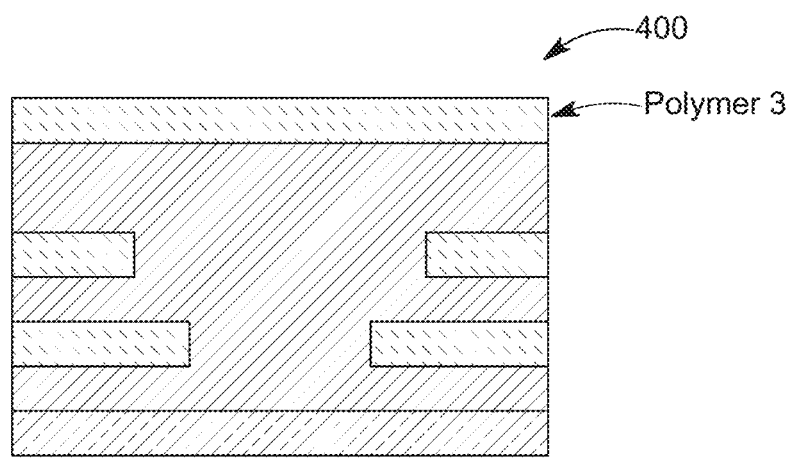
Figure 4H:
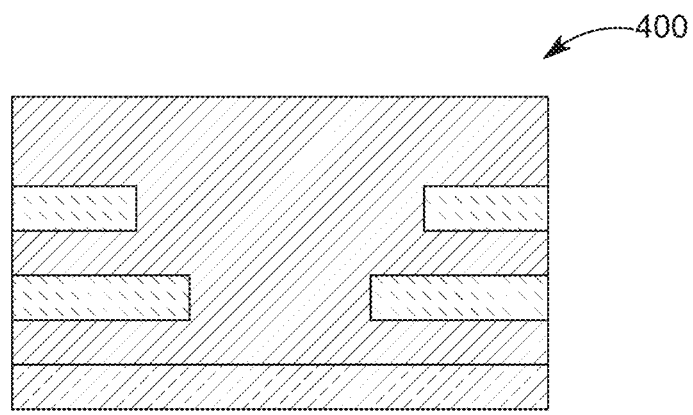
Figure 4I:
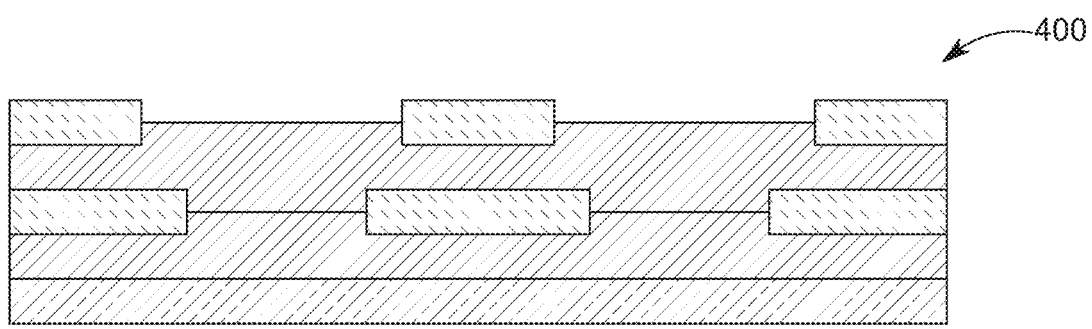
Figure 4J:
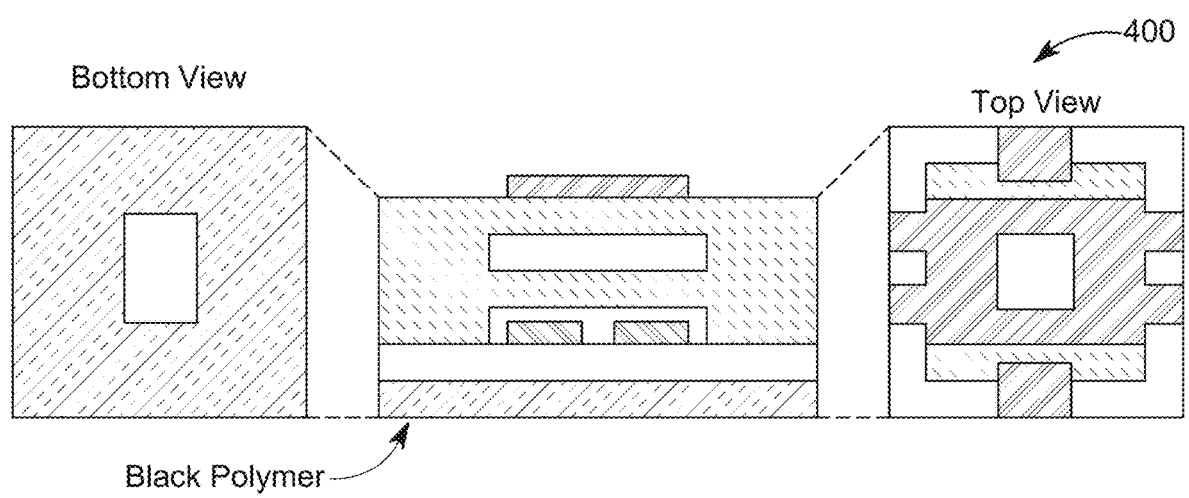

In step (a) FIG. 4A layers of Polymer1/sacrificial resist are formed by spin coating and baking on a substrate with pre-deposited metal electrodes. In step (b) FIG. 4B trenches are formed with photolithography and DRIE. In step (c) FIG. 4C photoresist is removed. In step (d) FIG. 4D supporting pillars are formed by spin coating Polymer1. In step (e) FIG. 4E trenches are formed with photolithography and DRIE. In step (f) FIG. 4F sacrificial resist is removed by solvents. In step (g) FIG. 4G Polymer2 is spin coated and put in a vacuum. In step (h) FIG. 4H the top layer of Polymer2 is removed with DRIE. In step (i) FIG. 4I the top layer of Polymer2 is exposed with oxygen dry etching. In step (j) FIG. 4J the floating electrode is formed by lift-off process and DC sputtering. On the back side of the substrate, either Polymer1 or Polymer2 with carbon black is spin coated and patterned to cover the metallic electrodes. This step may also be performed at the beginning of the fabrication process.

A summary and overview of Devices A-D are shown in TABLE 3.

TABLE 3

| Device | Base material | Type of electrostatic actuation | Color filter | Fabrication Challenges |
|---|---|---|---|---|
| A | PMMA | Direct | Yes | Size and stiction |
| B | PDMS | Direct | Depends on layers thickness | Thickness of PDMS Carbon Black layer |
| C | PDMS | Induced | No | Electrode adhesion |
| D | PDMS | Induced | No | Electrode adhesion |

3.0 Simulations

The disclosed devices are a complex of coupled physical problems. The dielectric mirror consists of multiple layers, with electrostatic forces acting on them and consequently deformed. At the time of this work no analytical solutions seems to exist. Therefore, this work discloses to use numerical simulations to design and predict the behavior of each of the devices disclosed. Three software programs have been used: Cavity modelling framework (CAMFR) used to search for structures that will reflect particular set of wavelengths; ANSYS® to simulate the electrostatic behavior and deformation of the structures due to electrostatic forces, which output of deformed structure may be exported to Synopsys® to simulate the light response to electrostatic deformation. In order to export the deformed structure from ANSYS® to Synopsys®, Blender (professional free and open-source 3D computer graphics software) has been used to get a cross section of the mirror. A Python script was developed to re-create, with Synopsys® commands, the structure in Synopsys® structural editor.

3.1 Cavity Modelling Framework (CAMFR)

In order to study and design 1D photonic crystals an open source computer software CAvity Modelling FRamework (CAMFR) is used. This code is a full vectorial Maxwell's solver that calculates the fields using Eigenmode expansion and perfectly matched layer (PML). The software design and theoretical operation calculates:

the scattering matrix of a structure,
the field inside a structure for any given excitation,
the band diagrams of an infinite periodic structure,
the threshold material gain and resonance wavelength of laser modes,
the response to a current source in an arbitrary cavity, and
the structures terminated by a semi-infinite repetition of another structure.

This software is not a package but a framework programmed in Python scripting language by selecting appropriate functions for materials and boundary conditions. Also, other parameters must be set too, like, polarization of incident fields and wavelength, etc. For example, if a dielectric mirror of polymer/air layers is to be calculated, the equations for the materials refractive index must be entered or a code must be written in order to get the refractive index from a comma separated value (csv) file. The structure is constructed by first setting the slab length (for example, slab=Slab (Polymer1(30)) and space=Slab(air(30)), which defines a slab of 30 µm of Polymer1 and another of air.

Then, to construct the stack these variables are concatenated. For example, stack=Stack (space(10.0)+slab(0.1)+space(0.1)+slab(0.1)+space(10.0)), which define a dielectric mirror composed of air at the top and bottom, and two 100 nanometer slabs of Polymer1 with a 100 nm space of air in between. This software is useful to create square like structures but would be difficult to define a deformed one. However, the computation time is relatively fast (around 1.5 seconds for the structures presented here in the visual range). It is useful to search for structures that will reflect particular wavelength depending on the materials thickness, and it may calculate the angle dependent reflectance and the photonic bandgap of a particular structure.

Figure 5:
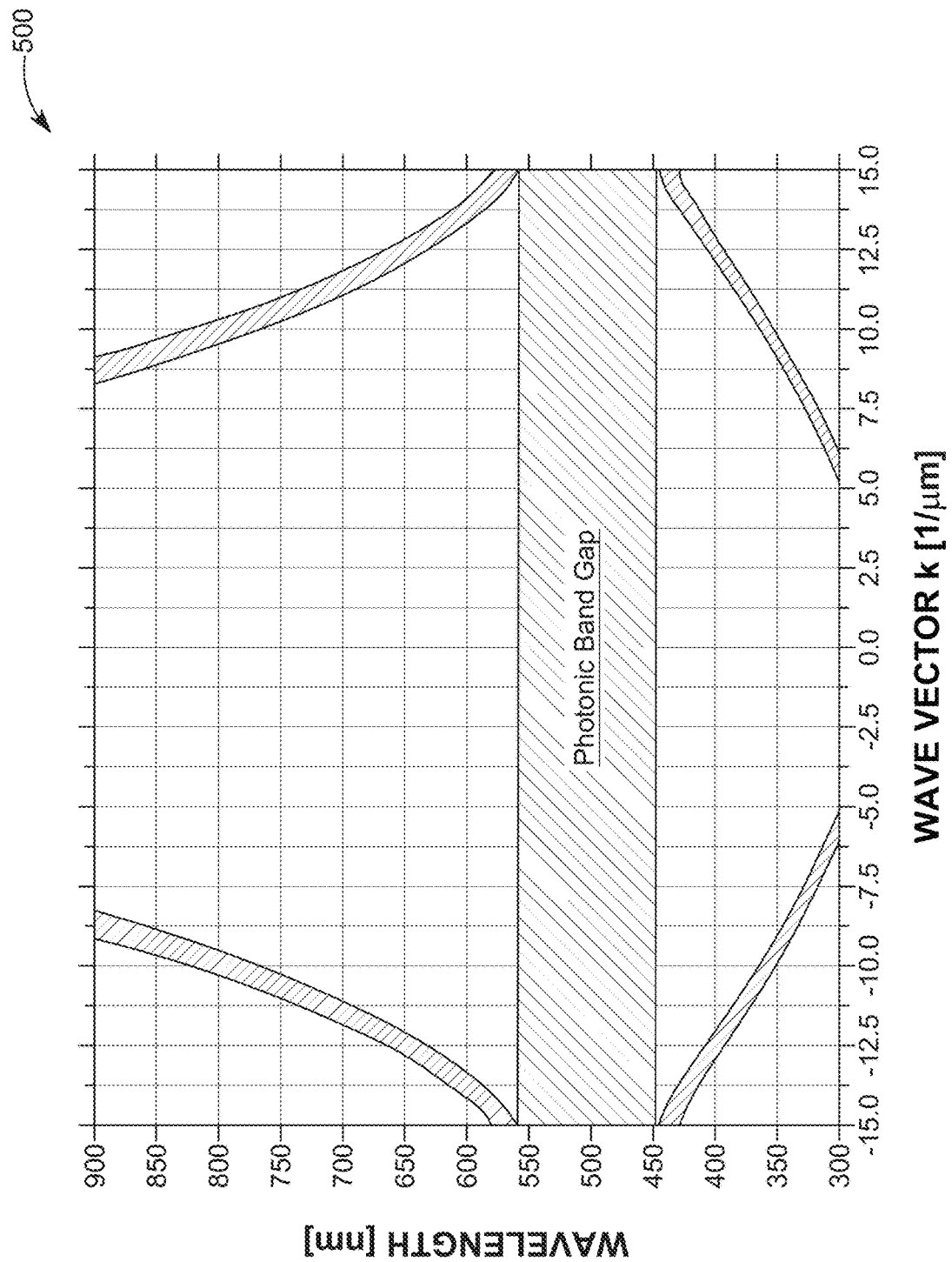
FIG. 5 depicts a graph illustrating a bandgap formed by an infinite stack of a 100 nanometers of a polymer and a 100 nanometers of air in accordance with embodiments of the present disclosure.

A stack of alternating layers of polymer/air may be fabricated to create a 1D photonic crystal. This dielectric mirror may be tuned to reflect a particular set of wavelengths. FIG. 5 depicts a graph 500 illustrating a bandgap formed by an infinite stack of a 100 nanometers of a polymer and a 100 nanometers of air in accordance with embodiments of the present disclosure. The middle of the bandgap is approximately 500 nanometers. When light with this wavelength is incident at 0° angle on the crystal, it will be completely reflected. Specifically the results are for a polymer infinite stack using CAMFR, Slab=0.1 microns, Air=0.1 microns, illustrating the band diagram of an infinite stack. The band diagram is calculated by using a block wave equation. Therefore, it calculates on the first Brillouin zone assuming that the stack is infinite.

Figure 6A:
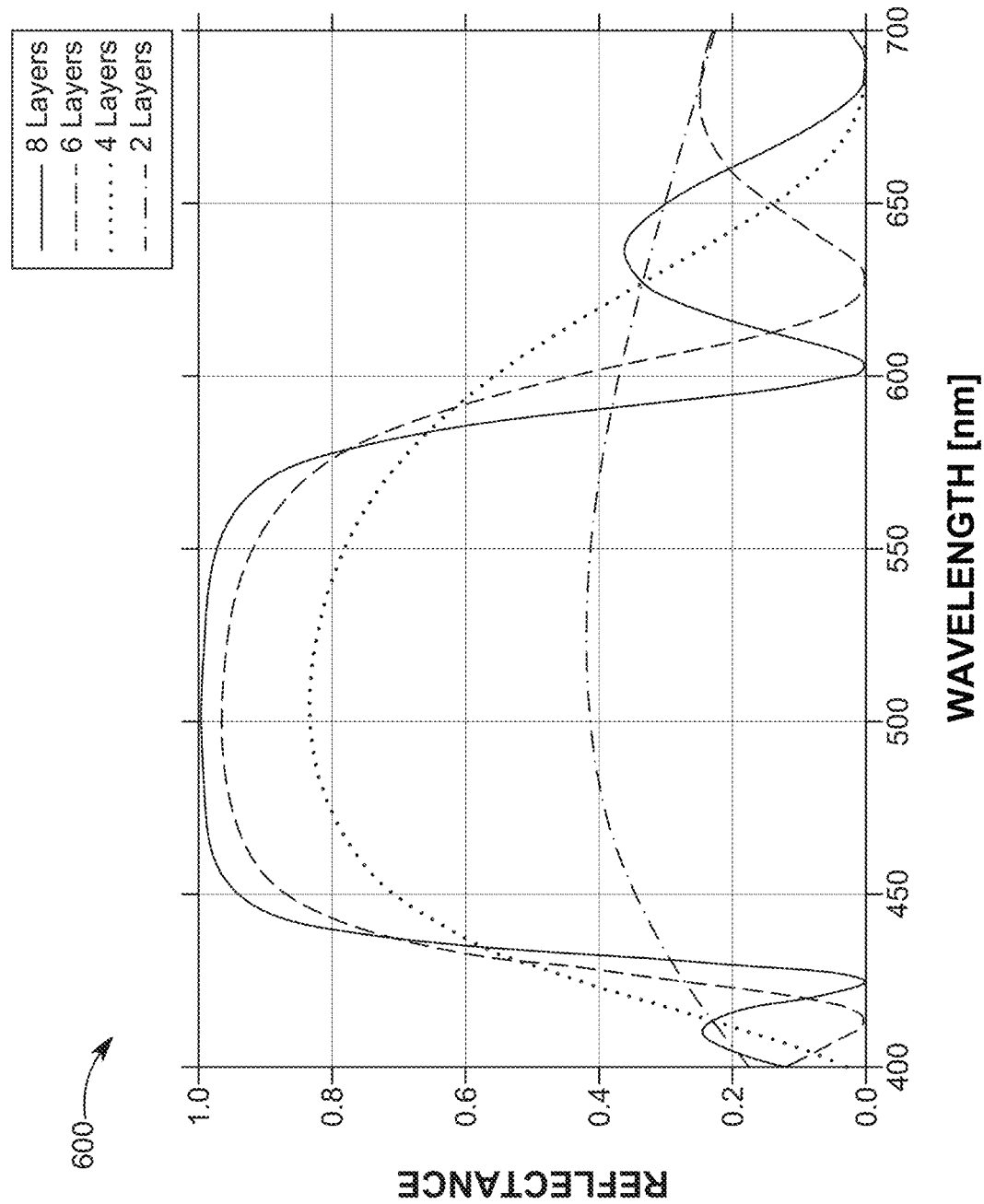
FIG. 6A depicts a graph illustrating simulation results for reflectance as a function of wavelength for a dielectric mirror with implementations of two, four, six, and eight layers in accordance with embodiments of the present disclosure.
Figure 6B:
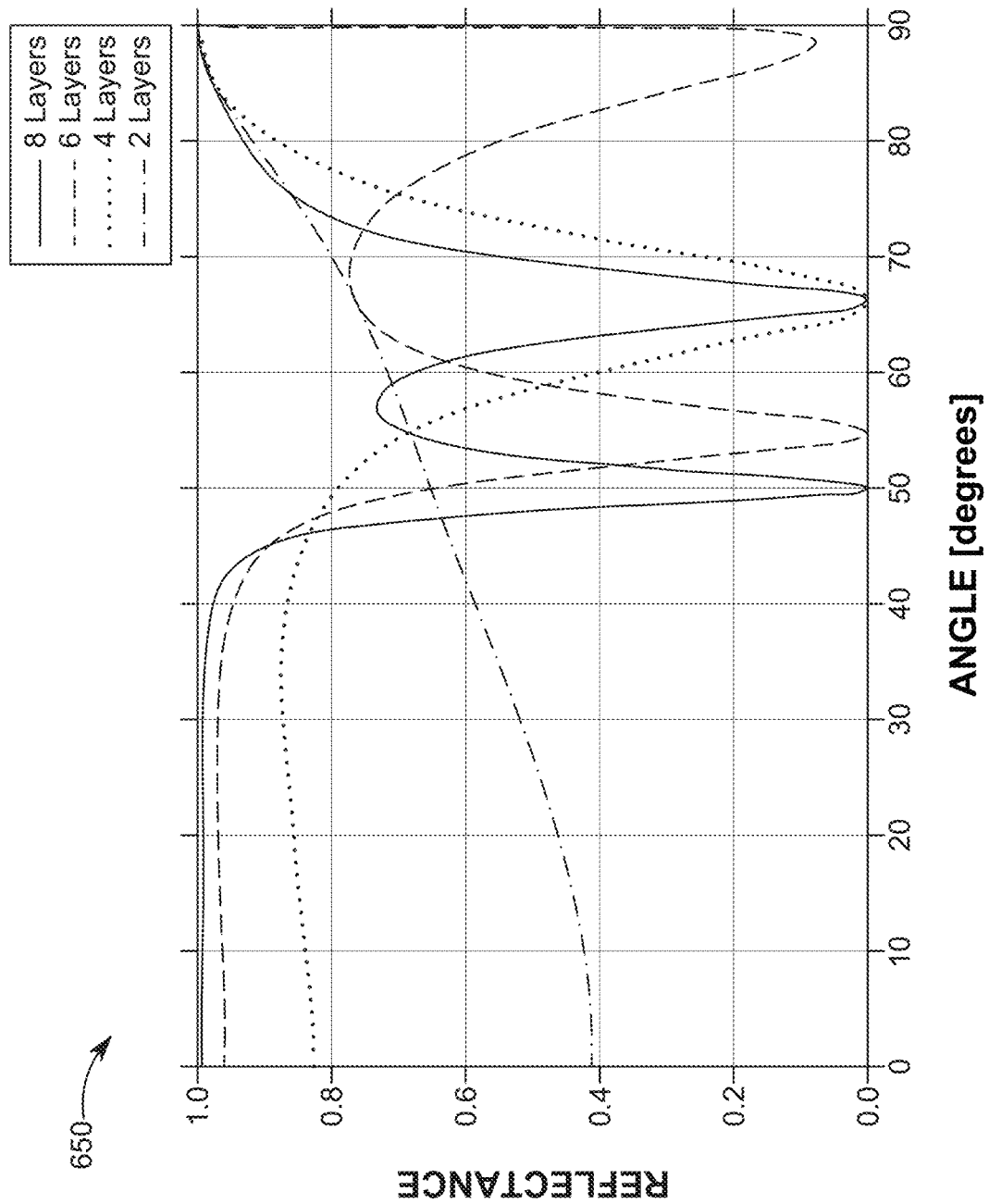
FIG. 6B depicts a graph illustrating simulation results for reflectance as a function of incident angle at a given wavelength for the dielectric mirror of FIG. 6A with implementations of two, four, six, and eight layers in accordance with embodiments of the present disclosure.

However, if the number of layers is reduced the reflectance will be reduced. FIG. 6A depicts a graph 600 illustrating reflectance as a function of wavelength for the disclosed structure of FIG. 5 with implementations of two, four, six, and eight layers. Simulation results use CAMFR for the reflectance of a PMMA stack (Slab=0.1 microns, Air=0.1 microns) with different numbers of layers. The dielectric mirror reaches nearly 100% reflectance using a total of only eight layers. As the number of layers is reduced the reflectance is reduced. FIG. 6B depicts a graph 650 illustrating CAMFR simulation results for reflectance with respect to the incident angle of this structure at a wavelength $\lambda$=500 nanometers. The reflectance is very low for angles between 50° and 70°. This limitation may be reduced by adding a diffusive surface on top of the whole structure.

Figure 7A:
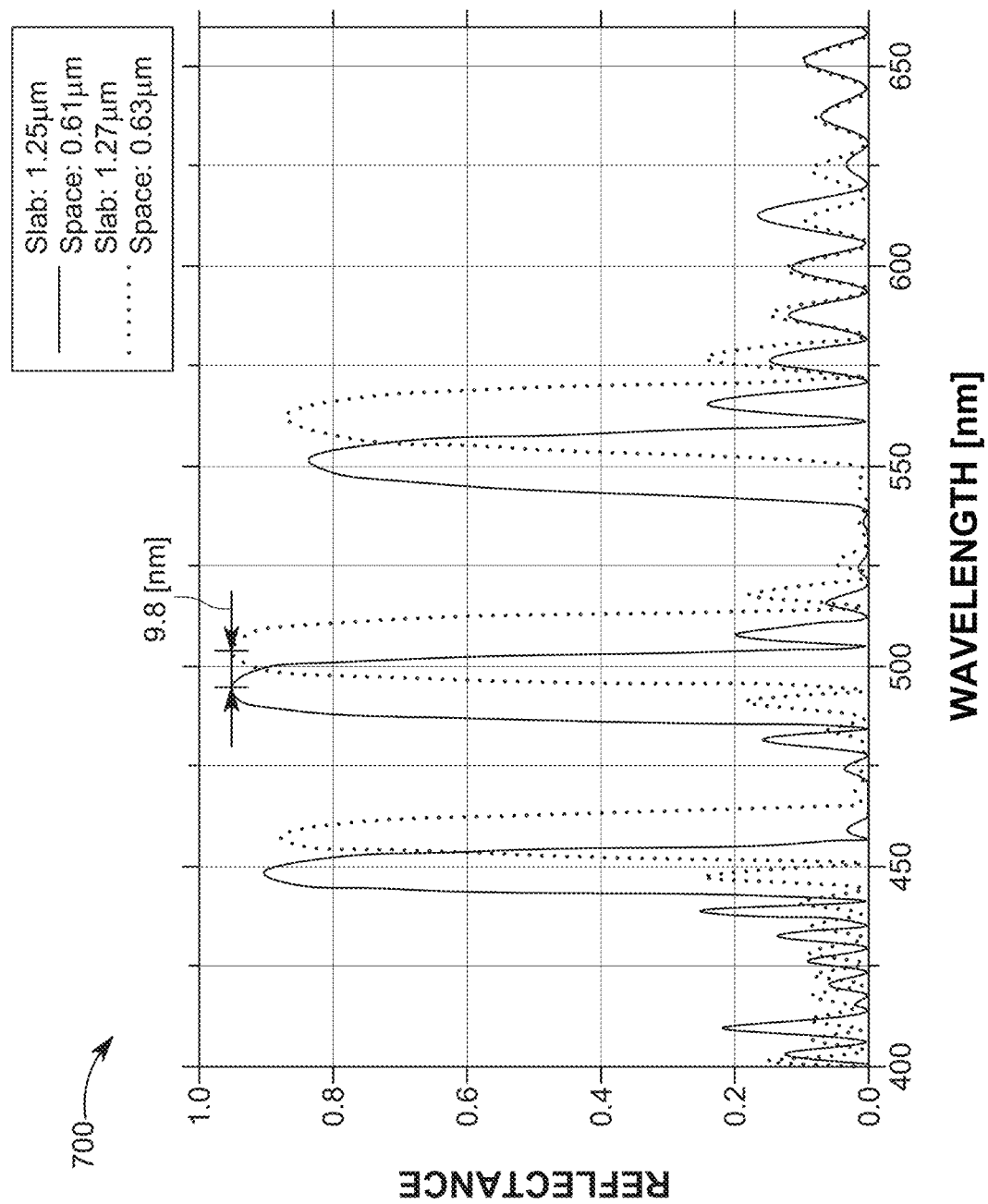
FIG. 7A depicts a graph illustrating simulation results for reflectance as a function of wavelength for a dielectric mirror having a six layer stack in accordance with embodiments of the present disclosure.
Figure 7B:
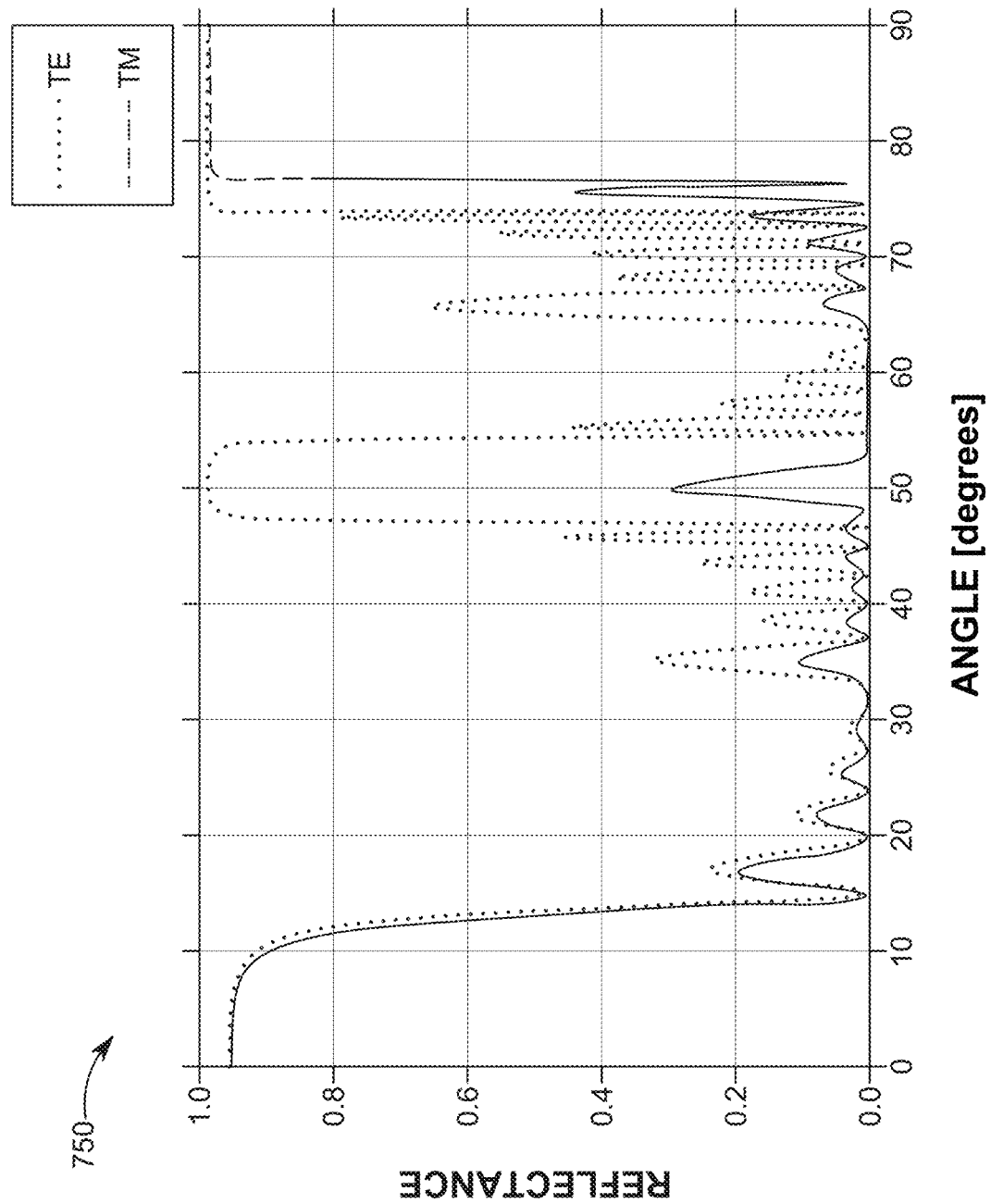
FIG. 7B depicts a graph illustrating simulation results for reflectance as a function of incident angle at a given wavelength for the dielectric mirror of FIG. 7A in accordance with embodiments of the present disclosure.

The fabrication of a structure with slab thickness of 0.1 micrometers may present some challenges due to the low thickness of the PMMA slab. However, for a particular set of wavelengths, there are several slab and air combinations that may satisfy a given reflectance value. FIG. 7A depicts a graph 700 illustrating reflectance as a function of wavelength for a six layer stack of 1260 nanometers PMMA slab and 620 nanometers in air. As shown, a reflectance of more than 0.9 may be achieved for a 500 nanometers wavelength. An error of +/−10 nanometers in the PMMA slab or air part of the structure produces a deviation (or error) from 500 nanometers. The overall difference in the PMMA slab and air of 20 nanometers produces a shift in the reflected wavelength of 9.8 nanometers. This error represents a shift in the frequency but not in the reflectance value. FIG. 7A also shows that there are high reflectance values (e.g. greater than 90%) for wavelengths close to 460 nanometers and 560 nanometers. These additional high reflectance wavelengths may be eliminated by adding a color filter on top of the dielectric mirror. FIG. 7B depicts a graph 750 illustrating CAMFR simulation results for the reflectance as a function of the angle of incidence for a wavelength of 500 nanometers with transverse-electric (TE) polarization and transverse-magnetic (TM) polarization. The reflectance decreases rapidly above 10°.

Figure 8A:
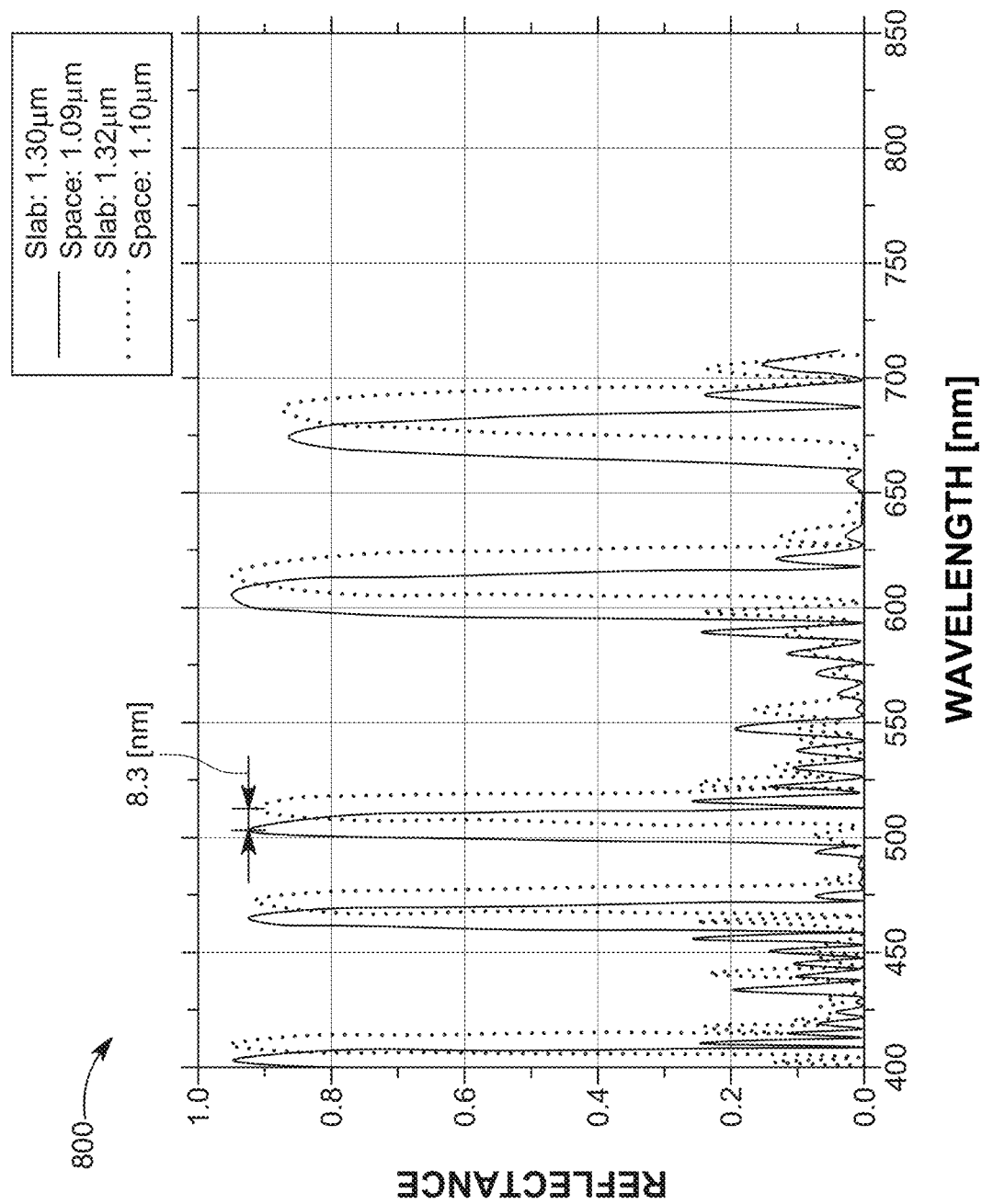
FIG. 8A depicts a graph illustrating simulation results for reflectance as a function of wavelength for another dielectric mirror having a six layer stack in accordance with embodiments of the present disclosure.
Figure 8B:
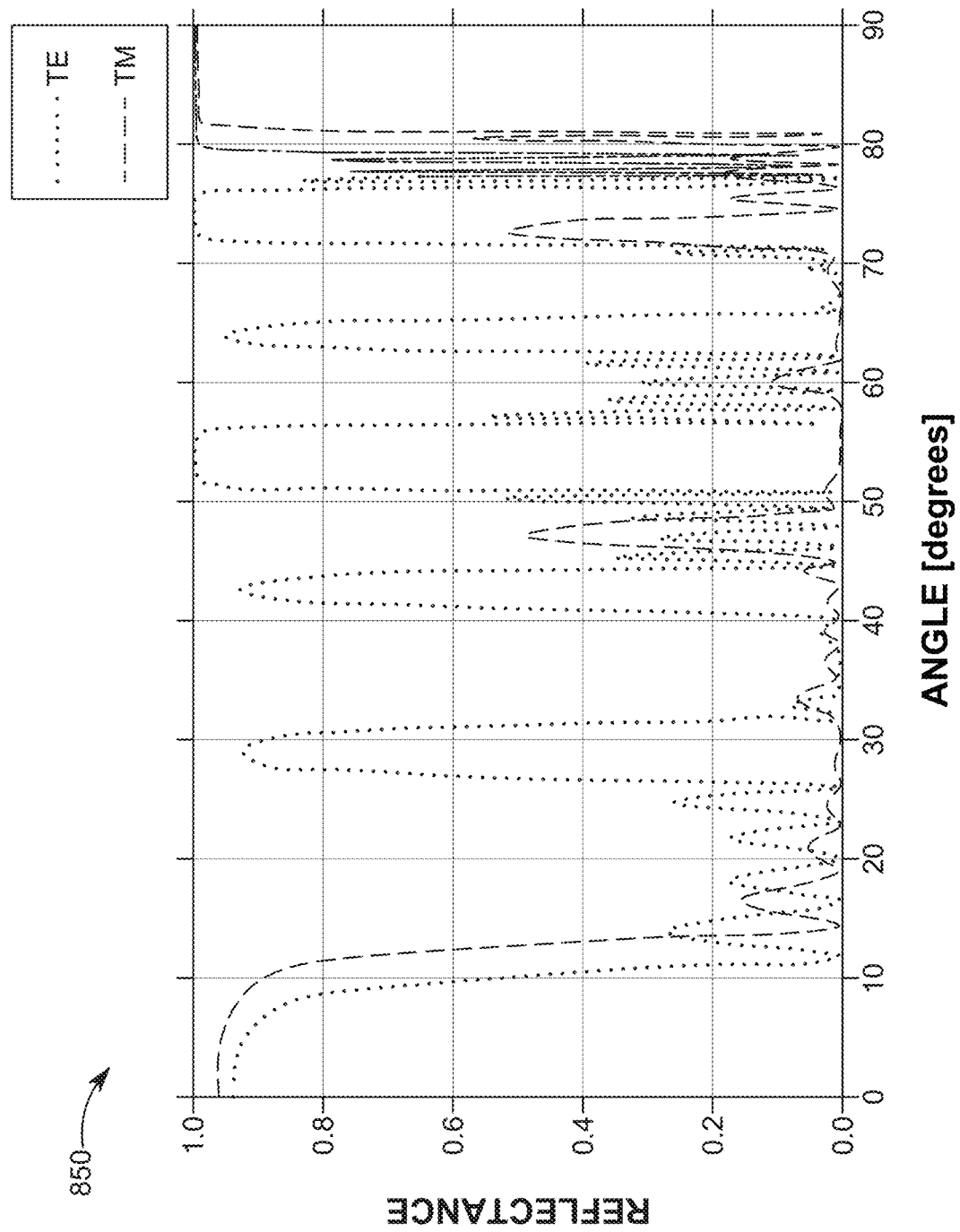
FIG. 8B depicts a graph illustrating simulation results for reflectance as a function of incident angle at a given wavelength for the dielectric mirror of FIG. 8A in accordance with embodiments of the present disclosure.

High reflectance values for a set of particular wavelengths may be achieved for several slab and air combination thicknesses. FIG. 8A depicts a graph 800 illustrating reflectance as a function of wavelength for a PMMA six layer stack of 1310 nanometers PMMA slab and 1100 nanometers in air. Reflectance values above 0.9 are shown at 410 nanometers, 470 nanometers, 510 nanometers and 610 nanometers. A difference (i.e. deviation) in the PMMA slab and air of 20 nanometers produces a shift in the reflected wavelength of 9.8 nanometers. Again the reflectance is not largely affected. FIG. 8B depicts a graph 850 illustrating CAMFR simulation results for the reflectance as a function of the angle of incidence for a wavelength of 510 nanometers with TE polarization and TM polarization. The variation with respect to the angle of incidence for each polarization is almost identical for angles below 10°. For wavelengths of 470 nanometers and 610 nanometers (not shown in FIG. B) the behavior is almost identical to FIG. 8B.

Figure 9:
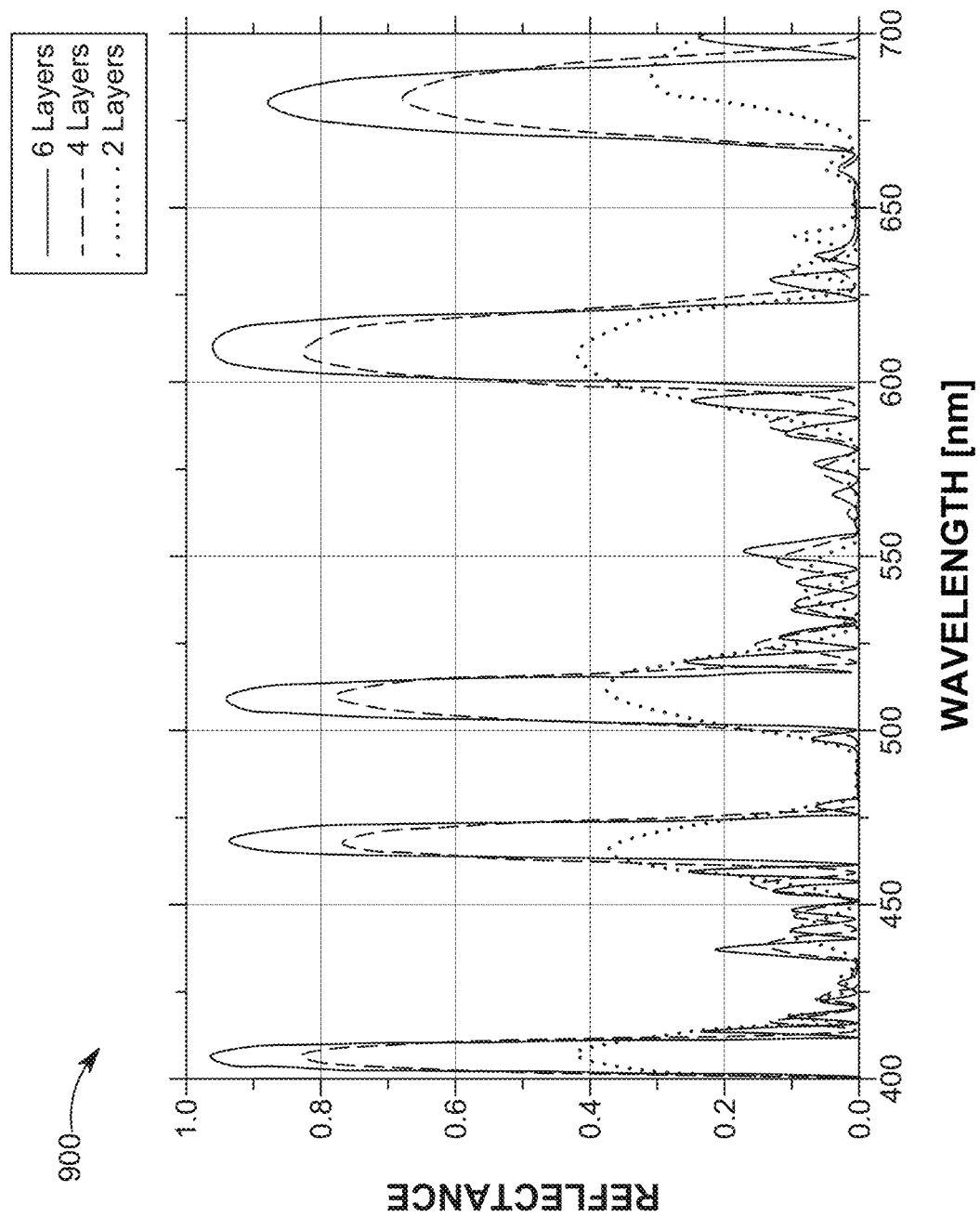
FIG. 9 depicts a graph illustrating simulation results for variation in reflectance versus wavelength with two-, four-, and six-layer stacks for a dielectric mirror in accordance with embodiments of the present disclosure.

FIG. 9 depicts a graph 900 illustrating variation in reflectance versus wavelength with two, four, and six layer stacks using the 1310 nanometers PMMA slab and 1100 nanometers in air. This structure is reflecting four wavelengths above 90% reflectance in the visual range for six layers of PMMA. As the number of layers is reduced the reflectance decreases. There is no significant variation in the wavelengths by reducing the number of layers. However, in this simulation the PMMA layers are removed not bended. Furthermore, the simulation does not include the deformation or thickness increased in the bottom layer by compacting them.

Figure 10:
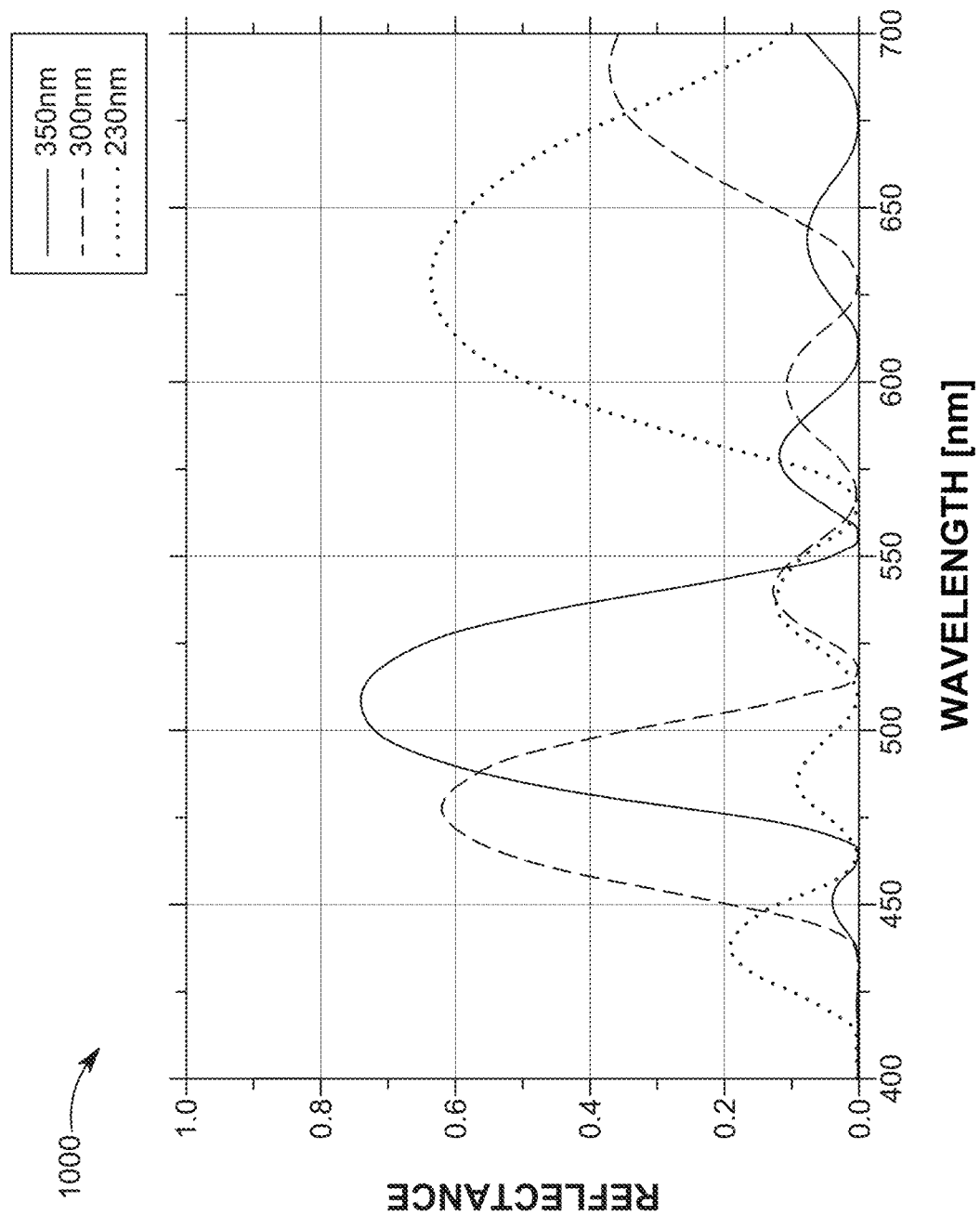
FIG. 10 depicts a graph illustrating simulation results for variation in reflectance versus wavelength of a PDMS four-layer stack for one slab thickness and three space thicknesses in accordance with embodiments of the present disclosure.

FIG. 10 depicts a graph 1000 illustrating simulation results for variation in reflectance versus wavelength of a PDMS four-layer stack for one slab thickness and three space thicknesses. In this simulation, the slab=290 nanometers, space 1=350 nanometers, space 2=300 nanometers, and space 3=230 nanometers. The dielectric mirror is constructed with one fixed slab but the space between all layers may be controlled independently. This structure may be tuned to reflect particular colors with an applied voltage without the need of a color filter.

Figure 11:
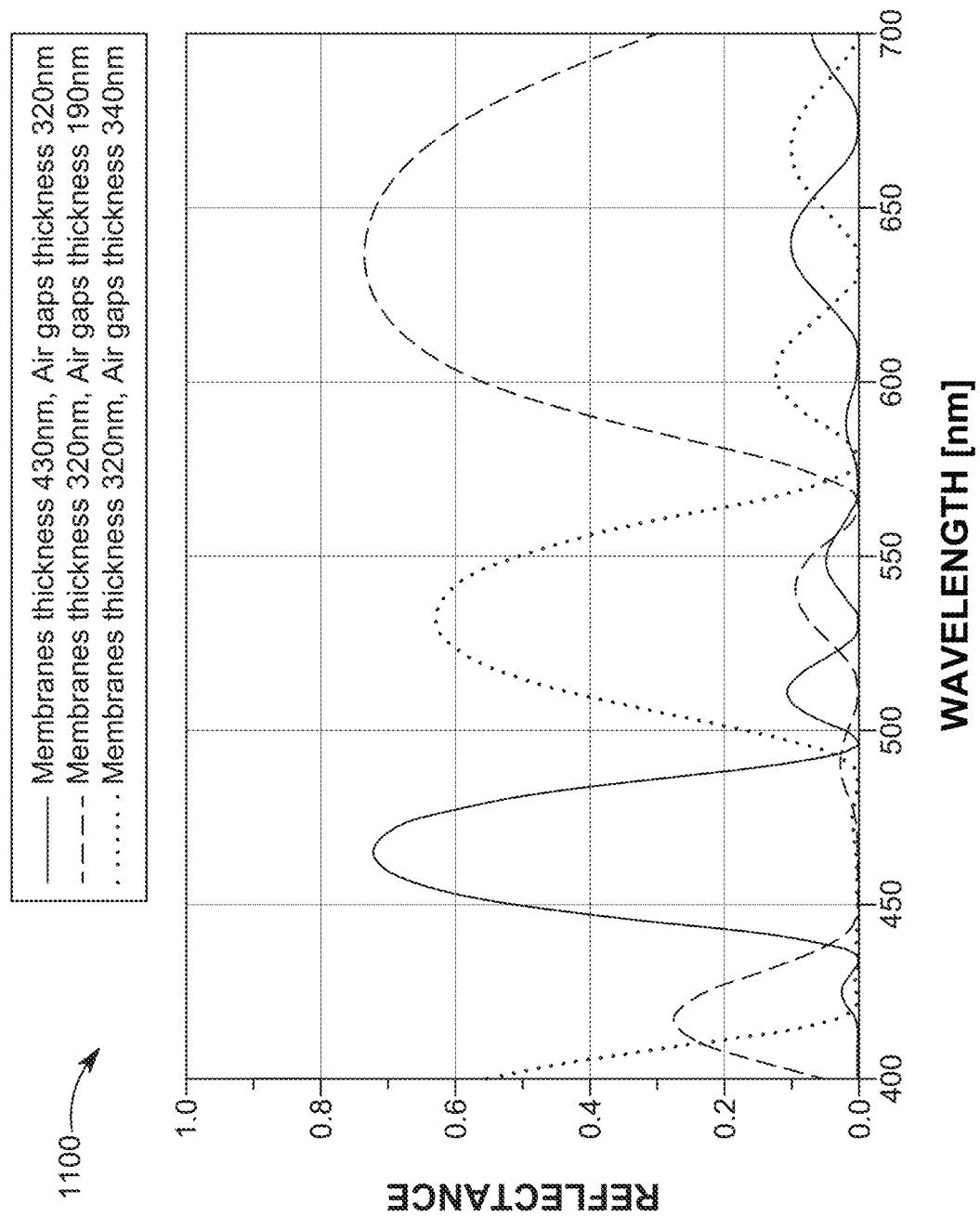
FIG. 11 depicts a graph illustrating simulation results for variation in reflectance versus wavelength of a PDMS four-layer stack for two structures using two different slabs thicknesses and two space thicknesses in accordance with embodiments of the present disclosure.

FIG. 11 depicts a graph 1100 illustrating simulation results for variation in reflectance versus wavelength of a PDMS four-layer stack for two structures using two different slabs thicknesses and two space thicknesses. For structure 1, the slab=430 nanometers with a space=320 nanometers. For structure 2, the slab=320 nanometers with a space 1=340 nanometers and a space 2=190 nanometers. If a device cannot be made to shift through the entire visual spectrum, two devices may be used instead. One set for a particular wavelength and another that shifts a portion of the spectrum by controlling the space between its layers.

For the case of a thin (e.g. less than 1000 nanometers) PDMS layer, narrow values of wavelengths may be achieved in the visual spectrum. A device may be constructed with one fixed slab where the space between all layers may be controlled independently. This structure may be tuned to reflect particular colors with an applied voltage without the need of a color filter. For example, in FIG. 10, it is shown that a dielectric mirror made of four PDMS layers of thickness 290 nanometers. If the interlayer space is 350 nanometers the maximum reflectivity of 0.74 occurs at 507 nanometers (green). If the interlayer space is 300 nanometers the maximum reflectivity of 0.61 occurs at 477 nanometers (blue). If the interlayer space is 230 nanometers the maximum reflectivity of 0.635 occurs at 628 nanometers (red).

Therefore for this dielectric mirror if the interlayer space may be controlled independently, the device may produce the three primary colors (green, blue, and red) without the use of a color filter. If a device cannot be made to shift through the entire visual spectrum, two devices may be used instead. One set for a particular wavelength (blue) and another that shifts a portion of the spectrum (green to red) by controlling the space between its layers. In FIG. 10 it is shown a similar case but for two independent devices that may be fabricated on opposite sides of the substrate or on different substrates and then bonded. One mirror has a layer thickness of 430 nanometers and a space thickness of 320 nanometers. It reaches a maximum reflectivity of 0.736 at 464 nanometers (blue). The second device has a layer thickness of 320 nanometers. At space thickness of 340 nanometers the maximum reflectivity is 0.64 at 531 nanometers (green). At space thickness of 190 nanometers the maximum reflectivity is 0.75 at 633 nanometers (red). Therefore, if it results too challenging to have a device that may be shift through the entire visual spectrum, then two devices may fulfill the task. Also, if the application needs only one color this may be achieved for these type of mirrors without shifting the reflection spectrum as shown in FIG. 10 and FIG. 11.

As disclosed earlier in this section, a particular set of wavelengths may have high reflectance for several values of the thickness of the slab and air stack.

TABLE 4 shows simulation results for device A with different thicknesses of a six-layer PMMA/air dielectric mirror. Disclosed is a reflectance of more than 90% for three wavelengths at the same time. This diverse set of thicknesses achieve reflectance above 0.9 for wavelengths of 470 nanometers, 510 nanometers and 610 nanometers for device A made of 6-layer stack of PMMA slab and air.

TABLE 5 shows simulation results for device B with different thicknesses of a six-layer PDMS dielectric mirror, with a reflectance of more than 80% for three wavelengths at the same time. This diverse set of thicknesses to achieve reflectance above 0.8 wavelength of value 470 nanometers, 510 nanometers and 610 nanometers for device B made of 6 layers stack of PDMS slab and air. PMMA has a refractive index at 500 nanometers of 1.49 while PDMS is 1.41 at the same wavelength. Since there is more variation between the refractive index of PMMA and the air, this device needs fewer layers to achieve a certain value of reflectance than PDMS.

TABLE 4

| | Reflectance | | | |
|---|---|---|---|---|
| λ = 470 nm | λ = 510 nm | λ = 610 nm | Slab(μm) | Air(μm) |
| 0.9244 | 0.9339 | 0.9561 | 0.74 | 1.95 |
| 0.9262 | 0.9355 | 0.9584 | 1.31 | 1.10 |
| 0.9127 | 0.9571 | 0.9253 | 1.78 | 0.40 |
| 0.9502 | 0.9570 | 0.9659 | 1.95 | 0.15 |

TABLE 5

| | Reflectance | | | |
|---|---|---|---|---|
| λ = 470 nm | λ = 510 nm | λ = 610 nm | Slab(μm) | Air(μm) |
| 0.8765 | 0.8697 | 0.9223 | 0.78 | 1.95 |
| 0.8217 | 0.8718 | 0.9246 | 1.21 | 1.35 |
| 0.8477 | 0.9095 | 0.9131 | 1.38 | 1.11 |
| 0.9292 | 0.8738 | 0.8148 | 1.57 | 0.84 |
| 0.8343 | 0.9224 | 0.8700 | 1.88 | 0.41 |

3.2 ANSYS®

In order to have more accurate simulation predictions of a deformed dielectric mirror a finite element analysis software ANSYS® workbench is used. This software allows a two-way coupled physics system between ANSYS® Maxwell® 3D and ANSYS® Static Structural. ANSYS® Maxwell® 3D may calculate the electrostatic force density of a structure when a potential difference is applied. The results are transferred to ANSYS® Static Structural that calculates the deformation of the structure due to those forces, which transfers the deformed mesh to ANSYS® Maxwell® 3D to recalculate the electrostatic force density. This is an iterative process that continues until the difference in displacement of the current iteration is less than a certain percentage of the previous one. For example, in the simulations presented here the last displacement difference was 0.91%.

In order to set the percentage difference of the displacement between iterations before ending the simulation, an estimate may be made on the variation in the electrostatic forces between iterations. The electrostatic force between a fixed capacitor with parallel plates is given by the following equation:

$$F = \epsilon_0 \epsilon_r A \frac{V^2}{2d^2} \quad \text{(Eqn. 15)}$$

In this case, it is assumed that the capacitor is completely filled with PMMA (which has relative permittivity ($E_r$) of 2.6 to the vacuum permittivity (co) of 8.85e-12F/m). The maximum distance (d) between the plates is 5.1 microns. The area (A) is 30 microns by 100 microns=3000 microns and the applied voltage (V) is 30, the electrostatic force is 1.19 micro-newtons (μN), if the displacement is 0.91% then the current distance would be 5.054 microns giving a total force of 1.21 μN. The difference between the forces is less than 2%. Therefore, further iterations should not change the displacement in a significant way. Also, if the variation in displacement were 5% difference in the forces would be around 10%. Moreover, this is assuming that the entire plate moves down while in reality it is being deformed more at the center. So, the total difference in the forces should be less than the ones calculated here.

The switching time is simulated in ANSYS® transient Structural, with a mirror 100 microns long, 30 microns wide and 5.1 microns thick, and capacitance, assuming completely filled with PMMA, is 0.015 picofarads (pF). If the resistance is 1.0MΩ, the time constant of the device would be 14.6 nanoseconds and the cutoff frequency 10.9 megahertz (MHz). Making the system dominated by the mechanical response. To check this, a step force capable of completely compress the device is set. Then, the time between its release and the oscillation of the structure is around 1.0 nanometers of the 0 force position is measured. The difference in time is 0.178 milliseconds and the frequency 5.63 kilohertz (kHz). As, it may be seen this device would have the speed to reproduce video. The human eye is capable of seeing 30 frames per second (FPS), which means that each frame is set at 33 milliseconds. If a device has a response time below 33 milliseconds it should be capable of reproducing video. As an example, most computer monitors use a refresh rate of 60 Hertz (16.6 milliseconds). Using the same approach for a PDMS structure the difference in time was about 6 milliseconds.

Figure 12:
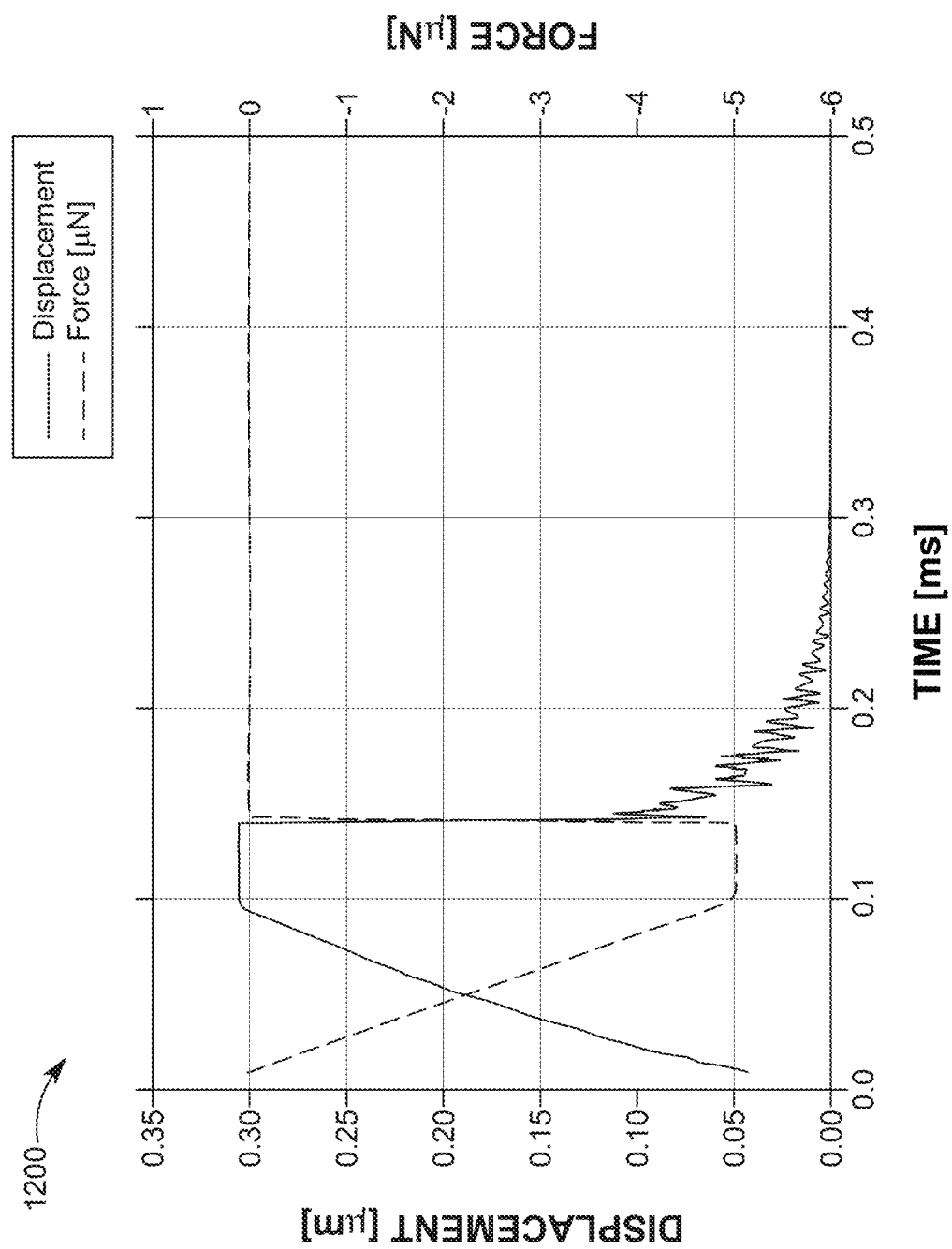
FIG. 12 depicts a graph illustrating a mechanical transient response of the dielectric mirror under a step force function in accordance with embodiments of the present disclosure.

FIG. 12 depicts a graph 1200 illustrating a mechanical transient response of the dielectric mirror under a step force function. Here a force capable of compressing the structure completely is applied and removed as a step function. Then, from the chart, the difference between the release of the force and the structure reaching around 1.0 nanometers of displacement from the rest position may be measured giving the actuation time.

3.3 SYNOPSYS®

Figure 13:
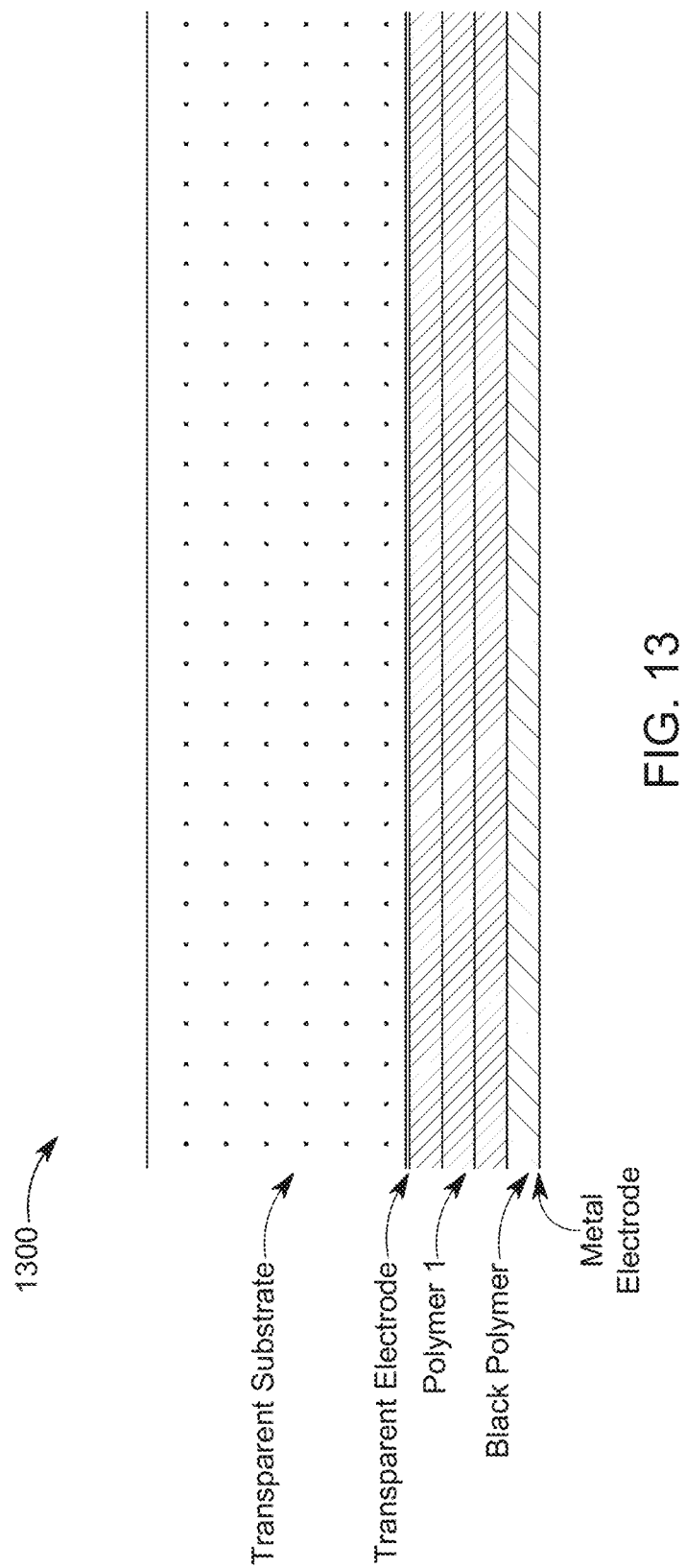
FIG. 13 depicts a diagram illustrating a mirror cross section used in the simulations in accordance with embodiments of the present disclosure.

FIG. 13 depicts a diagram 1300 illustrating a mirror cross section used in the Synopsys® simulations (same as the structure deformed in ANSYS®). To represent glass (which is composed of 70% $SiO_2$) a transparent electrode and an insulator layer are also added to the structure. After simulating the deformation of the mirror in ANSYS®, the file is exported as an STL (STereoLithography) into Blender (professional free and open-source 3D computer graphics software). By using Blender and a Python script, a 2D cross section of the middle part of the mirror is extracted, then, a polygon definition of the structurer is written in a text file with the commands used by Synopsys® Sentaurus structural editor. With these commands the mirror is created in Synopsys® which shows the cross section of the structure produce by this method deformed by a 35 volt potential. After that, the mirror is divided in a mesh and its reflectance simulated in Sentaurus's device for a plane wave incident at 0° angle. The method to calculate the optical response used is Transfer Matrix Method (TMM). This process is repeated for voltage values of 0, 10, 15, 20 and 35 volts. The result of this simulation is depicted in FIG. 13. The simulation for 0 Voltage was also done in CAMFR software giving the same result.

The simulated structure consists from bottom up, starting from the aluminum layer of 100 nanometers, then a layer of Polymer2 mixed with carbon black. In this case the refractive index of this mixed polymer has to be measured experimentally. Here, it was chosen to set the refractive index as Polymer1 refractive index plus an extinction coefficient of 0.07i. that will absorb the incident light. Pure carbon black has a complex refractive index of 1.84-0.85i at 650 nanometers. There are three layers of Polymer1 with air layers between them. The last layer of Polymer1 is in contact with a transparent electrode layer of 150 nanometers. The final layer is a 10 microns thick layer of silicon dioxide ($SiO_2$) representing glass (i.e. glass is more than 70% $SiO_2$).

Figure 14:
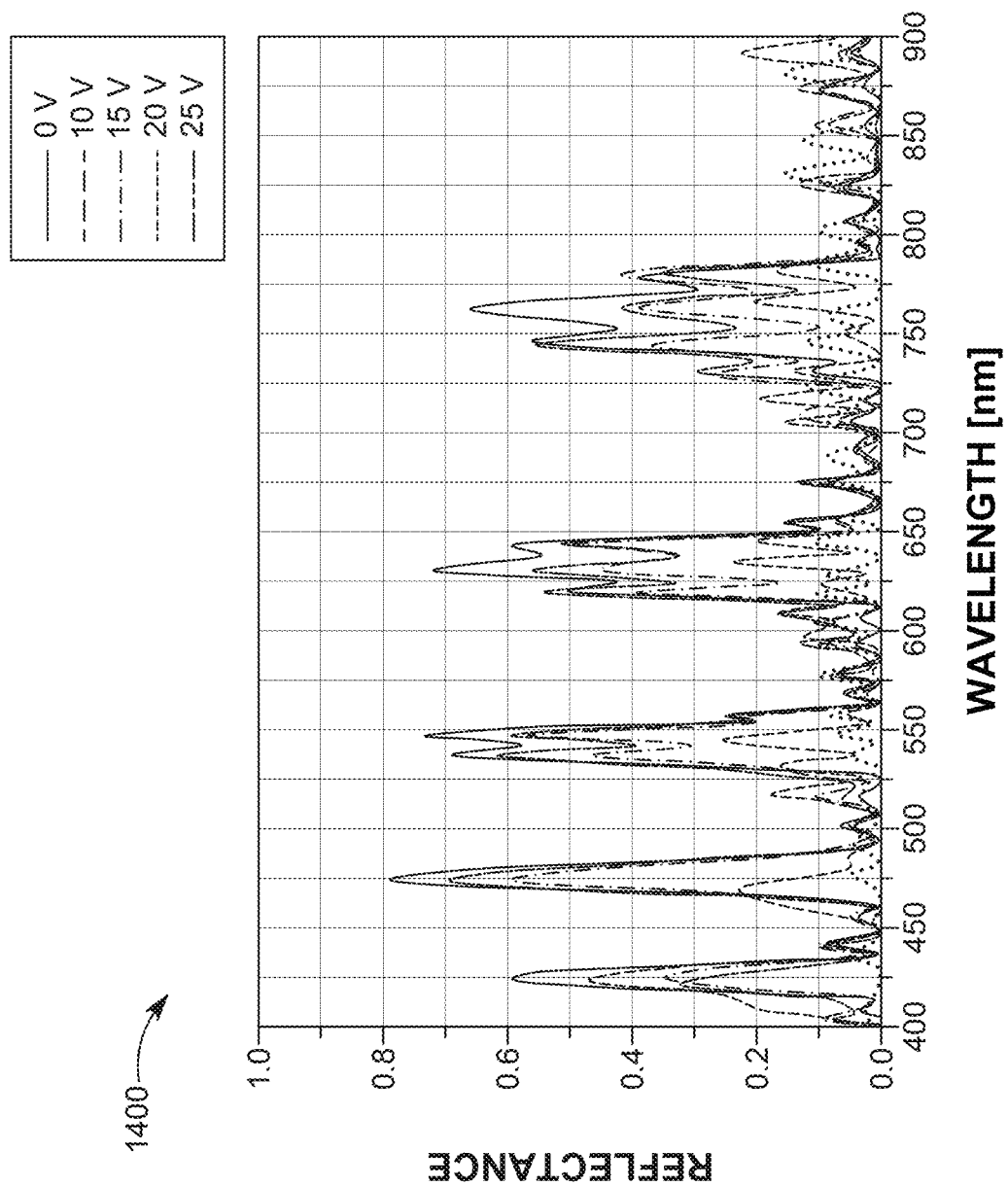
FIG. 14 depicts a graph illustrating spectral simulation results with the deforming of a dielectric mirror at different voltages in accordance with embodiments of the present disclosure.

FIG. 14 depicts a graph 1400 illustrating spectral simulation results with Synopsys® of the deforming mirror at different voltages. The reflectance may be controlled as a function of the applied voltage, that is, the levels of gray are continuously dependent on the applied potential difference. After searching a structure with CAMFR this is the final results that would reflect particular wavelengths in the visual spectrum. A structure was created and deformed in ANSYS® for five applied voltages. For each case, the cross section was taken into Blender and the commands to re-create the structure in Synopsys® were written. It should be noticed that even with three layers of Polymer1 and one absorbing layer the reflectance is above 70% for wavelengths 476 nanometers, 547 nanometers and 629 nanometers for 0 Volts. The reflectance is below 11% for the visual spectrum at 35 Volts. In order to fabricate a color pixel, three distinctive devices would need a color filter on top to isolate the particular wavelengths for red, green and blue.

4.0 Fabrication Results

4.1 Structures Fabrication Results

Figure 15:
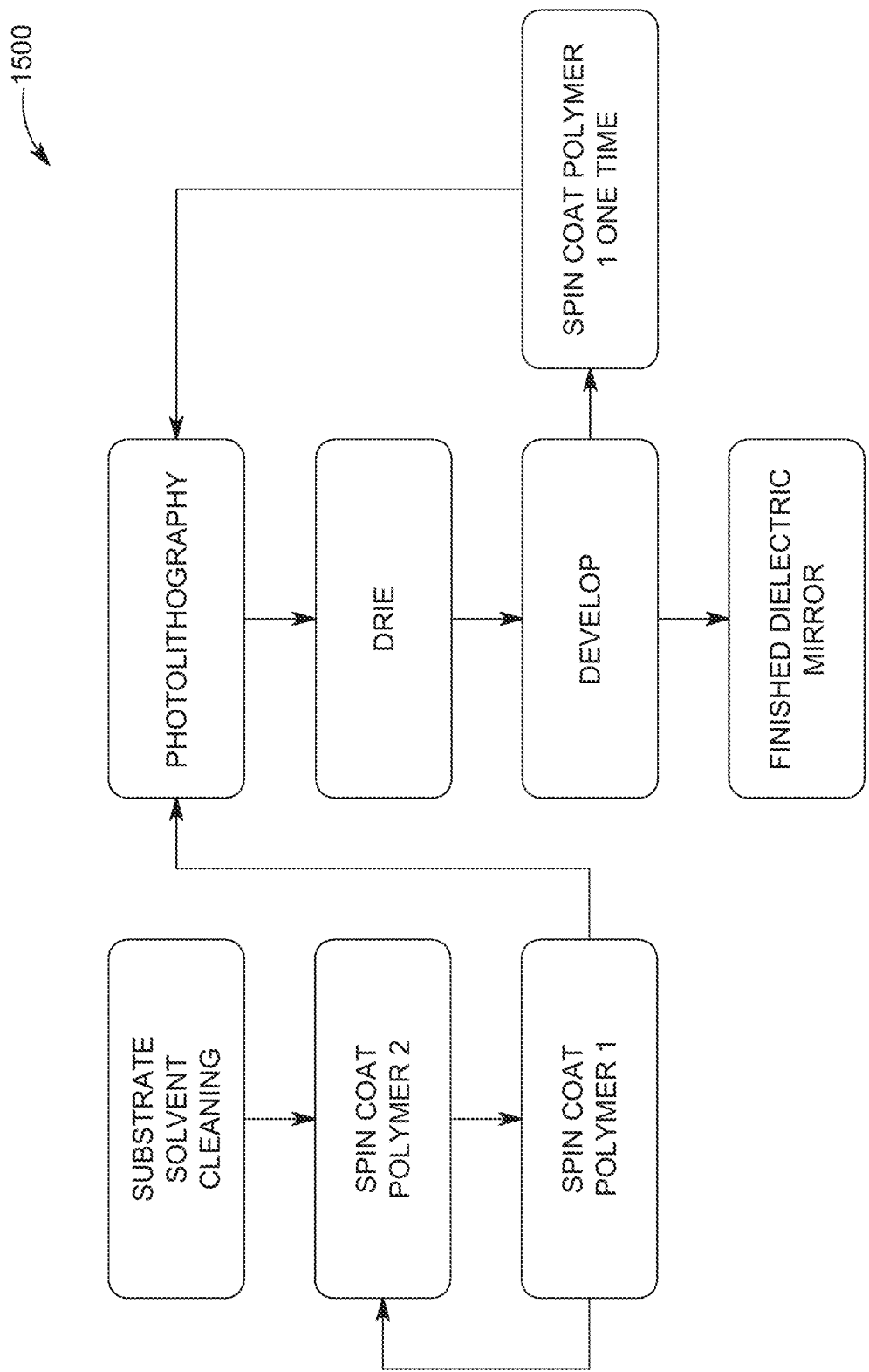
FIG. 15 depicts a flowchart illustrating a dielectric mirror process sequence in accordance with embodiments of the present disclosure.

The first fabrication method without the electrodes or carbon black was used to fabricate a dielectric mirror. The fabrication flow was conducted in the Nanofabrication Facility (NNF) at North Carolina State University. FIG. 15 depicts a flowchart 1500 illustrating the fabrication sequence. First, the silicon substrate is solvent cleaned and dried. Then, layers of sacrificial resist and Polymer1 are spin coated and baked. This may be repeated until the desired number of layers is reached. The substrate is then patterned with photolithography and trenches are formed with DRIE. After developing the resist, one layer of Polymer1 is spin coated to form the pillars supporting the structure. Finally, the photolithographic and DRIE process is repeated to release the structure.

Figure 16:
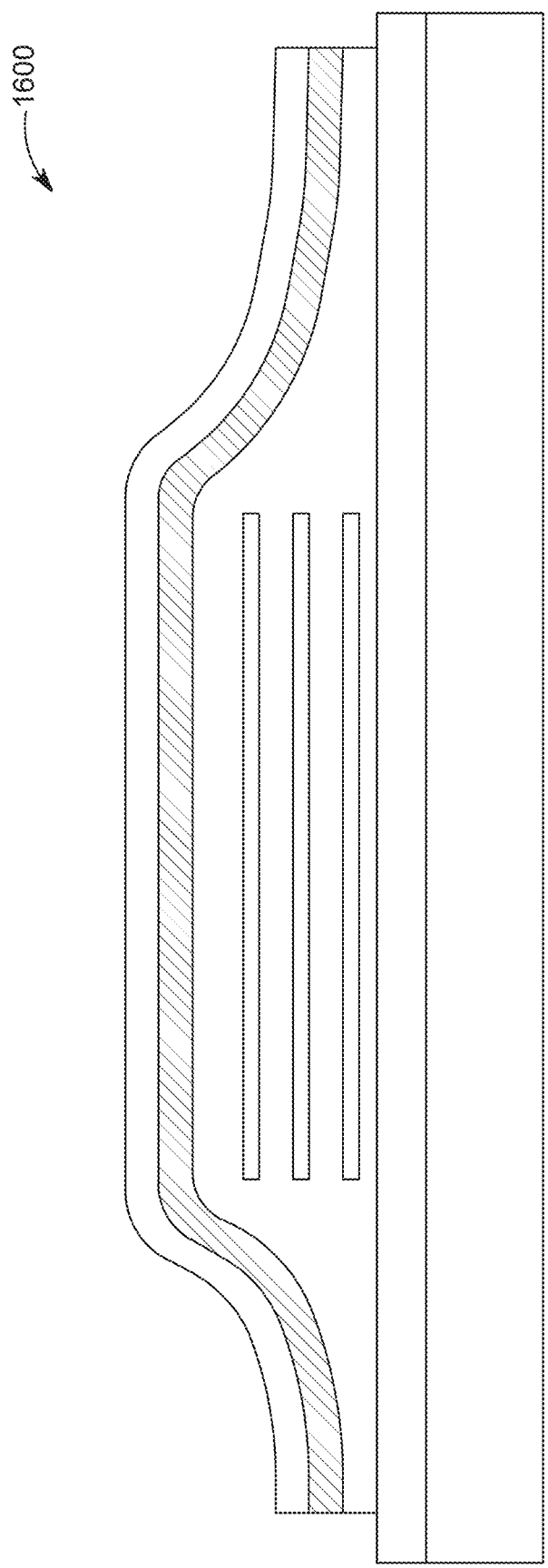
FIG. 16 depicts a diagram illustrating a 3-pair polymer-based dielectric mirror.

FIG. 16 depicts a diagram 1600 illustrating a micro photograph from a scanning electron microscope (SEM) of a 3-pair Polymer-based Dielectric mirror. A top layer has a thickness of 1.67±0.1 micrometers, a first air cavity has a thickness of 1.0±0.1 micrometers, a second layer has a thickness of 1.24±0.1 micrometers, and a second air cavity has a thickness of 1.0±0.1 micrometers. In order to produce the micro photograph an E-beam Raith 150 was used in imaging mode.

4.2 Optical Characterization

The spectral response of the bilayer of polymer-based dielectric mirror was characterized with a spectrometer Ocean Optics USB4000. First the source was measured by placing the spectrometer in the sample position. With the wafer in the sample position, the spectrometer on the camera position of the microscope, the measurement was taken for one of the mirrors. The integration time had to be modified to utilize the full dynamic range of the spectrometer, and by using CAMFR the estimated spectral response was simulated. The spectrum displayed in FIG. 17 shows that the wavelength response has good alignments of peaks as predicted by CAMFR.

Figure 17:
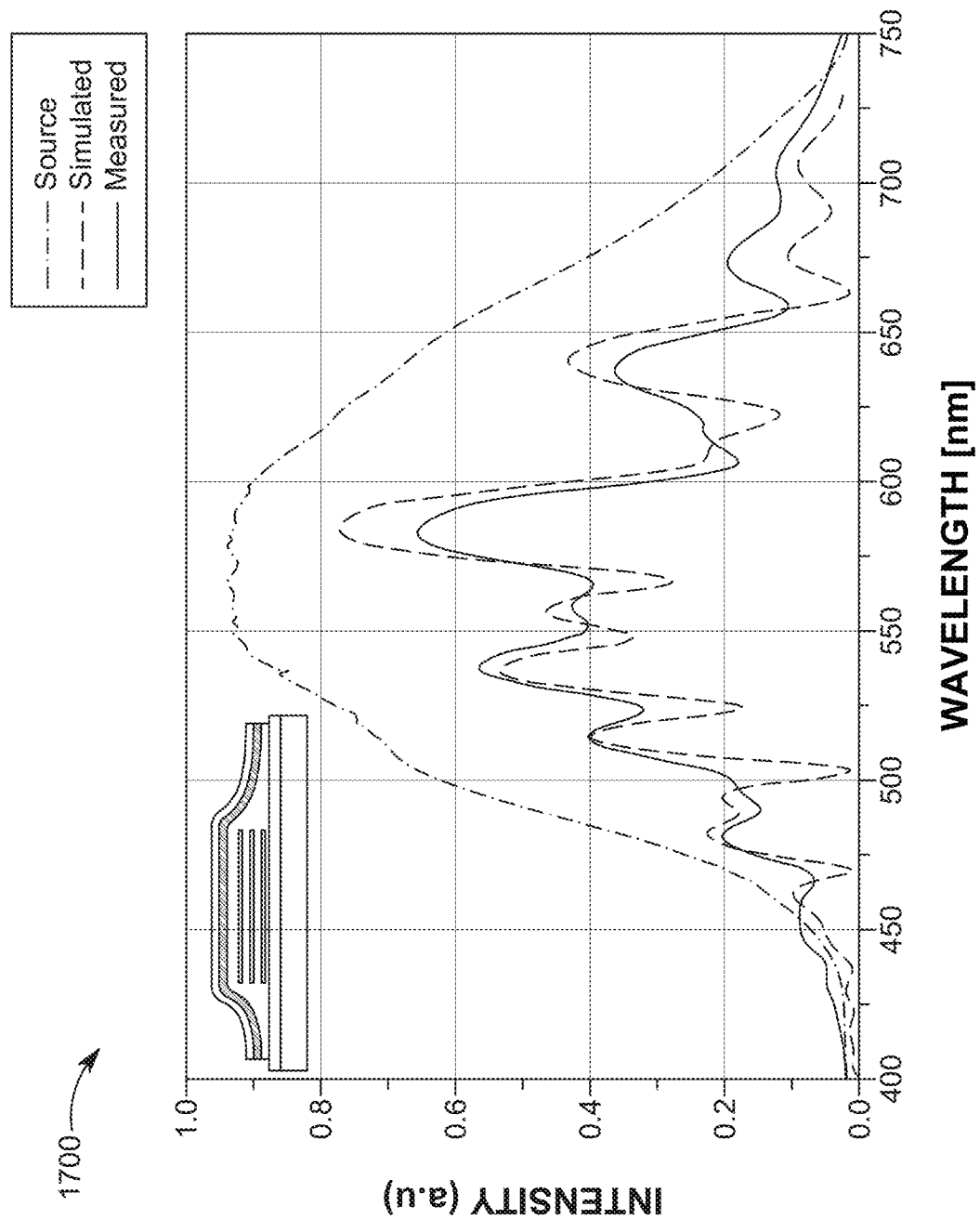
FIG. 17 depicts a graph illustrating a comparison between the simulated and measured results from a fabricated polymer-based dielectric mirror. in accordance with embodiments of the present disclosure. An open source computer code was adapted for the calculations.

FIG. 17 depicts a graph 1700 illustrating a comparison between CAMFR simulated and measured results from a fabricated polymer-based dielectric mirror. The results of the CAMFR simulation for a dielectric mirror with a top polymer layer of 1650 nanometers, a top cavity of 1060 nanometers, a middle PMMA layer of 1280 nanometers, and a bottom cavity of 1000 nanometers. All peak wavelengths align as predicted.

5.0 Manufacturing Processes

FIG. 18A through FIG. 18F depict multiple stages of a dielectric mirror stack during a manufacturing process for forming a reflective element.

Figure 18A:
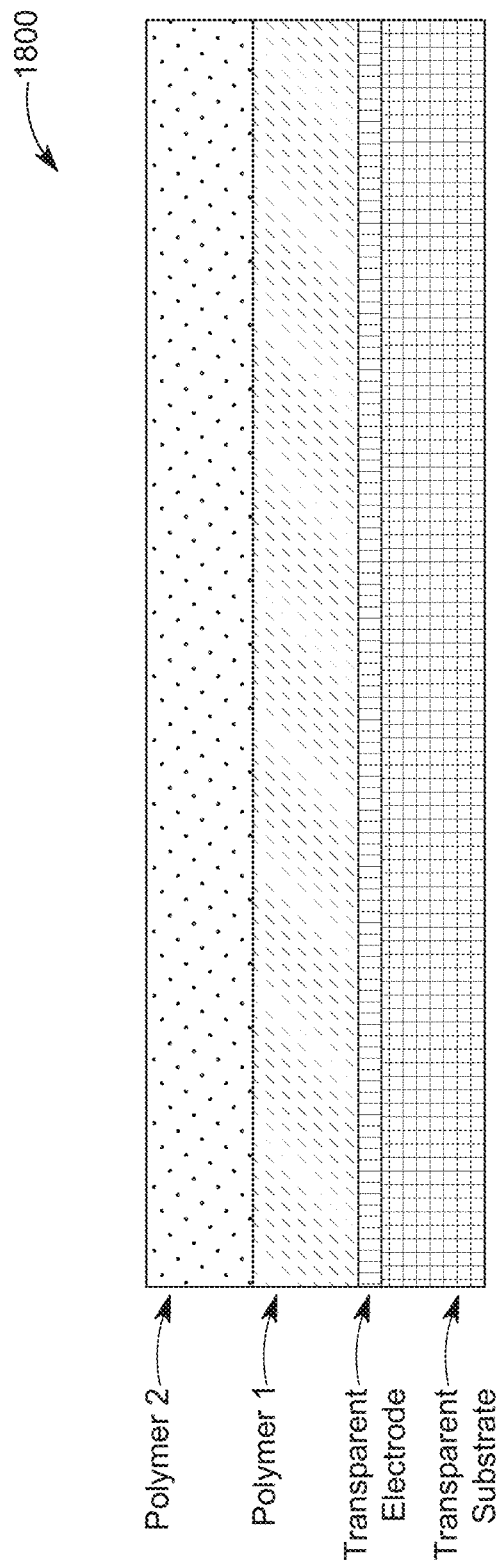
FIG. 18A through FIG. 18F depict diagrams illustrating multiple stages of a dielectric mirror stack during a fabrication process for forming a reflective element in accordance with embodiments of the present disclosure.

FIG. 18A depicts a diagram 1800 illustrating a dielectric mirror stack on a glass with a transparent electrode. Layers of Polymer1/Polymer2 are spin coated and baked sequentially.

Figure 18B:
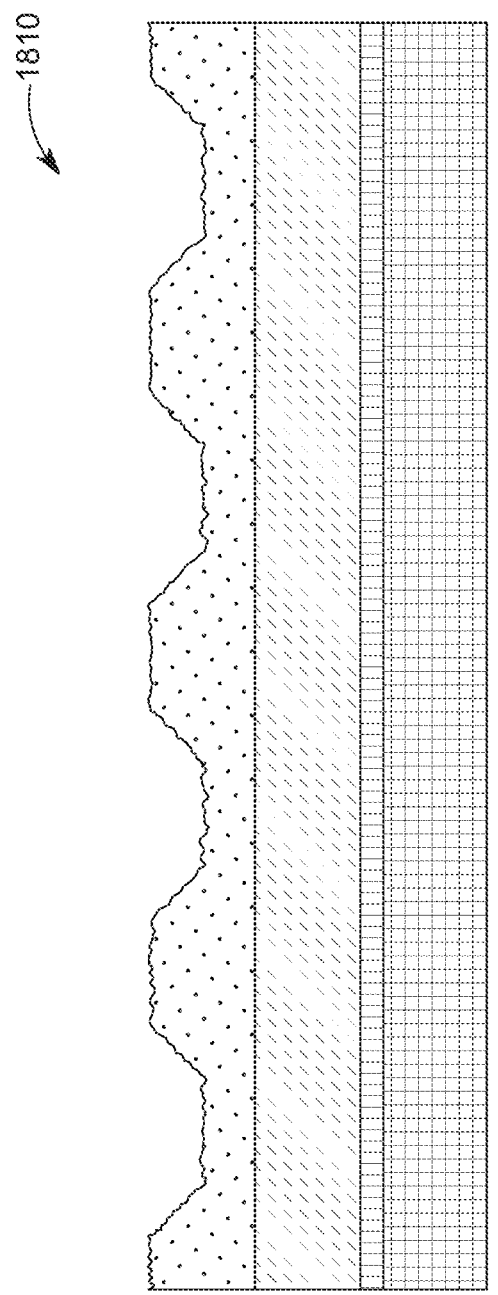

Polymer2 is patterned by lithography and dry etching (e.g. using reactive ion etching (RIE)) techniques, and may be performed in order to increase surface roughness and/or add texture to the layer. With this process, stoppers may be added so when the structure is released the membranes cannot get closer than a minimum distance when they are compressed. This is depicted in FIG. 18B.

Figure 18C:
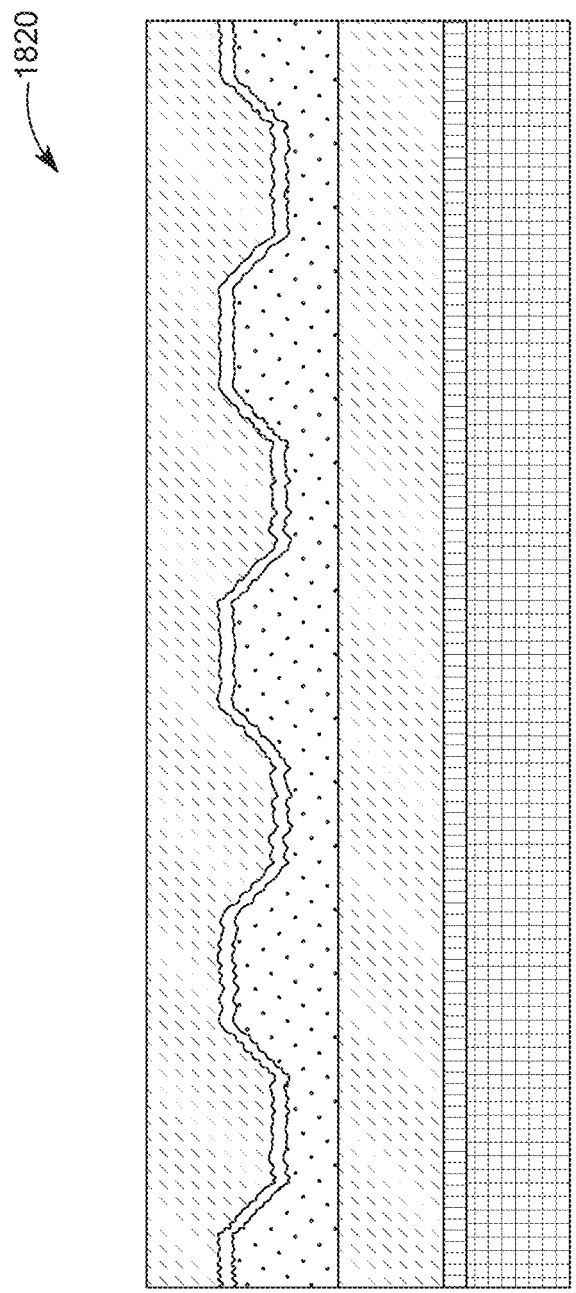

A fluoropolymer is deposited on top Polymer2 and then Polymer1 is spin coated on top of the patterned Polymer2 forming a second membrane, depicted in FIG. 18C.

Figure 18D:
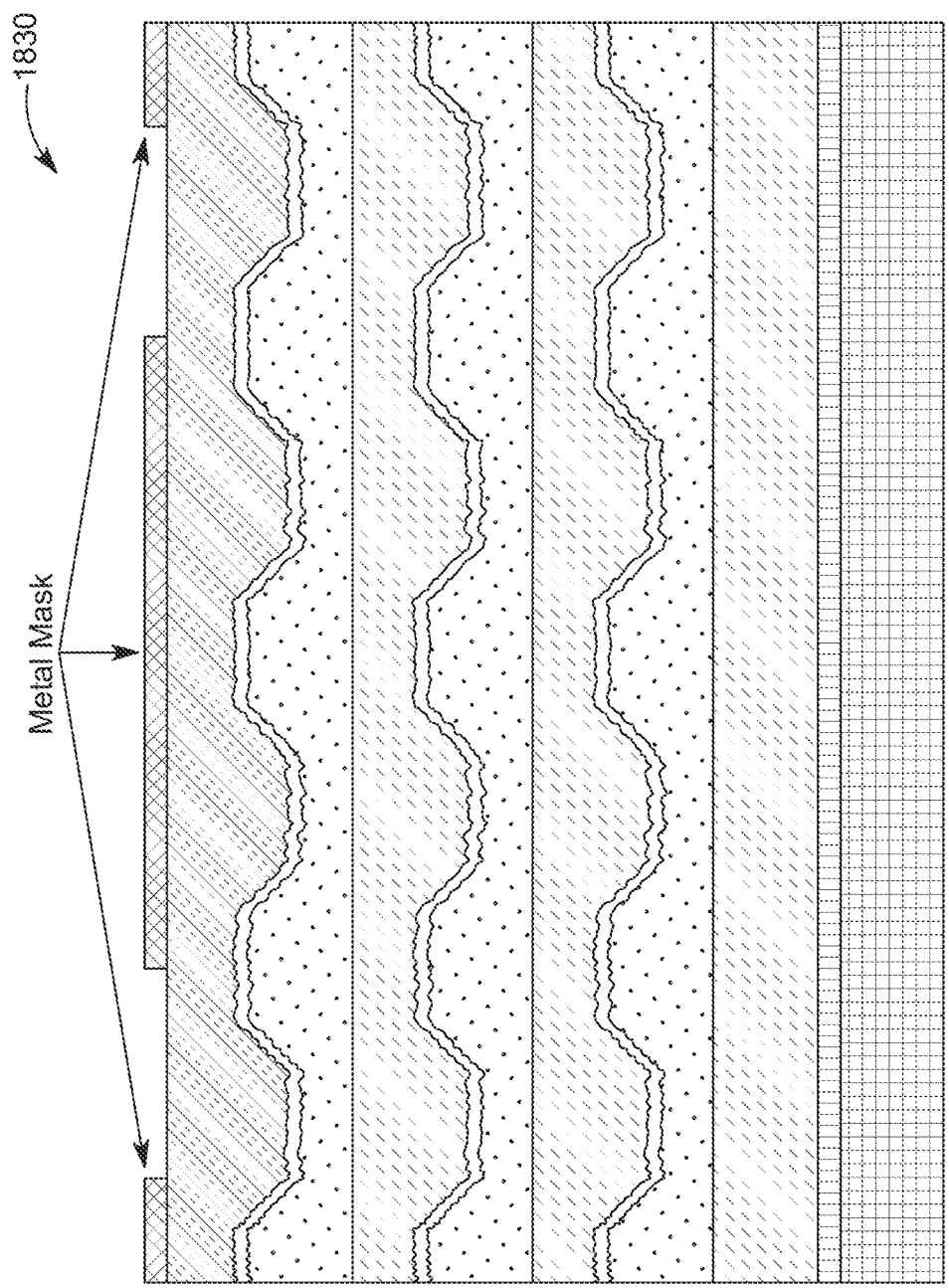

The previous processes for fabricating a layer is repeated until the desired number of layers is reached. The final layer is a black polymer. With photolithography a metal mask is deposited and patterned. This is depicted in FIG. 18D.

Figure 18E:
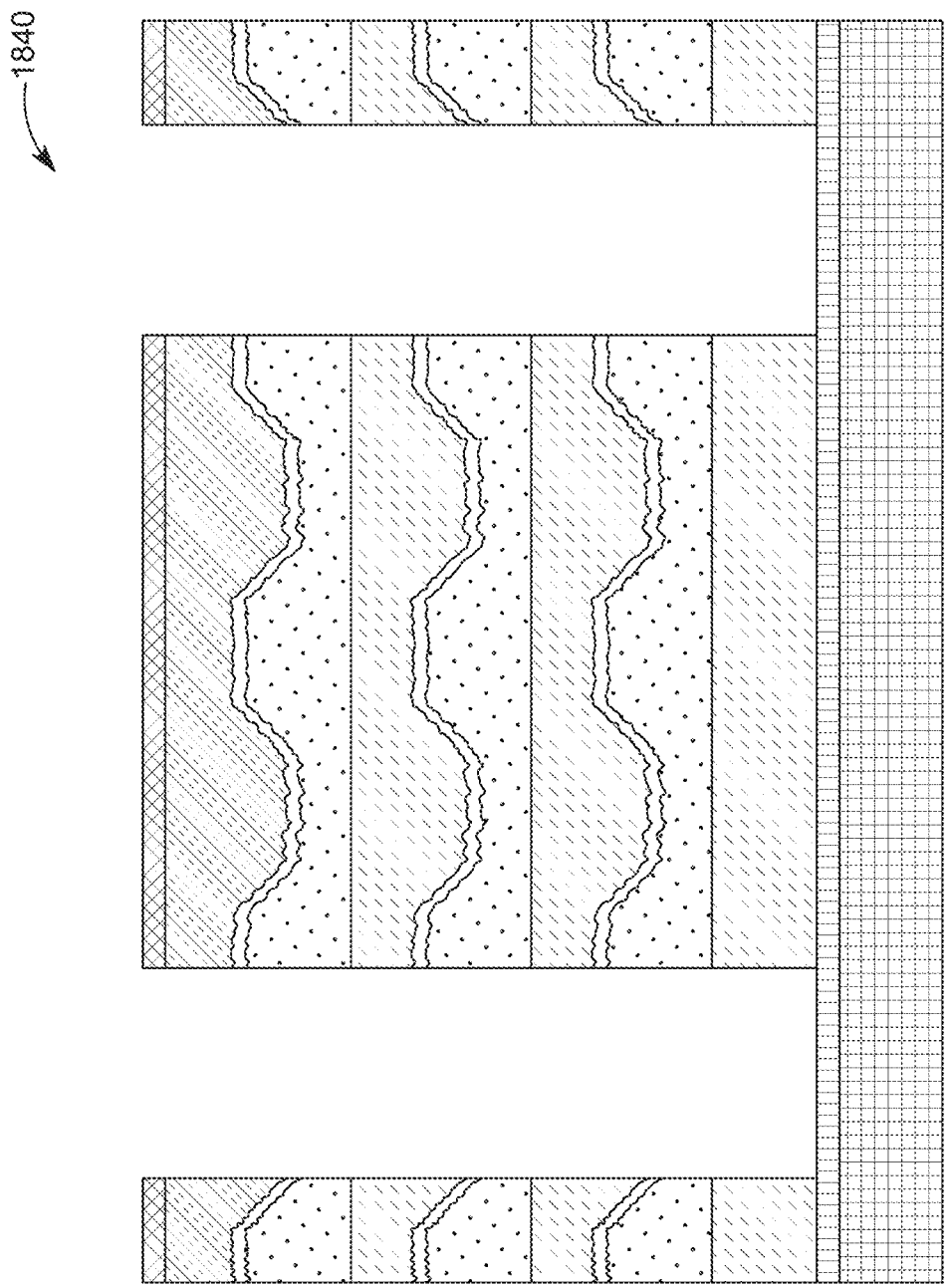

With dry chemical etching (e.g. using reactive ion etching) trenches are formed. This is depicted in FIG. 18E.

Figure 18F:
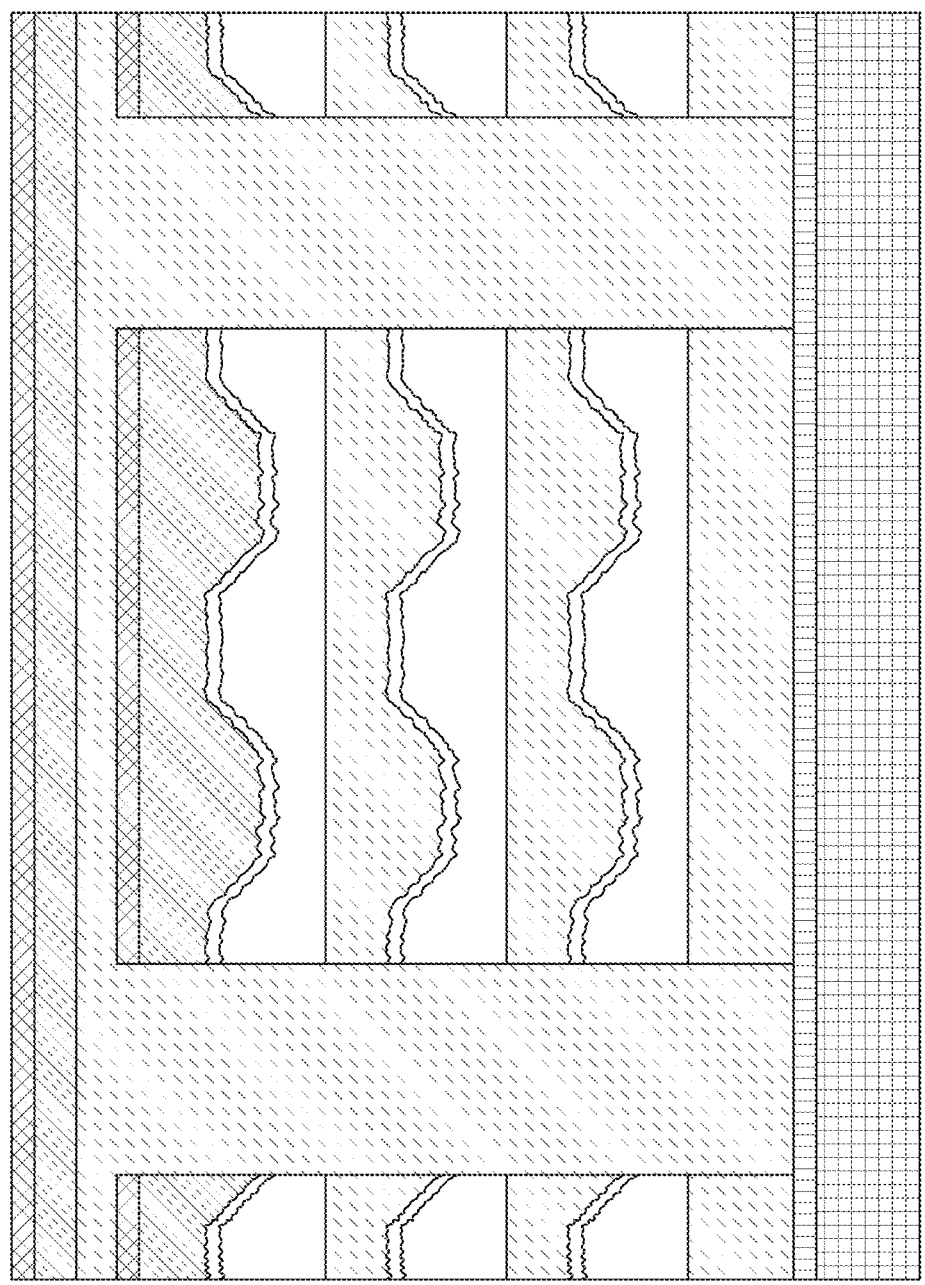

Polymer1 is spin coated forming the pillars that support the structure. A black polymer is spin coated on top and by using lithography and metal deposition, an electrode is formed on top. With lithography and dry chemical etching the device is patterned and all layers are exposed. Then, Polymer2 is removed with a solvent, releasing the membranes. This is depicted in FIG. 18F.

Figure 19:
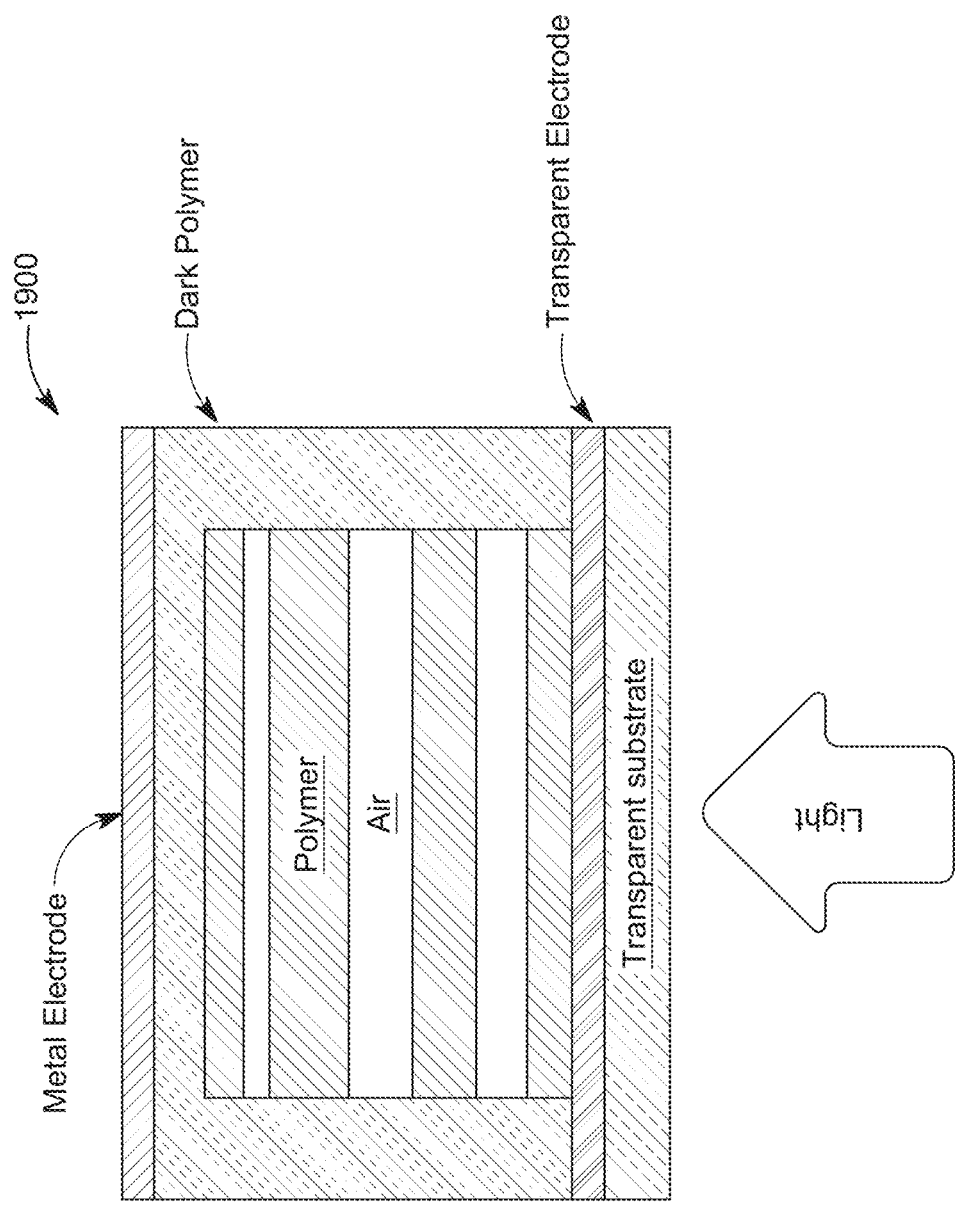
FIG. 19 depicts a diagram illustrating the finished device of FIG. 18A through FIG. 18F in accordance with embodiments of the present disclosure.

FIG. 19 depicts diagram 1900 illustrating the finished device of FIG. 18A through FIG. 18F. Light is incident from the transparent substrate. The reflectance of the incident light is controlled by sequentially compressing the membranes from the metal electrode to the substrate.

6.0 Actuated Dielectric Mirrors for Transparent or Low Power Displays

Figure 20:
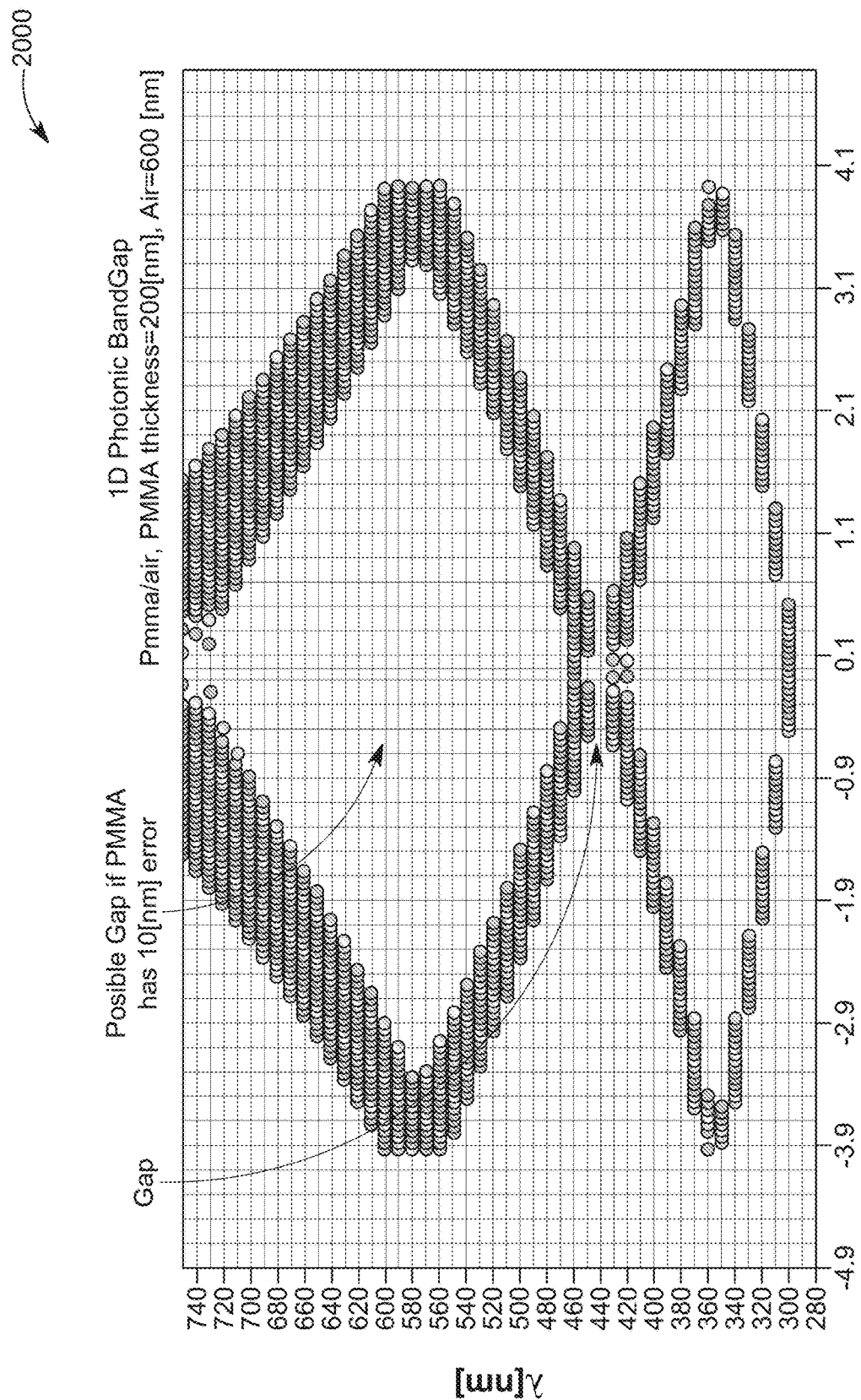
FIG. 20 depicts a graph illustrating a bandgap that is formed by a stack of a 200 nanometers of Plexiglas® and 600 nanometers of air in accordance with embodiments of the present disclosure.

If a stack of Polymer1(Plexiglas®) with air in between is fabricated, a 1D dielectric mirror is formed. This mirror may be tuned to reflect a particular wavelength. FIG. 20 depicts a graph 2000 illustrating a bandgap that is formed by a stack of 200 nanometers of Plexiglas® and 600 nanometers of air. The middle of the bandgap is approximately 450 nanometers (blue). This CAMFR simulation is for an infinite stack. Other bandgaps may be created by adjusting the thickness of Plexiglas® and air that may be formed by spin coating 950 PMMA (thickness from 200-450 nanometers) and S1805 photoresist from Microchem (thickness 450-600 nanometers).

Simulations show that if 190 nanometers thick PMMA is used there is a gap that starts to show up at 580 nanometers. However the reflection coefficient is around 30% for a ten-layer stack of PMMA/air while in the 20%'s for a six-layer one.

TABLE 6 shows reflection coefficients versus wavelength versus number of layers for a 0° angle of incidence using a CAMFR simulation for a finite crystal. If the number of layers is reduced the reflection coefficient of the mirror is also reduced. Therefore, by applying an electrostatic force to the top and/or bottom layer, the layers will be compressed and they will stick together. By reducing the number of layers, the reflection coefficient of the mirror may be controlled. Six layers are enough according to the simulation to achieve a 97% reflection. As the total number of layers is increased in a design, the electrostatic force required for compression is also increased. This relationship becomes an important trade-off in optimizing the design.

TABLE 6

| Reflection coefficient by # Number of layers | | | | Wavelength |
|---|---|---|---|---|
| 8 | 6 | 4 | 2 | microns |
| 0.05 | 0.50 | 0.03 | 0.50 | 0.38 |
| 0.03 | 0.32 | 0.41 | 0.30 | 0.39 |
| 0.00 | 0.00 | 0.00 | 0.00 | 0.4 |
| 0.10 | 0.34 | 0.40 | 0.28 | 0.41 |
| 0.26 | 0.45 | 0.14 | 0.47 | 0.42 |
| 0.51 | 0.17 | 0.61 | 0.57 | 0.43 |
| 0.97 | 0.94 | 0.85 | 0.61 | 0.44 |
| 0.99 | 0.97 | 0.89 | 0.61 | 0.45 |
| 0.98 | 0.94 | 0.84 | 0.57 | 0.46 |
| 0.02 | 0.50 | 0.64 | 0.51 | 0.47 |
| 0.28 | 0.37 | 0.15 | 0.41 | 0.48 |
| 0.31 | 0.16 | 0.21 | 0.29 | 0.49 |
| 0.06 | 0.21 | 0.25 | 0.17 | 0.5 |
| 0.19 | 0.15 | 0.11 | 0.06 | 0.51 |
| 0.13 | 0.10 | 0.07 | 0.03 | 0.52 |
| 0.12 | 0.17 | 0.16 | 0.10 | 0.53 |
| 0.12 | 0.02 | 0.15 | 0.14 | 0.54 |
| 0.10 | 0.13 | 0.05 | 0.15 | 0.55 |
| 0.10 | 0.12 | 0.06 | 0.14 | 0.56 |
| 0.11 | 0.02 | 0.13 | 0.12 | 0.57 |
| 0.07 | 0.13 | 0.13 | 0.08 | 0.58 |
| 0.13 | 0.11 | 0.08 | 0.04 | 0.59 |
| 0.00 | 0.00 | 0.00 | 0.00 | 0.6 |
| 0.13 | 0.11 | 0.08 | 0.04 | 0.61 |
| 0.08 | 0.13 | 0.13 | 0.08 | 0.62 |
| 0.07 | 0.05 | 0.13 | 0.11 | 0.63 |
| 0.14 | 0.06 | 0.10 | 0.13 | 0.64 |
| 0.05 | 0.14 | 0.03 | 0.15 | 0.65 |
| 0.10 | 0.13 | 0.05 | 0.15 | 0.66 |
| 0.15 | 0.04 | 0.12 | 0.14 | 0.67 |
| 0.06 | 0.08 | 0.16 | 0.13 | 0.68 |
| 0.10 | 0.16 | 0.16 | 0.10 | 0.69 |
| 0.18 | 0.17 | 0.13 | 0.07 | 0.7 |

7.0 Example Structures of Polymer-Based Dielectric Mirrors

Figure 21:
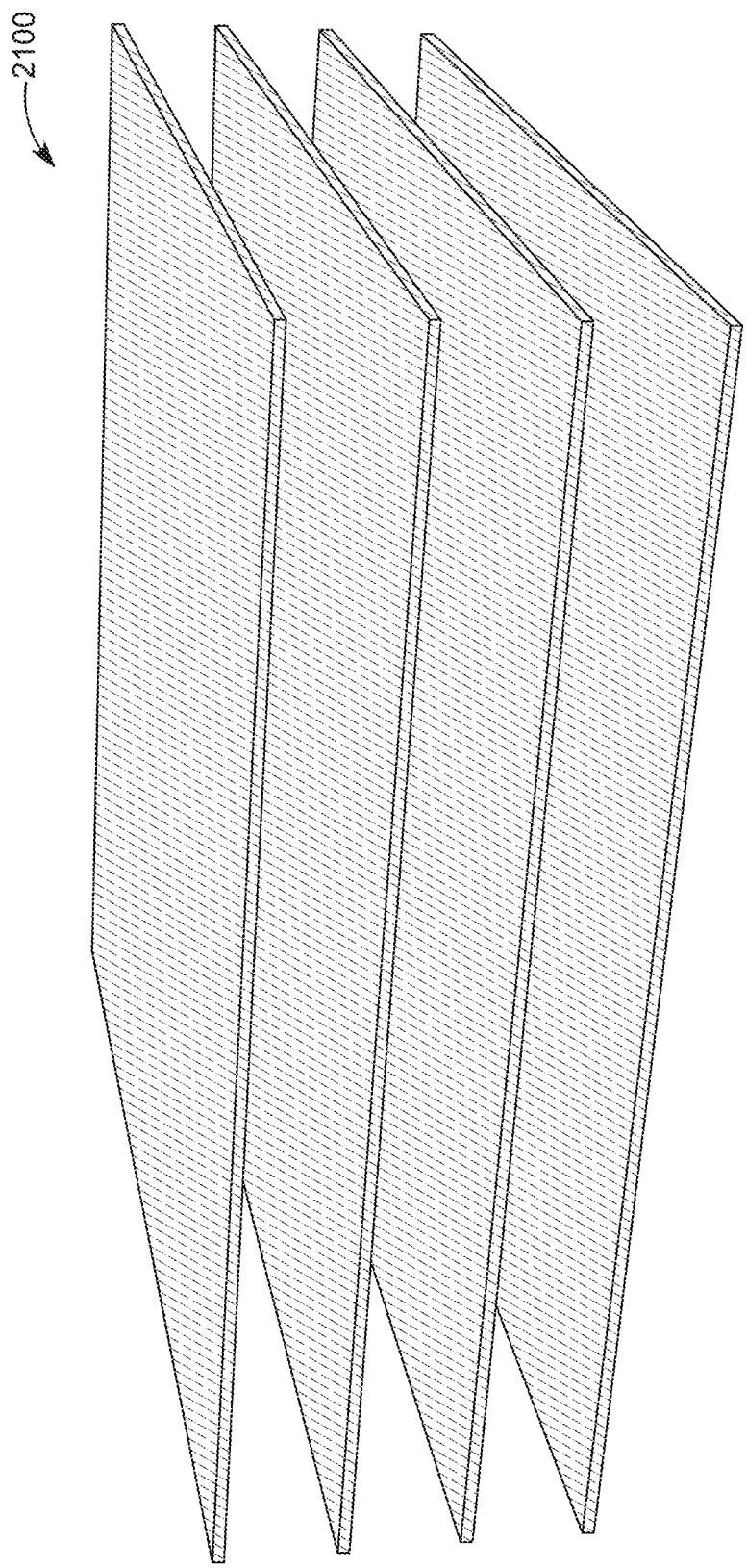
FIG. 21 depicts a diagram illustrating a first example dielectric mirror (1D photonic crystal or Bragg reflector) including bandgap in the Z direction in accordance with embodiments of the present disclosure.
Figure 22:
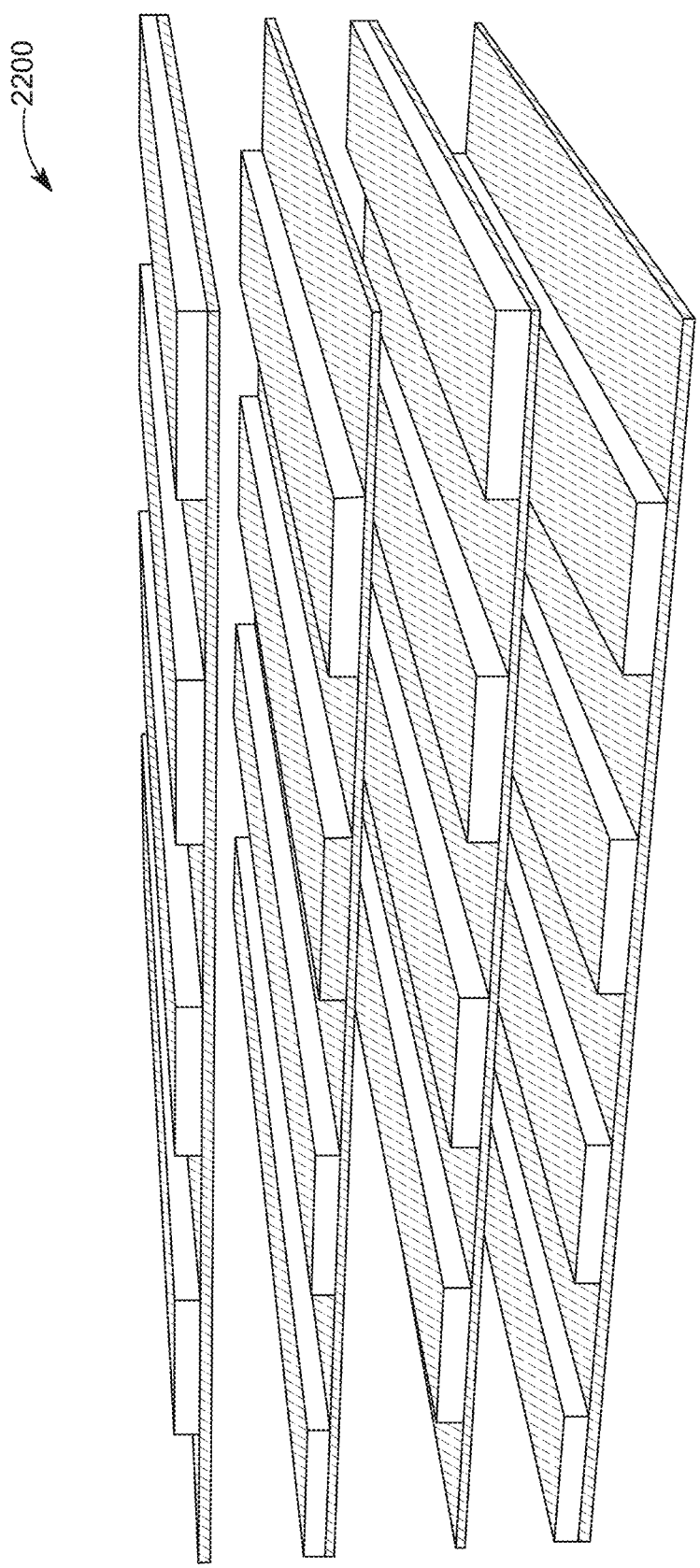
FIG. 22 depicts a diagram illustrating a second example dielectric mirror with grating patterned on the membranes including bandgap in Z and Y direction in accordance with embodiments of the present disclosure.
Figure 23:
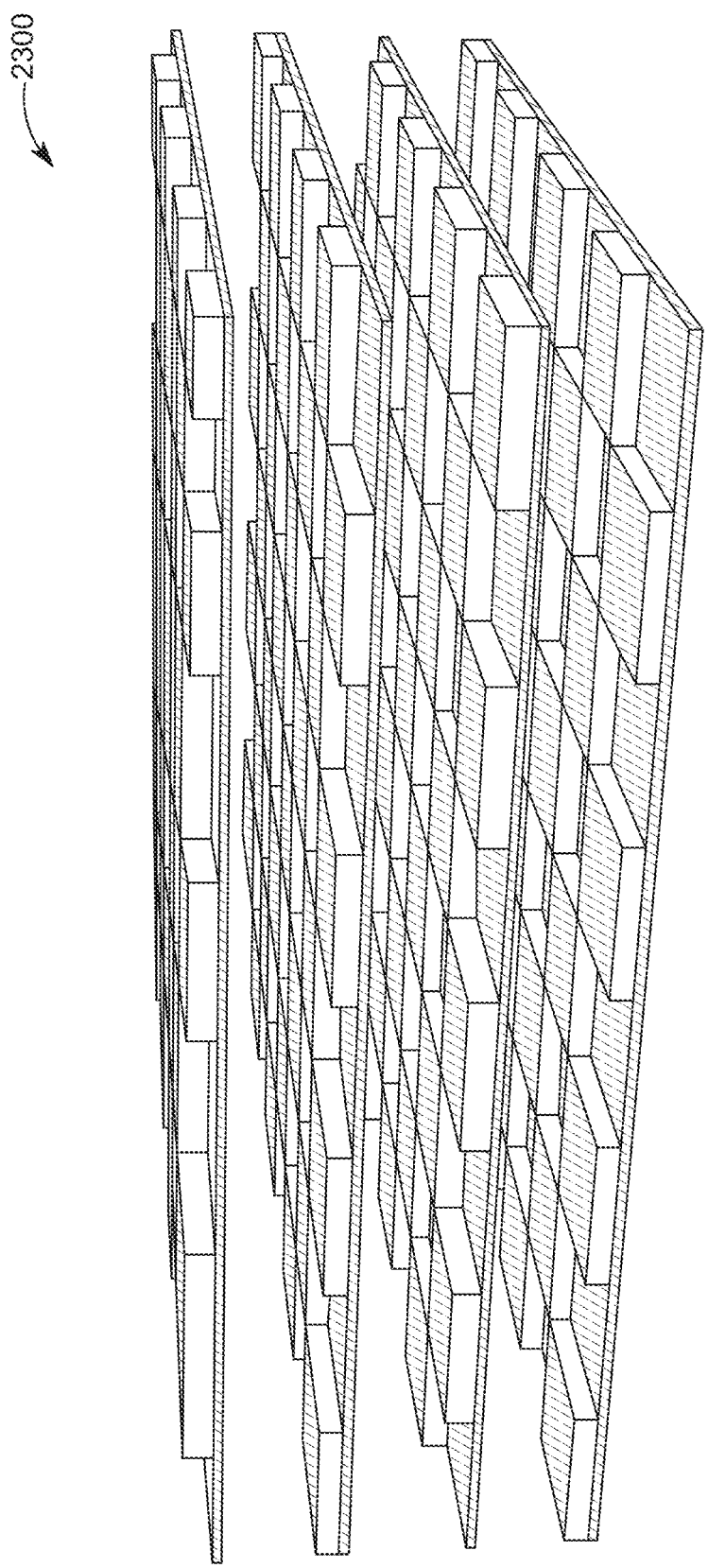
FIG. 23 depicts a diagram illustrating a third example dielectric mirror with grating patterned on the membranes including bandgap in Z and Y direction in accordance with embodiments of the present disclosure.

FIG. 21 through FIG. 23 illustrate examples of a 3D photonic crystal including patterning of membranes. FIG. 21 depicts a diagram 2100 illustrating a first example dielectric mirror (1D photonic crystal or Bragg reflector) including bandgap in the Z direction. FIG. 22 depicts a diagram 2200 illustrating a second example dielectric mirror grating patterned on the membranes including bandgap in Z and Y direction. FIG. 23 depicts a diagram 2300 illustrating a third example dielectric mirror with grating patterned on the membranes including bandgap in the Z and Y directions.

8.0 Reflective Device Implementations

The reflective device may be implemented within a pressure sensor, a temperature sensor, an active optical filter, and/or viewing surfaces such as devices for reproducing pictures and/or video.

Figure 24:
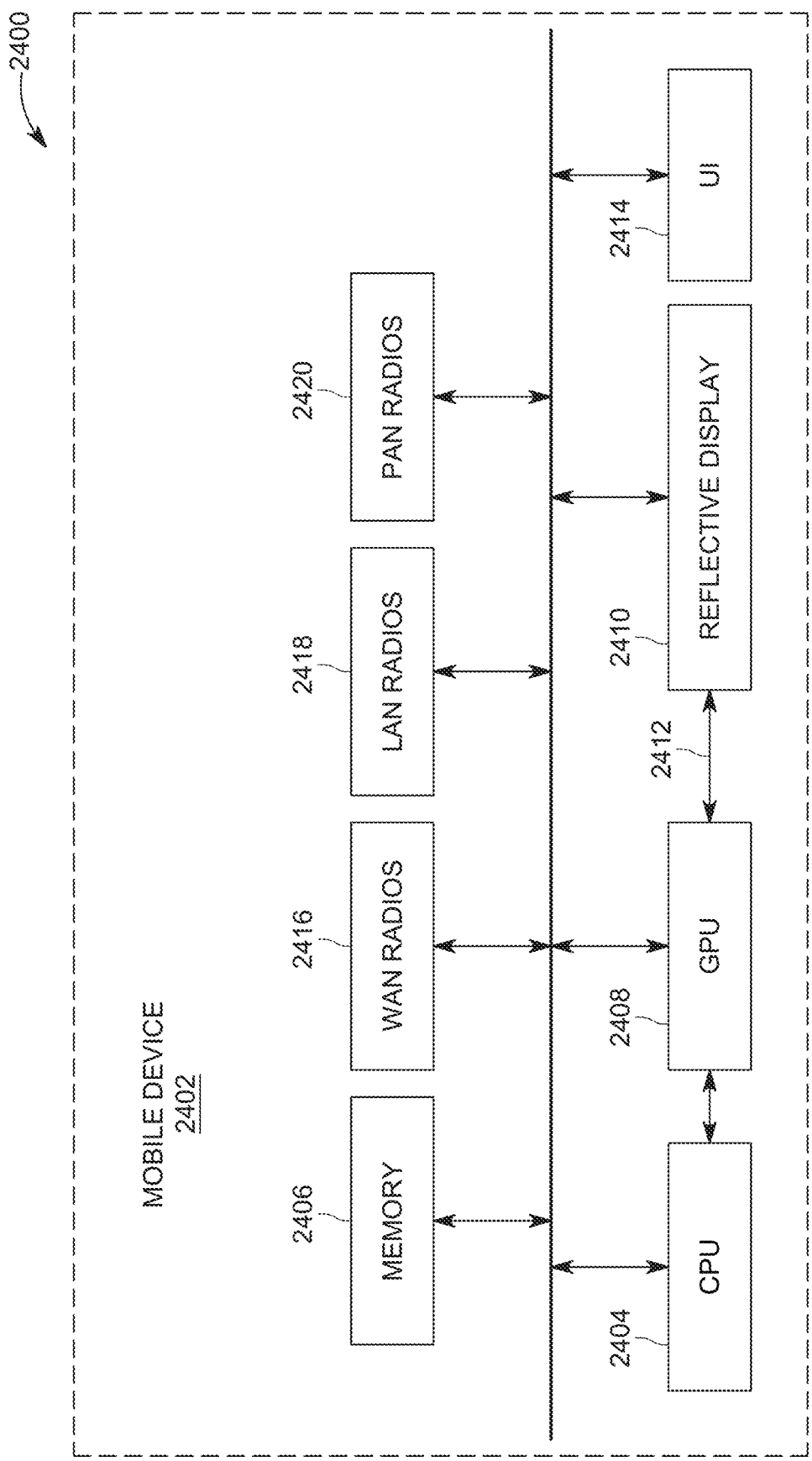
FIG. 24 depicts a block diagram illustrating a mobile device that includes a reflective display in accordance with embodiments of the present disclosure.

FIG. 24 depicts a block diagram 2400 illustrating a mobile device 2402 in accordance with embodiments of the present disclosure. The mobile device 2402 may be an e-book device, a smart watch, a smart phone, a tablet, a laptop, or the like. The mobile device 2402 includes a central processing unit (CPU) 2404, a memory 2406, and a graphics processing unit (GPU) 2408. In some embodiments the memory 2406 and the GPU 2408 may be integrated with CPU 2404. The memory 2406 may include a combination of volatile memory (e.g. random access memory) and non-volatile memory (e.g. flash memory). In certain embodiments, the CPU 2402 may be a mobile processor such as the Qualcomm® Snapdragon® mobile processor. For example, the CPU 2402 may be the Snapdragon® 855.

The mobile device 2402 also includes a reflective display 2410. The reflective display 2410 includes a thin film transistor layer and reflective elements positioned approximately parallel to the thin film transistor layer. The reflective elements are electrically coupled with the thin film transistor layer. The thin film transistor layer may include or be electrically coupled with addition circuitry to provide an electrical interface 2412 and coupled with the GPU 2408. In certain embodiments the electrical interface 2412 may be directly electrically coupled with the CPU 2402. The electrical interface 2412 may be an embedded DisplayPort® (eDP) interface, a display serial interface (DSI) as defined by the Mobile Industry Processor Interface (MIPI) Alliance, a serial peripheral interface (SPI), or the like. The reflective display 2410 may be integrated in the mobile device as a manufacturing option instead of a liquid crystal display (LCD), an organic light-emitting diode (OLED), or the like. The mobile device 2402 may also include a user interface (UI) 2414. The UI 2414 and the reflective display 2410 may be integrated such as a touchpad display.

The mobile device 2402 may include WAN radios 2416, LAN radios 2418, and PAN radios 2420. The WAN radios 1910 may include 2G, 3G, 4G, and/or 5G technologies. The LAN radios 1912 may include Wi-Fi technologies such as 802.11a, 802.11b/g/n, and/or 802.11ac circuitry. The PAN radios 1912 may include Bluetooth® technologies., The mobile device 2492 may also include one or more sensors (not shown in FIG. 24). The sensors may include a global positioning system (GPS) sensor, a magnetic sensor (e.g. compass), a three-axis gyroscope sensor, an accelerometer sensor, a proximity sensor, a barometric sensor, a temperature sensor, a humidity sensor, an ambient light sensor, or the like. In some embodiments the mobile device 2402 may be a smart phone, an iPhone® or an iPad®, using iOS® as an operating system (OS). The mobile device 2402 may be a mobile terminal including Android® OS, BlackBerry® OS, Windows Phone® OS, or the like.

The reflective display 2410 may also be implemented within a computer monitor, a smart TV, a smart sign, or the like. The reflective device 2410 may also be configured to provide a visual authentication (e.g. watermark). The reflective display 2410 may also be configured with other video interfaces such as a High-Definition Multimedia Interface (HDMI®) video interface, a DisplayPort® video interface, a Universal Serial Bus (USB) type-C interface, or the like.

9.0 Summary

Designs with simulation results and processing methods to fabricate dielectric mirrors based on free standing polymer-air layers have been disclosed for implementing reflective elements for displays, sensors, and authentication solutions. The corresponding structures, materials, acts, and equivalents of all means or step plus function elements in the claims below are intended to include any structure, material, or act for performing the functions in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A reflective device comprising:
   a thin film transistor layer; and
   a plurality of reflective elements positioned approximately parallel to the thin film transistor layer and electrically coupled with the thin film transistor layer, wherein each reflective element is configured for controlling a reflectance parameter of the reflective element based on a first voltage applied to the reflective element by the thin film transistor layer and each reflective element is an independently controlled polymer-based dielectric mirror device.

2. The reflective device of claim 1, wherein each reflective element comprises:
   a transparent substrate; and
   a plurality of polymer-air pair layers positioned approximately parallel position to the transparent substrate.

3. The reflective device of claim 2, wherein each reflective element is further configured for a maximum reflectance greater than 85% and a maximum of six polymer-air pair layers.

4. The reflective device of claim 2, wherein each reflective element further comprises a color filter positioned on the transparent substrate opposite to the plurality of polymer-air pair layers.

5. The reflective device of claim 2, wherein each reflective element is further configured for a maximum reflectance greater than 85% and a maximum of six polymer-air pair layers.

6. The reflective device of claim 2, wherein each at least one polymer layer is patterned to form an independently controlled polymer-based photonic crystal or an independently controlled polymer-based photonic grating.

7. The reflective device of claim 2, wherein each polymer-air pair layer comprises at least one polymer layer and an air layer.

8. The reflective device of claim 7, wherein each polymer-air layer comprises at least one of a polymethyl methacrylate (PMMA) layer, a polydimethylsiloxane (PDMS) layer, a polytetrafluoroethylene (PTFE) layer, or a polyimide layer.

9. The reflective device of claim 7, wherein each polymer-air layer comprises at least one cured polymer layer.

10. The reflective device of claim 7, wherein each reflective element further comprises a metallic electrode positioned over the plurality of polymer-air pair layers and a transparent electrode positioned between the plurality of polymer-air pair layers and the transparent substrate.

11. The reflective device of claim 10, wherein the transparent electrode and the metallic electrode are configured to control the reflectance parameter by providing a substantially equal electrostatic force across the plurality of polymer-air pair layers based on a value of the first voltage.

12. The reflective device of claim 11, wherein each reflective element is further configured for independently controlling a reflected wavelength parameter of the reflective element based on a second voltage applied to the reflective element by the thin film transistor layer.

13. The reflective device of claim 12, wherein each polymer-air layer further comprises an intra-layer electrode forming a plurality of intra-layer electrodes.

14. The reflective device of claim 13, wherein each reflective element further comprises:
   a substrate electrode positioned between the plurality of polymer-air pair layers and the transparent substrate;
   a top electrode positioned over the plurality of polymer-air pair layers;
   a first side electrode; and
   a second side electrode, wherein the first side electrode and the second side electrode are configured for capacitively inducing a voltage on each intra-layer electrode.

15. The reflective device of claim 14, wherein:
   the substrate electrode and the top electrode are configured to control the reflectance parameter by providing a substantially equal electrostatic force across the plurality of polymer-air pair layers based on the value of the first voltage; and
   the first side electrode and the second side electrode are configured to control the reflected wavelength parameter by providing a graduated electrostatic force across the plurality of polymer-air pair layers based on the value of the second voltage.

16. The reflective device of claim 15, wherein control the reflectance parameter is controlled by a deformation of at least one polymer layer from the substantially equal electrostatic force across the plurality of polymer-air pair layers and the deformation persists when the substantially equal electrostatic force is released.

17. The reflective device of claim 1 further comprising:
   a viewing surface positioned approximately parallel to the plurality of reflective elements and the thin film transistor layer; and
   a video interface configured for receiving a video signal for display on the viewing surface.

18. The reflective device of claim 1, wherein the reflective device is configured to provide a visual authentication.

19. The reflective device of claim 18, wherein the visual authentication is a watermark.

20. A method of forming a reflective device, comprising:
   providing a plurality of reflective elements positioned approximately parallel to a thin film transistor layer; and
   electrically coupling the thin film transistor layer with each reflective element, wherein each reflective element is configured for controlling a reflectance parameter of the reflective element based on a first voltage applied to the reflective element by the thin film transistor layer.

* * * * *